United States Patent
Mills et al.

(10) Patent No.: US 9,022,020 B2
(45) Date of Patent: May 5, 2015

(54) LINEAR FRESNEL SOLAR ARRAYS AND DRIVES THEREFOR

(75) Inventors: David R. Mills, Palo Alto, CA (US); Philipp Schramek, Starnberg (DE); David B. Degraaff, Mountain View, CA (US); Peter L. Johnson, Mountain View, CA (US); Alexander Hoermann, Menlo Park, CA (US); Lars R. Johnson, Mountain View, CA (US)

(73) Assignee: Areva Solar, Inc., Mountain View, CA (US)

( * ) Notice: Subject to any disclaimer, the term of this patent is extended or adjusted under 35 U.S.C. 154(b) by 1650 days.

(21) Appl. No.: 12/012,821

(22) Filed: Feb. 5, 2008

(65) Prior Publication Data

US 2009/0056701 A1   Mar. 5, 2009

Related U.S. Application Data

(60) Provisional application No. 61/007,926, filed on Aug. 27, 2007.

(51) Int. Cl.
  *F24J 2/10*   (2006.01)
  *F24J 2/16*   (2006.01)
  (Continued)

(52) U.S. Cl.
  CPC .... *F24J 2/16* (2013.01); *F24J 2/07* (2013.01); *F24J 2/14* (2013.01); *F24J 2/245* (2013.01);
  (Continued)

(58) Field of Classification Search
  USPC ......... 126/572, 573, 576, 593, 600, 605, 606, 126/684, 685, 634
  See application file for complete search history.

(56) References Cited

U.S. PATENT DOCUMENTS

| 514,338 A | 2/1894 | Row |
| 787,145 A | 4/1905 | Brown |

(Continued)

FOREIGN PATENT DOCUMENTS

| BE | 1013565 A3 | 4/2002 |
| CN | 87206235 U | 12/1987 |

(Continued)

OTHER PUBLICATIONS

Di Canio, D.C. et al., (Apr. 1979). "Line Focus Solar Thermal Central Receiver Research Study: Final Report for Period Apr. 30, 1977-Mar. 31, 1979," FMC Corporation: Santa Clara, CA, 307 pages. (U.S. Department of Energy Solar Energy Under Contract DE-AC03-76ET-20426, DOE/ET/20426-1).

(Continued)

*Primary Examiner* — Alfred Basichas
(74) *Attorney, Agent, or Firm* — Morrison & Foerster LLP

(57) ABSTRACT

Described herein are solar energy collector systems, components for solar energy collector systems, and methods for installing solar energy collector systems. The components for solar energy collector systems include but are not limited to solar radiation absorbers, receivers, drives, drive systems, reflectors, and various support structures. The solar energy collection systems, solar radiation absorbers, receivers, drives, drive systems, reflectors, support structures, and/or methods may be used, for example, in LFR solar arrays. Drives and drive systems are described herein that may provide improved rotational positioning, movement, and/or rotational positional sensing. For example, drives and drive systems are provided which allow operation through a variable frequency drive. The components and methods described herein may be used together in any combination in a solar collector system, or they may be used separately in different solar collector systems.

13 Claims, 42 Drawing Sheets

(51) Int. Cl.
  *F24J 2/07* (2006.01)
  *F24J 2/14* (2006.01)
  *F24J 2/24* (2006.01)
  *F24J 2/46* (2006.01)
  *F24J 2/54* (2006.01)
  *H01L 31/054* (2014.01)
  *F24J 2/52* (2006.01)

(52) U.S. Cl.
  CPC . *F24J 2/464* (2013.01); *F24J 2/523* (2013.01); *F24J 2/541* (2013.01); *F24J 2002/108* (2013.01); *F24J 2002/5458* (2013.01); *Y02E 10/41* (2013.01); *Y02E 10/44* (2013.01); *Y02E 10/45* (2013.01); *Y02E 10/47* (2013.01); *Y02E 10/52* (2013.01); *H01L 31/054* (2014.12)

(56) References Cited

U.S. PATENT DOCUMENTS

| | | |
|---|---|---|
| 1,174,602 A | 3/1916 | Naylon |
| 1,240,890 A | 9/1917 | Shuman |
| 1,852,925 A | 4/1932 | Gomery |
| 2,793,018 A | 5/1957 | Trombe |
| 2,846,724 A | 8/1958 | Aylwin |
| 2,945,417 A | 7/1960 | Caryl et al. |
| 3,026,858 A | 3/1962 | Fleischer |
| 3,311,458 A | 3/1967 | Schunemann |
| 3,464,885 A | 9/1969 | Land et al. |
| 3,466,119 A | 9/1969 | Giovanni |
| 3,861,379 A | 1/1975 | Anderson, Jr. |
| 3,884,217 A | 5/1975 | Wartes |
| 3,889,531 A | 6/1975 | Suga |
| 3,892,433 A | 7/1975 | Blake |
| 3,920,413 A | 11/1975 | Lowery |
| 3,956,030 A | 5/1976 | Lee et al. |
| 3,986,021 A | 10/1976 | Hitchcock |
| 3,995,429 A | 12/1976 | Peters |
| 4,000,851 A | 1/1977 | Heilemann |
| 4,013,826 A | 3/1977 | Herzig |
| 4,022,184 A | 5/1977 | Anderson |
| 4,033,118 A | 7/1977 | Powell |
| 4,054,246 A | 10/1977 | Johnson |
| 4,056,313 A | 11/1977 | Arbogast |
| 4,069,674 A | 1/1978 | Warren |
| 4,071,017 A | 1/1978 | Russell, Jr. et al. |
| 4,078,549 A | 3/1978 | McKeen et al. |
| 4,081,966 A | 4/1978 | deGeus |
| 4,088,120 A | 5/1978 | Anderson |
| 4,091,622 A | 5/1978 | Marchesi |
| 4,106,485 A | 8/1978 | Polley |
| 4,108,154 A | 8/1978 | Nelson |
| 4,111,184 A | 9/1978 | Fletcher et al. |
| 4,116,225 A | 9/1978 | Ortabasi |
| 4,117,682 A | 10/1978 | Smith |
| 4,122,833 A | 10/1978 | Lovelace et al. |
| 4,124,061 A | 11/1978 | Mitchell et al. |
| 4,136,671 A | 1/1979 | Whiteford |
| 4,138,995 A | 2/1979 | Yuan |
| 4,141,626 A | 2/1979 | Treytl et al. |
| 4,144,716 A | 3/1979 | Chromie |
| 4,144,875 A | 3/1979 | Bruno et al. |
| 4,146,057 A | 3/1979 | Friedman et al. |
| 4,148,164 A | 4/1979 | Humphrey |
| 4,149,523 A | 4/1979 | Boy-Marcotte et al. |
| 4,157,290 A | 6/1979 | Ladislav et al. |
| 4,159,710 A | 7/1979 | Prast |
| 4,172,443 A * | 10/1979 | Sommer .................... 126/680 |
| 4,174,704 A | 11/1979 | Nelson |
| 4,177,325 A | 12/1979 | Roberts et al. |
| 4,184,477 A | 1/1980 | Yuan |
| 4,203,426 A | 5/1980 | Matlock et al. |
| 4,205,660 A | 6/1980 | Kellberg et al. |
| 4,210,201 A | 7/1980 | O'Hanlon |
| 4,210,463 A | 7/1980 | Escher |
| 4,215,553 A | 8/1980 | Poirier et al. |
| 4,220,140 A | 9/1980 | Francia |
| 4,222,365 A | 9/1980 | Thomson |
| 4,229,076 A | 10/1980 | Chromie |
| 4,238,265 A | 12/1980 | Deminet |
| 4,239,344 A | 12/1980 | Wildenrotter |
| 4,243,018 A | 1/1981 | Hubbard |
| 4,249,514 A | 2/1981 | Jones |
| 4,263,895 A | 4/1981 | Colao |
| 4,267,881 A | 5/1981 | Byerly |
| 4,268,332 A | 5/1981 | Winders |
| 4,270,600 A | 6/1981 | Bourdin |
| 4,281,640 A | 8/1981 | Wells |
| 4,281,642 A | 8/1981 | Steinberg |
| 4,289,115 A | 9/1981 | O'Hanlon |
| 4,291,677 A | 9/1981 | Monk |
| 4,304,221 A | 12/1981 | Trihey |
| 4,312,324 A | 1/1982 | Ross et al. |
| 4,333,447 A | 6/1982 | Lemrow et al. |
| 4,337,827 A | 7/1982 | Jabsen |
| 4,339,484 A | 7/1982 | Harding |
| 4,343,298 A | 8/1982 | Ambille et al. |
| 4,348,135 A | 9/1982 | St. Clair |
| 4,367,365 A | 1/1983 | Spencer |
| 4,375,806 A | 3/1983 | Nishman |
| 4,385,430 A | 5/1983 | Bartels |
| 4,388,966 A | 6/1983 | Spiegel |
| 4,389,464 A | 6/1983 | Muhlratzer |
| 4,394,859 A | 7/1983 | Drost |
| 4,414,812 A | 11/1983 | Parry |
| 4,416,264 A | 11/1983 | Herrick et al. |
| 4,422,893 A | 12/1983 | Duchateau et al. |
| 4,424,803 A | 1/1984 | Bogardus |
| 4,429,178 A | 1/1984 | Prideaux et al. |
| 4,434,785 A | 3/1984 | Knudsen |
| 4,435,043 A | 3/1984 | Mertens et al. |
| 4,436,373 A | 3/1984 | Kirsch |
| 4,445,499 A | 5/1984 | Platell |
| 4,454,371 A | 6/1984 | Folino |
| 4,459,972 A | 7/1984 | Moore |
| 4,462,391 A | 7/1984 | Laussermair et al. |
| 4,468,848 A | 9/1984 | Anderson et al. |
| 4,488,540 A | 12/1984 | Mcalister |
| 4,505,260 A | 3/1985 | Metzger |
| 4,511,756 A | 4/1985 | Moeller et al. |
| 4,512,336 A | 4/1985 | Wiener |
| 4,515,148 A | 5/1985 | Boy-Marcotte et al. |
| 4,520,794 A | 6/1985 | Stark et al. |
| 4,526,005 A | 7/1985 | Laing et al. |
| 4,532,916 A | 8/1985 | Aharon |
| 4,553,531 A | 11/1985 | Rosende |
| 4,559,926 A | 12/1985 | Butler |
| 4,586,488 A * | 5/1986 | Noto ............................ 126/578 |
| 4,586,489 A | 5/1986 | Voll et al. |
| 4,611,090 A | 9/1986 | Catella et al. |
| 4,611,575 A | 9/1986 | Powell |
| 4,628,905 A | 12/1986 | Mills |
| 4,643,212 A | 2/1987 | Rothrock |
| 4,730,423 A | 3/1988 | Hughes |
| 4,730,602 A | 3/1988 | Posnansky et al. |
| 4,738,304 A | 4/1988 | Chalmers et al. |
| 4,815,433 A | 3/1989 | Wild |
| 4,815,443 A | 3/1989 | Vrolyk et al. |
| 4,820,033 A | 4/1989 | Sick |
| 4,820,395 A | 4/1989 | Angelini |
| 4,890,599 A | 1/1990 | Eiden |
| 5,058,565 A | 10/1991 | Gee et al. |
| 5,113,659 A | 5/1992 | Baker et al. |
| 5,125,608 A | 6/1992 | McMaster et al. |
| 5,143,556 A | 9/1992 | Matlin |
| 5,228,924 A | 7/1993 | Barker et al. |
| 5,259,479 A | 11/1993 | St-Germain |
| 5,272,879 A | 12/1993 | Wiggs |
| 5,275,150 A | 1/1994 | Lai |
| 5,325,844 A | 7/1994 | Rogers et al. |
| 5,374,317 A | 12/1994 | Lamb et al. |
| 5,523,132 A | 6/1996 | Zhang et al. |
| 5,542,409 A | 8/1996 | Sampayo |
| 5,578,140 A | 11/1996 | Yogev et al. |

(56) References Cited

U.S. PATENT DOCUMENTS

| | | |
|---|---|---|
| 5,643,423 A | 7/1997 | Kimock et al. |
| 5,732,935 A | 3/1998 | Codario, Jr. |
| 5,777,587 A | 7/1998 | Tsuru et al. |
| 5,860,414 A | 1/1999 | Steinmann |
| 5,862,799 A | 1/1999 | Yogev et al. |
| 5,894,838 A | 4/1999 | Yogey |
| 5,899,199 A | 5/1999 | Mills |
| 5,931,158 A | 8/1999 | Buck |
| 6,000,211 A | 12/1999 | Bellac et al. |
| 6,003,508 A | 12/1999 | Hoffschmidt et al. |
| 6,035,850 A | 3/2000 | Deidewig et al. |
| 6,066,187 A | 5/2000 | Jensen et al. |
| 6,131,565 A | 10/2000 | Mills |
| 6,141,949 A | 11/2000 | Steinmann |
| 6,177,131 B1 | 1/2001 | Glaubitt et al. |
| 6,201,181 B1 | 3/2001 | Azzam et al. |
| 6,227,280 B1 | 5/2001 | Wirth et al. |
| 6,234,166 B1 | 5/2001 | Katsir et al. |
| 6,240,682 B1 | 6/2001 | James et al. |
| 6,276,359 B1 | 8/2001 | Frazier |
| 6,279,312 B1 | 8/2001 | Hennecke |
| 6,344,272 B1 | 2/2002 | Oldenburg et al. |
| 6,349,718 B1 | 2/2002 | Ven et al. |
| 6,396,239 B1 | 5/2002 | Benn et al. |
| 6,470,644 B2 | 10/2002 | James et al. |
| 6,484,506 B1 | 11/2002 | Bellac et al. |
| 6,530,369 B1 | 3/2003 | Yogev et al. |
| 6,532,953 B1 | 3/2003 | Blackmon et al. |
| 6,543,441 B2 | 4/2003 | Fünger et al. |
| 6,632,542 B1 | 10/2003 | Mahoney et al. |
| 6,668,555 B1 | 12/2003 | Moriarty |
| 6,668,820 B2 | 12/2003 | Cohen et al. |
| 6,722,357 B2 | 4/2004 | Shingleton |
| 6,752,434 B2 | 6/2004 | Cummins |
| 6,772,570 B2 | 8/2004 | Horne |
| 6,783,653 B2 | 8/2004 | Mahoney et al. |
| 6,902,203 B2 | 6/2005 | Kang |
| 6,906,842 B2 | 6/2005 | Agrawal et al. |
| 6,911,110 B2 | 6/2005 | Blackmon, Jr. et al. |
| 6,941,759 B2 | 9/2005 | Bellac et al. |
| 6,959,993 B2 | 11/2005 | Gross et al. |
| 6,968,654 B2 | 11/2005 | Moulder et al. |
| 6,971,756 B2 | 12/2005 | Vasylyev et al. |
| 6,994,082 B2 | 2/2006 | Hochberg et al. |
| 7,041,342 B2 | 5/2006 | Lohmeyer et al. |
| 7,051,529 B2 | 5/2006 | Murphy et al. |
| 7,055,519 B2 | 6/2006 | Litwin |
| 7,140,181 B1 | 11/2006 | Jensen et al. |
| 7,156,088 B2 | 1/2007 | Luconi |
| 7,191,597 B2 | 3/2007 | Goldman |
| 7,192,146 B2 | 3/2007 | Gross et al. |
| 7,207,327 B2 | 4/2007 | Litwin et al. |
| 7,249,937 B2 | 7/2007 | Inoue et al. |
| 7,296,410 B2 | 11/2007 | Litwin |
| 7,299,633 B2 | 11/2007 | Murphy et al. |
| 7,395,820 B2 | 7/2008 | Kuckelkorn |
| 7,412,976 B2 | 8/2008 | Winston |
| 7,432,488 B1 | 10/2008 | Hines et al. |
| 7,479,350 B1 | 1/2009 | Neumann et al. |
| 7,492,120 B2 | 2/2009 | Benn et al. |
| 7,531,741 B1 | 5/2009 | Melton et al. |
| 7,926,480 B2 | 4/2011 | Le Lievre |
| 7,926,481 B2 | 4/2011 | Edwards et al. |
| 7,950,386 B2 | 5/2011 | Lievre |
| 7,975,686 B2 | 7/2011 | Prueitt |
| 7,992,553 B2 | 8/2011 | Le Lievre |
| 8,056,555 B2 | 11/2011 | Prueitt |
| 8,203,110 B2 | 6/2012 | Silvestre |
| 2001/0045212 A1 | 11/2001 | Frazier |
| 2002/0078945 A1 | 6/2002 | Funger et al. |
| 2002/0180404 A1 | 12/2002 | Benn et al. |
| 2003/0034029 A1 | 2/2003 | Shingleton |
| 2003/0137754 A1 | 7/2003 | Vasylyev et al. |
| 2003/0173469 A1 | 9/2003 | Kudija, Jr. et al. |
| 2004/0004175 A1 | 1/2004 | Nakamura |
| 2004/0074490 A1 | 4/2004 | Mills et al. |
| 2004/0128923 A1 | 7/2004 | Moulder et al. |
| 2004/0139689 A1 | 7/2004 | Sinha et al. |
| 2004/0139960 A1 | 7/2004 | Blackmon, Jr. et al. |
| 2004/0231716 A1 | 11/2004 | Litwin |
| 2004/0261334 A1 | 12/2004 | Liebendorfer et al. |
| 2004/0261788 A1 | 12/2004 | Winston |
| 2005/0126170 A1 | 6/2005 | Litwin |
| 2005/0126560 A1 | 6/2005 | Litwin |
| 2005/0150225 A1 | 7/2005 | Gwiazda et al. |
| 2005/0189525 A1 | 9/2005 | Kuckelkorn et al. |
| 2005/0229924 A1 | 10/2005 | Luconi et al. |
| 2005/0279095 A1 | 12/2005 | Goldman |
| 2005/0279953 A1 | 12/2005 | Gerst |
| 2005/0284467 A1 | 12/2005 | Patterson |
| 2006/0107664 A1 | 5/2006 | Hudson et al. |
| 2006/0144393 A1 | 7/2006 | Le Lievre |
| 2006/0150967 A1 | 7/2006 | Hoelle et al. |
| 2006/0157050 A1 | 7/2006 | Le Lievre |
| 2006/0181765 A1 | 8/2006 | Jorgensen et al. |
| 2006/0225729 A1 | 10/2006 | Litwin |
| 2006/0260314 A1 | 11/2006 | Kincaid et al. |
| 2006/0266039 A1 | 11/2006 | Skowronski et al. |
| 2007/0012041 A1 | 1/2007 | Goldman |
| 2007/0035864 A1 | 2/2007 | Vasylyev et al. |
| 2007/0084208 A1 | 4/2007 | Goldman |
| 2007/0157614 A1 | 7/2007 | Goldman |
| 2007/0157923 A1* | 7/2007 | Le Lievre .................... 126/692 |
| 2007/0221208 A1 | 9/2007 | Goldman |
| 2007/0227573 A1 | 10/2007 | Hunter et al. |
| 2008/0000231 A1 | 1/2008 | Litwin et al. |
| 2008/0011290 A1 | 1/2008 | Goldman et al. |
| 2008/0029150 A1 | 2/2008 | Quero et al. |
| 2008/0034757 A1 | 2/2008 | Skowronski et al. |
| 2008/0127647 A1 | 6/2008 | Leitner |
| 2008/0128017 A1 | 6/2008 | Ford |
| 2008/0134679 A1 | 6/2008 | Cavanaugh et al. |
| 2008/0184789 A1 | 8/2008 | Eck et al. |
| 2008/0230108 A1 | 9/2008 | Keshner et al. |
| 2008/0236571 A1 | 10/2008 | Keshner et al. |
| 2008/0271731 A1 | 11/2008 | Winston |
| 2008/0302314 A1 | 12/2008 | Gonzalez et al. |
| 2008/0308094 A1 | 12/2008 | Johnston |
| 2009/0032095 A1 | 2/2009 | Schultz et al. |
| 2009/0084760 A1 | 4/2009 | Mayer et al. |
| 2009/0090109 A1 | 4/2009 | Mills et al. |
| 2009/0101138 A1 | 4/2009 | Eck et al. |
| 2009/0107487 A1 | 4/2009 | Gee et al. |
| 2009/0107488 A1 | 4/2009 | Gee et al. |
| 2009/0107489 A1 | 4/2009 | Gee et al. |
| 2009/0121495 A1 | 5/2009 | Mills |
| 2009/0126364 A1 | 5/2009 | Mills et al. |
| 2009/0139515 A1 | 6/2009 | Gee et al. |
| 2009/0199888 A1 | 8/2009 | Kuhn |
| 2009/0205637 A1* | 8/2009 | Moore et al. .................... 126/576 |
| 2009/0208761 A1 | 8/2009 | Silmy et al. |
| 2009/0322089 A1 | 12/2009 | Mills et al. |
| 2010/0071683 A1 | 3/2010 | Selig et al. |
| 2011/0297143 A1 | 12/2011 | Le Lievre |

FOREIGN PATENT DOCUMENTS

| | | |
|---|---|---|
| DE | 2802859 A1 | 7/1979 |
| DE | 2945908 A1 | 5/1981 |
| DE | 3003962 A1 | 8/1981 |
| DE | 9417466 U1 | 2/1995 |
| DE | 19619021 A1 | 11/1997 |
| DE | 19723543 A1 | 12/1998 |
| DE | 19740644 A1 | 3/1999 |
| DE | 19932646 A1 | 2/2000 |
| DE | 19854391 A1 | 5/2000 |
| DE | 10328321 A1 | 1/2005 |
| DE | 102007052234 A1 | 4/2009 |
| EP | 0012037 A1 | 6/1980 |
| EP | 00129821 A2 | 1/1985 |
| EP | 0151045 A2 | 8/1985 |
| EP | 00526816 A1 | 2/1993 |
| EP | 1164337 A1 | 12/2001 |
| EP | 0986695 B1 | 6/2002 |

(56) References Cited

FOREIGN PATENT DOCUMENTS

| | | |
|---|---|---|
| EP | 1243872 A2 | 9/2002 |
| EP | 1 056 978 B1 | 10/2002 |
| EP | 1291591 A2 | 3/2003 |
| EP | 0 815 401 B1 | 5/2003 |
| EP | 1519108 A1 | 3/2005 |
| EP | 1537921 A1 | 6/2005 |
| EP | 1598608 A2 | 11/2005 |
| EP | 1610073 A2 | 12/2005 |
| EP | 1746363 A2 | 1/2007 |
| EP | 1754942 A1 | 2/2007 |
| EP | 1764565 A1 | 3/2007 |
| EP | 1795829 A2 | 6/2007 |
| EP | 1801517 A1 | 6/2007 |
| EP | 1873397 A2 | 1/2008 |
| EP | 1930587 A2 | 6/2008 |
| EP | 2000669 A2 | 12/2008 |
| EP | 2053242 A2 | 4/2009 |
| EP | 2093518 A2 | 8/2009 |
| EP | 2093520 A2 | 8/2009 |
| FR | 1520370 A | 4/1968 |
| FR | 2391420 A1 | 12/1978 |
| FR | 2637967 A1 | 4/1990 |
| GB | 2037977 A | 7/1980 |
| GB | 2054829 A | 2/1981 |
| GB | 2154729 A | 9/1985 |
| JP | 56-002441 A | 1/1981 |
| JP | 58-62460 A | 4/1983 |
| JP | 58-86353 A | 5/1983 |
| JP | 58-150753 A | 9/1983 |
| JP | 63-183346 A | 7/1988 |
| JP | 2-110254 A | 4/1990 |
| JP | 8-184063 A | 7/1996 |
| JP | 2000-97498 A | 4/2000 |
| JP | 2004-69197 A | 3/2004 |
| WO | 90/10182 A1 | 9/1990 |
| WO | 95/21358 A1 | 8/1995 |
| WO | 96/29745 A1 | 9/1996 |
| WO | 96/30705 A1 | 10/1996 |
| WO | 97/01030 A2 | 1/1997 |
| WO | 97/14887 A1 | 4/1997 |
| WO | 98/55740 A1 | 12/1998 |
| WO | 99/42765 A1 | 8/1999 |
| WO | 99/64795 A2 | 12/1999 |
| WO | 00/33001 A1 | 6/2000 |
| WO | 01/61254 A1 | 8/2001 |
| WO | 01/72508 A1 | 10/2001 |
| WO | 02/02995 A2 | 1/2002 |
| WO | 02/12799 A2 | 2/2002 |
| WO | 02/25184 A1 | 3/2002 |
| WO | 02/075225 A2 | 9/2002 |
| WO | 02/098553 A1 | 12/2002 |
| WO | 2004/066401 A2 | 8/2004 |
| WO | 2004/094924 A2 | 11/2004 |
| WO | WO-2005/003646 A1 | 1/2005 |
| WO | WO-2005/003647 A1 | 1/2005 |
| WO | 2005/010225 A1 | 2/2005 |
| WO | 2005/071325 A1 | 8/2005 |
| WO | WO-2005/078360 A1 | 8/2005 |
| WO | 2005/088218 A1 | 9/2005 |
| WO | 2005/119136 A1 | 12/2005 |
| WO | 2006/000834 A1 | 1/2006 |
| WO | 2006/005303 A1 | 1/2006 |
| WO | 2006/008433 A1 | 1/2006 |
| WO | 2006/073357 A1 | 7/2006 |
| WO | 2007/022756 A2 | 3/2007 |
| WO | 2007/031062 A1 | 3/2007 |
| WO | 2007/076282 A2 | 7/2007 |
| WO | 2007/087680 A1 | 8/2007 |
| WO | 2007/104080 A1 | 9/2007 |
| WO | 2007/108976 A2 | 9/2007 |
| WO | 2007/118223 A2 | 10/2007 |
| WO | 2007/147399 A2 | 12/2007 |
| WO | 2008/006174 A1 | 1/2008 |
| WO | WO-2008/022409 A1 | 2/2008 |
| WO | 2008/027041 A1 | 3/2008 |
| WO | 2008/058528 A1 | 5/2008 |
| WO | 2008/058866 A1 | 5/2008 |
| WO | 2008/092194 A1 | 8/2008 |
| WO | 2008/092195 A1 | 8/2008 |
| WO | 2008/115305 A2 | 9/2008 |
| WO | 2008/118980 A1 | 10/2008 |
| WO | 2008/121335 A1 | 10/2008 |
| WO | 2008/121672 A1 | 10/2008 |
| WO | 2008/128237 A1 | 10/2008 |
| WO | 2008/128746 A2 | 10/2008 |
| WO | 2008/153946 A2 | 12/2008 |
| WO | 2008/154521 A1 | 12/2008 |
| WO | 2008/154599 A1 | 12/2008 |
| WO | 2009/015388 A2 | 1/2009 |
| WO | 2009/029275 A2 | 3/2009 |
| WO | 2009/029277 A2 | 3/2009 |
| WO | 2009/051595 A1 | 4/2009 |
| WO | 2009/106103 A1 | 9/2009 |
| WO | 2009/106104 A1 | 9/2009 |

OTHER PUBLICATIONS

U.S. Appl. No. 11/895,869, filed Aug. 27, 2007, for Mills et al.
U.S. Appl. No. 12/012,920, filed Feb. 5, 2008, for Mills et al.
U.S. Appl. No. 12/012,829, filed Feb. 5, 2008, for Mills et al.
European Office Action received for European Patent Application No. 08828772.7, mailed on Dec. 29, 2011, 5 pages.
International Search Report received for PCT Patent Application No. PCT/AU2004/000884, mailed on Aug. 31, 2004, 2 pages.
International Search Report received for PCT Patent Application No. PCT/AU2007/000268, mailed on May 3, 2007, 2 pages.
International Search Report received for PCT Patent Application No. PCT/AU2007/001232, mailed on Oct. 15, 2007, 3 pages.
International Search Report and Written Opinion received for PCT Patent Application No. PCT/US2008/007098, mailed on Sep. 26, 2008, 9 pages.
International Search Report and Written Opinion received for PCT Patent Application No. PCT/US2008/066185, mailed on Apr. 8, 2009, 9 pages.
International Search Report and Written Opinion received for PCT Patent Application No. PCT/US2008/007419, mailed on May 6, 2009, 9 pages.
International Search Report and Written Opinion received for PCT Patent Application No. PCT/US2008/010230, mailed on Jun. 25, 2009, 15 pages.
International Search Report and Written Opinion received for PCT Patent Application No. PCT/US2008/010223, mailed on Jun. 30, 2009, 18 pages.
International Preliminary Report on Patentability received for PCT Patent Application No. PCT/US2008/010223, issued on Mar. 2, 2010, 13 pages.
International Preliminary Report on Patentability received for PCT Patent Application No. PCT/US2008/010230, issued on Mar. 2, 2010, 11 pages.
Final Office Action received for U.S. Appl. No. 10/597,966, mailed on Jun. 23, 2009, 9 pages.
Final Office Action received for U.S. Appl. No. 12/012,920, mailed on Jul. 29, 2011, 9 pages.
Non-Final Office Action received for U.S. Appl. No. 10/597,966, mailed on Aug. 5, 2008, 8 pages.
Non-Final Office Action received for U.S. Appl. No. 10/597,966, mailed on Aug. 2, 2010, 11 pages.
Non-Final Office Action received for U.S. Appl. No. 12/012,920, mailed on Feb. 16, 2011, 17 pages.
Notice of Allowance received for U.S. Appl. No. 10/597,966, mailed on Mar. 31, 2011, 9 pages.
ABC Online, "Lake Cargelligo Chosen as Solar Energy Project Trial Site", available online at <http://www.abc.net.au/news/newsitems/200705/s1916027.htm>, May 7, 2007, 1 page.
Abengoa, Solar, "Solutions to Global Climate Change: Parabolic Troughs", available online at <http://www.abengoasolar.com/corp/export/sites/solar/resources/pdf/Sevilia_PV.pdf>, Feb. 25, 2008, 14 pages.
Aberdeen Group, "Effect of High Temperature on Hardened Concrete", 1971, 3 pages.

(56) References Cited

OTHER PUBLICATIONS

Allani et al., "CO2 Mitigation Through the Use of Hybrid Solar-Combined Cycles", Proceedings of the Third International Conference on Carbon Dioxide Removal, Cambridge, Energy Covers. Mgmt., vol. 38, 1997, pp. S661-S667.
Allani et al., "Concept Global D'Une Nouvelle Centrale Solaire A Cycle of Combine Dual Fuel", Entropie, vol. 164/165, 1991, pp. 121-122 (partial English Machine Translation).
Allani, Y., "A Global Concept of a New Type of Solar Combined Cycle Duel Fuel Plant", Presented at 6th International Symposium on Solar Thermal Concentrating Technologies, Plataforma Solar de Almeria, Spain, Sep. 28-Oct. 2, 1992, pp. 939-943.
Allani, Yassin, "Etude d'une nouvelle centrale Electro-Thermo-solaire a cycle combine bi-combustible", Journees Internationales de Thermique (JITH 95), vol. 2, 1995, 2 pages. (1 page of English Translation and 1 page of Original Document).
Anonymous, "Cooma Company's $5 Million Grant", Monaro Post, May 9, 2007, 1 page.
ASTM, "Meta-quartzite From the Rainbow Quarries", 2008, 2 pages (Screen shot).
ASTM International, "Standard Specification for Electroplated Engineering Nickel Coatings", 2008, pp. 1-7.
Bennett et al., "Investigations of an Electrodeposited Tin-Nickel Alloy", Journal of the Electrochemical Society, vol. 123, No. 7, Jul. 1976, pp. 999-1003.
Birnbaum et al., "A Concept for Future Parabolic Trough Based Solar Thermal Power Plants", ICPWS XV, Berlin, Germany, Sep. 8-11, 2008, pp. 1-10.
Bombala Times, "Cooma Project Receives $5 Million in Funding", available online at <http://www.bombalatimes.com.au/news/local/news/General/Cooma-project-receives-5-million-in-funding/267734.aspx>, May 8, 2007, 3 pages.
Bopp et al., "Solare Vorwarmung zur Brennstoffeinsparung in Fossil Befeuerten Kraftwerken", Solarenergie, vol. 48, No. 6, Jun. 1996, pp. 26-32, (6 pages of English Translation and 8 pages of Original Document).
Brosseau et al., "Testing Thermocline Filler Materials and Molten-Salt Heat Transfer Fluids for Thermal Energy Storage Systems Used in Parabolic Trough Solar Power Plants", SAND2004-3207, Jul. 2004, pp. 3-95.
Bruhn et al., "Criteria for the Assessment of Concepts for the Use of Solar Energy in Combine Heat and Power", Proceeding of EuroSun, vol. 96, 1996, pp. 1695-1700.
Bruhn, "Einsatz von Solarenergie in der zentralen Warme-Kraft-Kopplung", HLH Bd, vol. 45, No. 11, Nov. 1994, pp. 573-576, (10 pages of English Translation and 4 pages of Original Document).
Buie et al., "Optical Considerations in line Focus Fresnel Concentrators", Proceedings of the 11th SolarPACES International Symposium on Solar Thermal Concentrating Technologies, Zurich, Switzerland, available online at <http://www.physics.usyd.edu.au/app/solar/publications/index.html>, Sep. 3-6, 2002, 6 pages.
Burley et al., "Proceedings of Solar '94", The 1994 American Solar Energy Society Annual Conference, San Jose, CA, (Table of Contents), Jun. 25-30, 1994, pp. vii-ix.
Buschle et al., "Latent Heat Storage for Process Heat Applications", Available at <http://de.scientificcommons.org/37481048>, 2006, 8 pages.
Carden, P. O., "Energy Corradiation Using the Reversible Ammonia Reaction", Solar Energy, vol. 19, 1977, pp. 365-378.
Carvalho et al., "High-Resolution Transmission Electron Microscopy Study of Discontinuously Precipitated Ni3Sn", ACTA Mater., vol. 48, 2000, pp. 4203-4215.
Choudhury, C et al., "A fresnel strip reflector-concentrator for tubular solar-energy collectors", Applied Energy, Elsevier Science Publishers, GB, vol. 23, No. 2, XP025417777, ISSN: 0306-2619, 001: 10.1016/0306-2619 (86)90036-X, Jan. 1, 1986, pp. 143-154.
Copeland et al., "For Water/Steam, Organic Fluid, and Air/Brayton Solar Thermal Collector Receivers", in Comparative Ranking of Thermal Storage Systems, vol. 1, Solar Energy Research Institute, Golden, Colorado, Nov. 1983, 116 pages.
Darnell et al., "A Solar-Fossil Combined Cycle Power Plant", AS/ISES 1980, Proceedings of the 1980 Annual Meeting American Section of the International Solar Energy Society, Inc., Phoenix, Arizona, Jun. 2-6, 1980, pp. 563-567.
Deleon et al., "Solar Technology Application to Enhanced Oil Recovery", Solar Energy Research Institute, U.S. Department of Energy Contact No. EG-77-C-01-4042, Dec. 1979, 110 pages.
Dubberly et al., "Cost and Performance of Thermal Storage Concepts in Solar Thermal Systems, Phase I", in Comparative Ranking of Thermal Storage Systems, vol. II, Solar Energy Research Institute, Golden, Colorado, Nov. 1983, 294 pages.
Eck et al., "Direct Solar Steam in Parabolic Troughs—Simulation of Dynamic Behavior", Presented at the 2007 Parabolic Trough Technology Workshop, Golden, Colorado, available at <http://www.nrel.gov/csp/troughnet/wkshp_2007.html>, Mar. 8-9, 2007, 25 pages.
Eckstock, "Session Descriptions", Proceedings of Eckstock, The Richard Stockton College New Jersey, Pomona, New Jersey, May 31-Jun. 2, 2006, pp. 1-55.
Electrical News, "Quarterly Supplement for Electrical Engineers", Electrical News, vol. 15, Feb. 2008, pp. 1-12.
Elsaket, Gamal, "Simulating the Integrated Solar Combined Cycle for Power Plants Application in Libya", Thesis for G. Elsaket for Cranfield University, Sep. 2007, 116 pages.
"EIC—STIC 3700 report".
EPRI, "Solar Augmented Steam Cycles for Coal Plants", Electric Power Research Institute, Oct. 2008, 2 pages.
FMC Corporation, "Solar Thermal Central-Receiver Research Study", DOE/ET/20426-T6, Appendix A,B,C,D, Feb. 1977, 160 pages.
Freiburg et al., "Solar unterstutzte Konventionelle Kraftwerke fur Mittel—und Sudeuropa", BWK Bd., vol. 46, No. 5, May 1994, pp. 247-253, (11 pages of English Translation and 7 pages of Original Document).
Freiburg, Marko A., "Verbesserung fossilgefeuerter Dampfkraftwerke durch solare Wärmezufuhr", BWK, vol. 47, No. 7/8, Jul./Aug. 1995, pp. 303-308, (13 pages of English Translation and 7 pages of Original Documents).
Goebel et al., "Parabolic Trough Collector with Foldable Reflector FC1: Design, Test Programme and Experiences", Proceedings of the 11th SolarPACES International Symposium on Concentrated Solar Power and Chemical Technologies, Zurich, Switzerland, Sep. 4-6, 2002, Sep. 2002, 5 pages.
Gorman, D. N., "Assessment of Central Receiver Solar Thermal Enhanced Oil Recovery Systems", Thermal Power Systems, Contract No. 98/3601, Jul. 1987, 117 pages.
Hassoun et al., "Electrodeposited Ni-Sn Intermetallic Electrodes for Advanced Lithium Ion Batteries", Journal of Power Sources, vol. 160, 2006, pp. 1336-1341.
Hollis, Steve, "A New Thermal Energy Storage System", 82nd Annual EESA Conference Trade Exhibition—Electricity 2006, At the Flick of a Switch, Melbourne, Australia, Aug. 2006, 20 pages.
Katumba et al., "Selective Solar Absorbers: A Cost Effective Solution for Access to Clean Energy in Rural Africa", Presented at 2nd CSIR Biennial Conference, CSIR International Conference, Centre Pretoria, South Africa, Nov. 17-18, 2008, pp. 1-9.
Katumba et al., "Solar Selective Absorber Functionality of Carbon Nanoparticles Embedded in SiO2, ZnO and NiO Matrices", Physica Status Solidi (c), vol. 5, No. 2, 2008, pp. 549-551.
Katumba et al., "Solar Selective Absorber Functionality of Carbon Nanoparticles Embedded in SiO, ZnO and NiO Matrices", SAIP 2006, University of Zimbabwe, Harare, Zimbabwe, 2006, 29 pages.
Kennedy et al., "Development and Testing of High-Temperature Solar Selective Coatings", Presented at the 2004 DOE Solar Energy Technologies Program Review Meeting, Denver, Colorado, Oct. 25-28, 2004, 5 pages.
Kennedy et al., "Progress Toward Developing a Durable High-Temperature Solar Selective Coating", 2007 Parabolic Trough Technologies Workshop, Golden, Colorado, Mar. 8-9, 2007, 1 page.
Kennedy, Cheryl E., "Session: CSP Advanced Systems: Optical Materials Organization: National Renewable Energy Laboratory", NREL, 2008 Solar Annual Review Meeting, Austin, Texas, Apr. 22-24, 2008, 30 pages.

(56) References Cited

OTHER PUBLICATIONS

Kennedy, Cheryl E., "Advances in Concentrating Solar Power Collectors: Mirrors and Solar Selective Coating", AIMCAL, Scottsdale, Arizona, Oct. 10, 2007, pp. 1-69.
Kennedy, Cheryl E., "Progress to Develop an Advanced Solar-Selective Coating", 14th Biennial CSP SolarPACES Symposium, Las Vegas, Nevada, Mar. 4-7, 2008, pp. 1-9.
Kennedy, Cheryl E., "Review of Mid- to High-Temperature Solar Selective Absorber Materials", Technical Report—NREL, Jul. 2002, 58 pages.
Kunstle et al., "Solar Powered Combined Cycle Plant", Power-Gen Europe '94, Cologne, Germany, vol. 6/7, May 17-19, 1994, pp. 134-151.
Laing, Doerte, "Concrete Storage Development for Parabolic Trough Power Plants", Parabolic Trough Technology Workshop, Golden, CO, Mar. 8, 2007, pp. 1-17.
Laing, Doerte, "Storage Development for Direct Stream Generation Power Plants", Parabolic Trough Technology Workshop, Golden, CO, Mar. 9, 2007, pp. 1-21.
Le Lievre et al., "Design of 6.5 MW Solar Thermal Electricity Plant with Zero Fossil Fuel Backup", ANZSES Annual Conference—Clean Energy?—Can Do!, Canberra, Australia, 2006, pp. 1-7.
Lefrois, R. T., "Active Heat Exchange System Development for Latent Heat Thermal Energy Storage", Honeywell, Inc., Technology Strategy Center, pp. 338-353.
Library of Congress, "Application of Solar Technology to Today's Energy Needs—vol. I", Chapter VIII, titled "Collectors", Office of Technology Assessment, Library of Congress Card Catalog No. 78-600060, Jun. 1978, pp. 245-326.
Library of Congress, "Application of Solar Technology to Today's Energy Needs—vol. I", Chapter IX, titled "Energy Conversion with Heat Engines", Office of Technology Assessment, Library of Congress Card Catalog No. 78-600060, Jun. 1978, pp. 329-389.
Library of Congress, "Application of Solar Technology to Today's Energy Needs—vol. I", Chapter XI, titled "Energy Storage", Office of Technology Assessment, Library of Congress Card Catalog No. 78-600060, Jun. 1978, pp. 429-483.
Lippke, Franc, "Numerische Simulation der Absorberdynamik von Parabolrinnen-Solar-kraftwerken mit direkter Dampferzeugung", VDI Publishing House, vol. 6, No. 307, 1994, 232 pages. (107 pages of English Translation and 125 pages of Original Document).
Lloyd Energy, "Cloncurry Solar Thermal Storage Project", available online at <http://web.archive.org/web/20080719080141/http:/www.lloydenergy.com/presentations.php>, Jul. 19, 2008, 15 pages.
Lloyd Energy, "Frequently Asked Questions—Cloncurry Solar Power Pilot Project", available online at <http://web.archive.org/web/20080719211253/www.lloydenergy.com/presentations/cloncurry+Solar-Thermal+Storage+Project+FAQ.pdf>, Nov. 7, 2007, 3 pages.
Lloyd Energy, "Lake Cargelligo Solar Thermal Storage Project", available online at <http://web.archive.org/web/2008071908141/http:/www.lloydenergy.com/presentations.php>, Jul. 19, 2008, 16 pages.
Lovegrove et al., "Developing Ammonia Based Thermo-chemical Energy Storage for Dish Power Plants", Solar Energy, vol. 76, 2004, pp. 331-337.
Lovegrove et al., "Endothermic Reactors for an Ammonia Based Thermo-chemical Solar Energy Storage and Transport System", Solar Energy, vol. 56, No. 4, 1996, pp. 361-371.
Mertins et al., "Geometry Optimization of Fresnel-Collectors with Economic Assessment", Jan. 1, 2004, 8 pages.
Mills et al., "Case Study: Low Cost Solar Thermal Power Development in NSW", Proceedings at Enviro 2004, Mar. 28, 2004, 7 pages.
Mills et al., "Cheaper Than Coal?", International Solar Energy Society Solar World Congress, Orlando, Florida, Aug. 6-12, 2005, 8 pages.
Mills et al., "Compact Linear Fresnel Reflector Progress", SolarPACES 2006, A7-S2, 2006, pp. 1-7.
Mills et al., "The Future for Solar Thermal", Proceedings of the 8th Renewable & Sustainable Power Conference, ESAA Alice Springs, Aug. 2002, pp. 1-20.
Mills et al., "U.S. Appl. No. 60/934,549, filed Jun. 13, 2007".
Mills et al., "U.S. Appl. No. 61/007,926, filed Aug. 27, 2007".
Mills et al., "U.S. Appl. No. 60/933,574, filed Jun. 6, 2007".
Mills et al., "U.S. Appl. No. 60/933,615, filed Jun. 6, 2007".
Mills et al., "U.S. Appl. No. 60/933,619, filed Jun. 6, 2007".
Mills et al., "U.S. Appl. No. 60/933,620, filed Jun. 6, 2007".
Mills et al., "U.S. Appl. No. 60/933,637, filed Jun. 6, 2007".
Mills et al., "U.S. Appl. No. 60/933,648, filed Jun. 6, 2007".
Morrison, Graham, "Large Scale Solar Thermal Electricity", Australia-China Energy Symposium, Nov. 2006, 25 pages.
Nava et al., "Trough Thermal Storage—Status Spring 2007", NREL/DLR Trough Workshop, Denver, Mar. 2007, 19 pages.
NIR News, "A Celebration of Near Infrared Spectroscopy", The Newsletter of the International Council for Near Infrared Spectroscopy, vol. 16, No. 7, Oct./Nov. 2005, 30 pages.
NREL, "Survey of Thermal Storage for Parabolic Trough Power Plants", Pilkington Solar International GmbH, Cologne, Germany, Sep. 13, 1999-Jun. 12, 2000, 61 pages.
Odeh et al., "Hydrodynamic Model for Horizontal and Inclined Solar Absorber Tubes for Direct Steam Generation Collectors", 13th Australasian Fluid Mechanics Conference, Monash University, Melbourne, Australia, Dec. 13-18, 1998, 4 pages.
Odeh et al., "Performance of Horizontal and Inclined Direct Steam Generation Trough Solar Collectors", ANZSES 1998, Perth, Australia, Oct. 1998, 8 pages.
Official Committee Hansard, "House of Representatives: Standing Committee on Industry and Resources", available online at <http://www.ah.gov.au/hansard/reps/committee/r10386.htm>, Aug. 9, 2007, 18 pages.
Non Final Office Action received for U.S. Appl. No. 12/012,920, mailed on Apr. 4, 2013, 9 pages.
European Office Action received for European Patent Application No. 08828772.7, mailed on Mar. 25, 2013, 7 pages.
Office Action received for Mexican Patent Application No. MX/a/2010/002250, mailed on Apr. 1, 2013, 6 pages (3 pages of English Translation and 3 pages of Official copy).
Non-Final Office Action received for U.S. Appl. No. 12/012,829, mailed on Jun. 28, 2013, 15 pages.
Mills et al., "Multi-Tower Line Focus Fresnel Arrays", Proceedings of ISEC 2003: International Solar Energy Conference, Manua Kea Resort, Hawaii Island, Hawaii, USA, Mar. 16-18, 2003, 6 pages.
Mills et al., "Solar Preheating of the Liddell Coal-fired Powerplant", ANZSES Annual Conference 2003, Nov. 26-29, 2003, pp. 600-604.
Mills, D., "Advances in Solar Thermal Electricity Technology", Solar Energy, vol. 76, 2004, pp. 19-31.
Mills, D., "Lower Temperature Approach for Very Large Solar Powerplants", Presented at 11th SolarPaces, Zurich, Switzerland, Sep. 4-6, 2002, 6 pages.
Mills et al., "Advanced Fresnel Reflector Powerplants—Performance and Generating Costs", Proceedings of Solar 97—Australia and New Zealand Solar Energy Society, paper 84, 1997, pp. 1-9.
Mills et al., "Project Proposal for a Compact Linear Fresnel Reflector Solar Thermal Plant in the Hunter Valley", Available at <http://solar1.mech.unsw.edu.au/glm/papers/Mills_projectproposal_newcastle.pdf>, 2002, 6 pages.
Morrison et al., "Water-in-Glass Evacuated Tube Solar Water Heaters", Proceedings of ISES 2001, Solar World Congress, Adelaide, Australia, Nov. 25-30, 2001, pp. 545-550.
Morrison et al., "Solar Thermal Power Systems—Stanwell Power Station Project", ANZSES Annual Conference, Geelong, Australia, 1999, 10 pages.
Nitarski et al., "Combined Radiation and Natural Convection in a Trapezoidal Cavity Absorber: An Experimental Study", Proceedings of the Seventh Australasian Heat and Mass Transfer Conference, James Cook University, Townsville, Jul. 2000, pp. 251-256.
International Search Report and Written Opinion received for PCT Patent Application No. PCT/AU2005/000208, mailed on May 24, 2005, 5 pages.

(56) References Cited

OTHER PUBLICATIONS

Pye et al., "Convection Inside the Cavity Receiver of the CLFR Concentrating Solar Power System", 7th Natural Convection Workshop, Sydney, Australia, Jul. 2003, 2 pages.
Pye et al., "Modelling of Cavity Receiver Heat Transfer for the Compact Linear Fresnel Reflector", ISES World Congress, Jun. 14-19, 2003, 8 pages.
Pye et al., "Steam-circuit Model for the Compact Linear Fresnel Reflector Prototype", ANZSES Solar 2004: Life, the Universe and Renewables, Perth, Western Australia, Nov. 30-Dec. 3, 2004, pp. 1-10.
Pye et al., "Transient Modelling of Cavity Receiver Heat Transfer for the Compact Linear Fresnel Reflector", ANZSES Solar 2003, Melbourne, Australia, Nov. 23-29, 2003, pp. 1-9.
Reynolds et al., "A Hydrodynamic Model for a Line-Focus Direct Steam Generation Solar Collector", Proceedings of Solar 2002—Australia and New Zealand Solar Energy Society—Solar Harvest, Newcastle, Australia, 2002, pp. 1-6.
Reynolds et al., "Combined Radiation and Natural Convection in a Trapezoidal Cavity Absorber", Proceedings 7th Australasian Heat Transfer and Mass Transfer Conference, Townsville, Australia, as posted on <http://solar1.mech.unsw.edu.au/glm/galm-papers/7AHMTC_reynolds.pdf>, Jun. 2000, 6 pages.
Reynolds et al., "Heat Transfer in a Trapezoidal Cavity Absorber for a Solar Thermal Collector", ANZSES Annual Conference—Renewable Energy Transforming Business, Brisbane, Australia, 2000, pp. 547-555.
Burbidge et al., "Stanwell Solar Thermal Power Project", 10th Symposium on Solar Thermal Concentrating Technologies, Sydney, Australia, 2000, 6 pages.
Reynolds et al., "An Experimental and Computational Study of the Heat Loss Characteristics of a Trapezoidal Cavity Absorber", Proceedings of ISES 2001 Solar World Congress, Adelaide, Australia, Nov. 25-30, 2001, pp. 919-924.
Office Action received for Mexican Patent Application No. MXa2010002251, mailed on Jan. 23, 2013, 5 pages (3 pages of English Translation and 2 pages of Official copy).
Pacheco et al., "Development of a Molten-Salt Thermocline Thermal Storage System for Parabolic Trough Plants", Proceedings of Solar Forum 2001, Solar Energy: The Power to Choose, Washington, D.C., Apr. 21-25, 2001, 9 pages.
Pacheco et al., "Development of Molten-Salt Thermocline Thermal Storage System for Parabolic Trough Plants", Journal of Solar Energy Engineering, vol. 124, May 2002, pp. 153-159.
Passo, Janne, "Moisture Depth Profiling in Paper Using Near-Infrared Spectroscopy", VTT Technical Research Centre of Finland, Nov. 2007, 204 pages.
Peterson, Josh, "Super-Concrete to Store Solar Power Works: TreeHugger", Available at <http://www.treehugger.com/files/2008/12/thermal-storage-concrete.php>, Dec. 2008, pp. 1-5.
Pye, John, "Compact Linear Fresnel Reflector", pp. 1-7.
Reynolds et al., "An Experimental and Computational Study of the Heat Loss Characteristics of a Trapezoidal Cavity Absorber", Solar Energy, vol. 76, 2004, pp. 229-234.
Reynolds, David J., "A Thermal and Hydrodynamic Model for a Compact Linear Fresnel Reflector-Type Solar Thermal Collector", University of New South Wales, 2005, 291 pages.
Riesenkampf et al., "New High-Tin Phase Found in Electrolytic Sn—Ni Deposits", Journal of Materials Science, vol. 36, No. 19, Oct. 2001, pp. 4633-4636. (Abstract Only).
Schramek et al., "Heliostats for Maximum Ground Coverage", Energy, vol. 29, 2004, pp. 701-713.
Seri, "Phase-Change Thermal Energy Storage", Final Subcontract Report on the Symposium Held Oct. 19-20, 1988, Helendale, California, U.S. Department of Energy Contract No. DE-AC0283CH10093, Nov. 1989, 151 pages.
SolarPACES, "SolarPACES 2009 Program", Berlin Germany, Sep. 15-18, 2009, 19 pages.
Stanley et al., "An Overview of Engineering and Agricultural Design Considerations of the Raft River Soil-Warming and Heat Dissipation Experiment", EG&G Idaho, Inc., U.S. Department of Energy Idaho Operations Office Under DOE Contact No. DE-AC07-76ID01570, Apr. 1982, pp. 1-23.
Stine et al., "Power Cycles for Solar Applications", Chapter 12, Solar Energy Fundamentals and Design with Computer Applications, John Wiley & Sons, New York, 1985, pp. 281-334.
Stine et al., "Solar Energy Fundamentals and Design with Computer Applications", John Wiley & Sons, New York, (Table of Contents only), 1985, pp. xiii-xiv.
Stine et al., "Solar Thermal Projects", Chapter 14 in Solar Energy Fundamentals and Design with Computer Applications, John Wiley & Sons, New York, 1985, pp. 364-396.
Solar Progress, "Solar Progress Renewable Energy for Australasia", Solar Progress, vol. 25, No. 3, Oct. 2004, pp. 1-35.
Tamaura et al., "A Novel Beam Down System for Solar Power Generation with Multi-ring Central Reflectors and Molten Salt Thermal Storage", Presented at 13th International Symposium on Concentrating Solar Power and Chemical Energy Technologies, Seville, Spain, Available at <http://www.fundacionsener.es/EPORTAL_DOCS/GENERAL/FILE-cw7646d431b8c543d7b45a/ANOVELBEAM-DOWNSYSTEM.pdf>, Jun. 20-23, 2006, pp. 1-8.
Tamme, Rainer, "Future Storage System", World Solar Power, Seville, Spain, Oct. 24-26, 2007, pp. 1-22.
Tamme, Rainer, "Storage Technology for Process Heat Applications", Preheat Symposium, Freiburg, Germany, Jun. 21, 2007, pp. 1-24.
Tamme, Rainer, "TES for Process Heat and Power Generation", Symposium "Material Development for Thermal Energy Storage," Phase Change Materials and Chemical Reaktions, Bad Tolz, Germany, Jun. 4-6, 2008, pp. 1-25.
Tamme, Rainer, "Thermal Energy Storage: Concrete & Phase Changes TES", 2006 Parabolic Trough Technology Workshop, Incline Village, Nevada, Feb. 13, 2006, pp. 1-28.
Tanner, A. R., "Application of Underground Thermal Energy Storage for Solar Thermal Power Generation in New South Wales", School of Aerospace, Mechanical and Mechatronic Engineering, The University of Sydney, Nov. 2003, 124 pages.
Tegehall, Per-Erik, "Review of the Impact of Intermetallic Layers on the Brittleness of Tin-Lead and Lead-Free Solder Joints", IVF Project Report 06/07, Mar. 2006, pp. 1-63.
Tesfamicharel, Tuquabo, "Characterization of Selective Solar Absorbers: Experimental and Theoretical Modeling", ACTA Universitatis Upsaliensis Uppsala, 2000, pp. 1-79.
The Aerospace Corporation, "Evaluation of the FMC Line Cavity Central Receiver Concept", National Technical Information Service, Apr. 1977, pp. 1-26.
The Oil Drum, "Storing Energy Using Graphite", Australia and New Zealand, available online at <http://anz.theoildrum.com/node/3608>, Feb. 12, 2008, 7 pages.
Tomlinson et al., "Substrate Roughness, Deposit Thickness and the Corrosion of Electroless Nickel Coatings", Journal of Material Science, vol. 25, 1990, pp. 4972-4976.
Tully et al., "Paraboloid simple and compound cone concentrators for spherical absorbers", Solar Energy, Pergamon Press. Oxford, GB, vol. 29, No. 2, XP025415037, ISSN: 0038-092X, 001: 10.1016/0038-092X(82) 90179-7, Jan. 1, 1982, 167-174 pages.
Turkenburg et al., "Renewable Energy Technologies", Chapter 7 in World Energy Assessment: Energy and the Challenge of Sustainability, 2000, pp. 220-272.
Turner et al., "High Temperature Thermal Energy Storage in Moving Sand", Proceedings of the 13th Intersociety Energy Conversion Engineering Conference, San Diego, CA, Aug. 20-25, 1978, pp. 923-927.
Turner, Robert H., "High Temperature Thermal Energy Storage", Part I and Part II, The Franklin Institute Press, Philadelphia, Pennsylvania, 1978, 51 pages.
Turner, Robert H., "High Temperature Thermal Energy Storage in Steel and Sand", DOE/NASA/0100-79-1, Dec. 15, 1979, 95 pages.
Von Tobias Mauelshagen, "Technologie der Solar Power Group am Beispiel Eines 10MWe Frosenelkraftwerkes", Solar Power Group Workshop, Solar Power Group GmbH, Berlin, Germany, Available at <http://www.mss-csp.info/cms/upload/pdf/Berlin_Nov_2008/7. Solar_Power_Group_Prsentation_Mauelshagen_Workshop_Berlin_20112008.pd>, Nov. 20, 2008, pp. 1-31.

(56) References Cited

OTHER PUBLICATIONS

Wynne et al., "The Transformation on Annealing of the Metastable Electrodeposit, NiSnx, to Its Equilibrium Phases", Metallurgical Transactions, vol. 3, Jan. 1972, pp. 301-305.
Zollner et al., "Rechnerische Simulation von Heizkraftprozessen als Instrument zur Parametervariation und Optimierung", FWI, vol. 18, No. 5, 1989, pp. 466-471.
Zoschak et al., "Studies of the Direct Input of Solar Energy to a Fossil-Fueled Central Station Steam Power Plants", Solar Energy, vol. 17, 1975, pp. 297-305.
Non Final Office Action received for U.S. Appl. No. 12/012,829, mailed on Dec. 7, 2011, 16 pages.
Final Office Action received for U.S. Appl. No. 12/012,829, mailed on Jul. 20, 2012, 13 pages.
Bernhard et al., "Linear Fresnel Collector Demonstration on the PSA. PartI—Design; Construction and Quality Control", Proceedings of the 14th Solar PACES International Symposium, Las Vegas, Nevada, Mar. 4-7, 2008, 10 pages.
Dey et al., "Operation of a CLFR Research Apparatus", Proceedings of the 38th Annual Conference of the Australian and New Zealand Energy Society, Solar 2000—From Fossils to Photons, Brisbane, Australia, Nov. 28, 2000 through Dec. 1, 2000, pp. 516-527.
Dey, C. J., "Heat Transfer Aspects of an Elevated Linear Absorber", Solar Energy, vol. 76, 2004, pp. 243-249.
Francia, G., "Pilot Plants of Solar Steam Generating Stations", Solar Energy, vol. 12, The Journal of Solar Energy Science and Technology, 1968, pp. 51-64.
Haberle et al., "The Solarmundo Line Focussing Fresnel Collector. Optical and Thermal Performance and Cost Calculations", Available at: <http://www.ise.fraunhofer.de/veroeffentlichungen/nach-jahrgaengen/2002/the-solarmundoline-focussing-fresnel-collector-optical-and-thermal-performance-and-cost-calculations>, Sep. 2002, 11 pages.
Hu et al., "Solar Power Boosting of Fossil Fuelled Power Plants", Proceedings ISES Solar World Congress, Goteborg, Sweden, Jun. 14-19, 2003, 7 pages.
Jance et al., "Natural Convection and Radiation within an Enclosed Inverted Absorber Cavity: Preliminary Experimental Results", ANZSES Annual Conference—From Fossils to Photons, Brisbane, Australia, 2000, 7 pages.
Jance, Michael, "Experimental and Numerical Analysis of combined Convention and Radiation Heat Transfer within a Stratified Trapezoidal Cavity", University of New South Wales, Thesis Project Report, Jun. 2003, 219 pages.
Mills et al., "Compact Linear Fresnel Reflector Solar Thermal Powerplants", Solar Energy, vol. 68, No. 3, Mar. 2000, pp. 263-283.
Mills et al., "Design of a 240 MWe Solar Thermal Power Plant", Present at Eurosun 2004 Conference, Available at <http://www.ausra.com/pdfs/Design240MWsolarthermalpowerplant_Mills_2004>, 2004, 8 pages.
Mills et al., "First Results from Compact Linear Fresnel Reflector Installation", Proceedings Solar 2004, Australian and New Zealand Energy Society, Murdoch, Dec. 2004, 7 pages.
Mills et al., "Multi-tower Line Focus Fresnel Array Project", Journal of Solar Energy Engineering, vol. 128, No. 1, Feb. 2006, pp. 118-120.
Office Action received for Mexican Patent Application No. MX/a/2010/002250, mailed on Aug. 28, 2013, 4 pages (1 page of English Translation and 3 pages of Official copy).
Final Office Action received for U.S. Appl. No. 12/012,920, mailed on Jan. 27, 2014, 14 pages.
Notice of Allowance received for U.S. Appl. No. 12/675,753, mailed on Apr. 8, 2014, 10 pages.
Final Office Action received for U.S. Appl. No. 12/012,829, mailed on Apr. 11, 2014, 17 pages.
Office Action Received for Chinese Patent Application No. 201210298846.9, mailed on Feb. 20, 2014, 8 pages (2 pages of English Translation and 6 pages of Official Copy).
Non-Final Office Action received for U.S. Appl. No. 12/012,920, mailed on Aug. 22, 2014, 9 pages.
Notice of Acceptance Received for Australian Patent Application No. 2008293906, mailed on Jul. 17, 2014, 2 pages.

\* cited by examiner

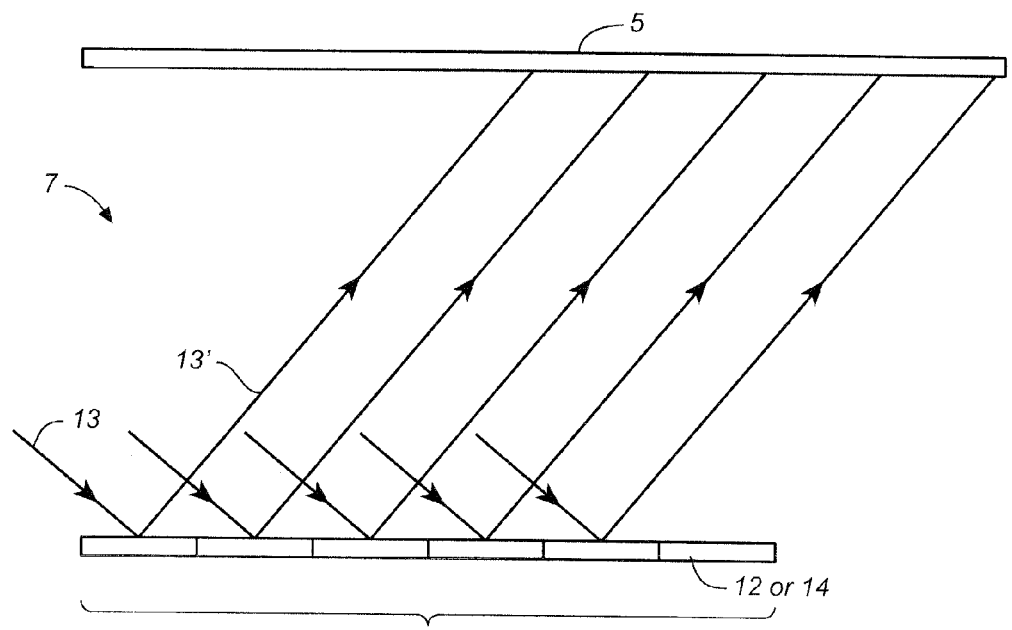
FIG. 1B $15R_{1,...,M}$ or $17R_{1,...,N}$
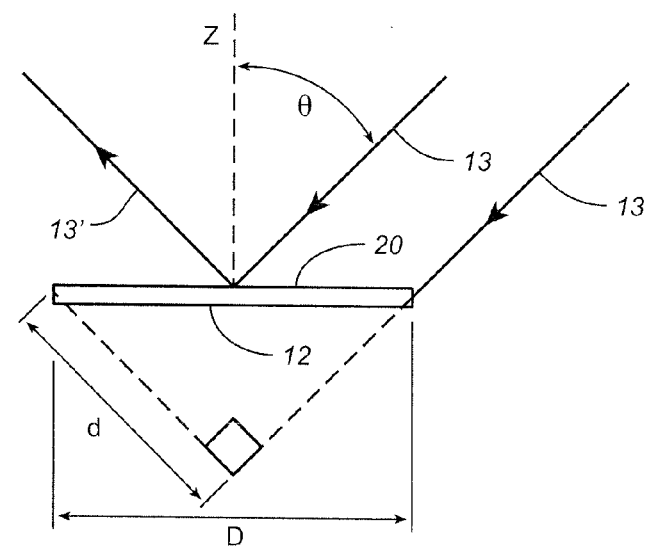
FIG. 1C

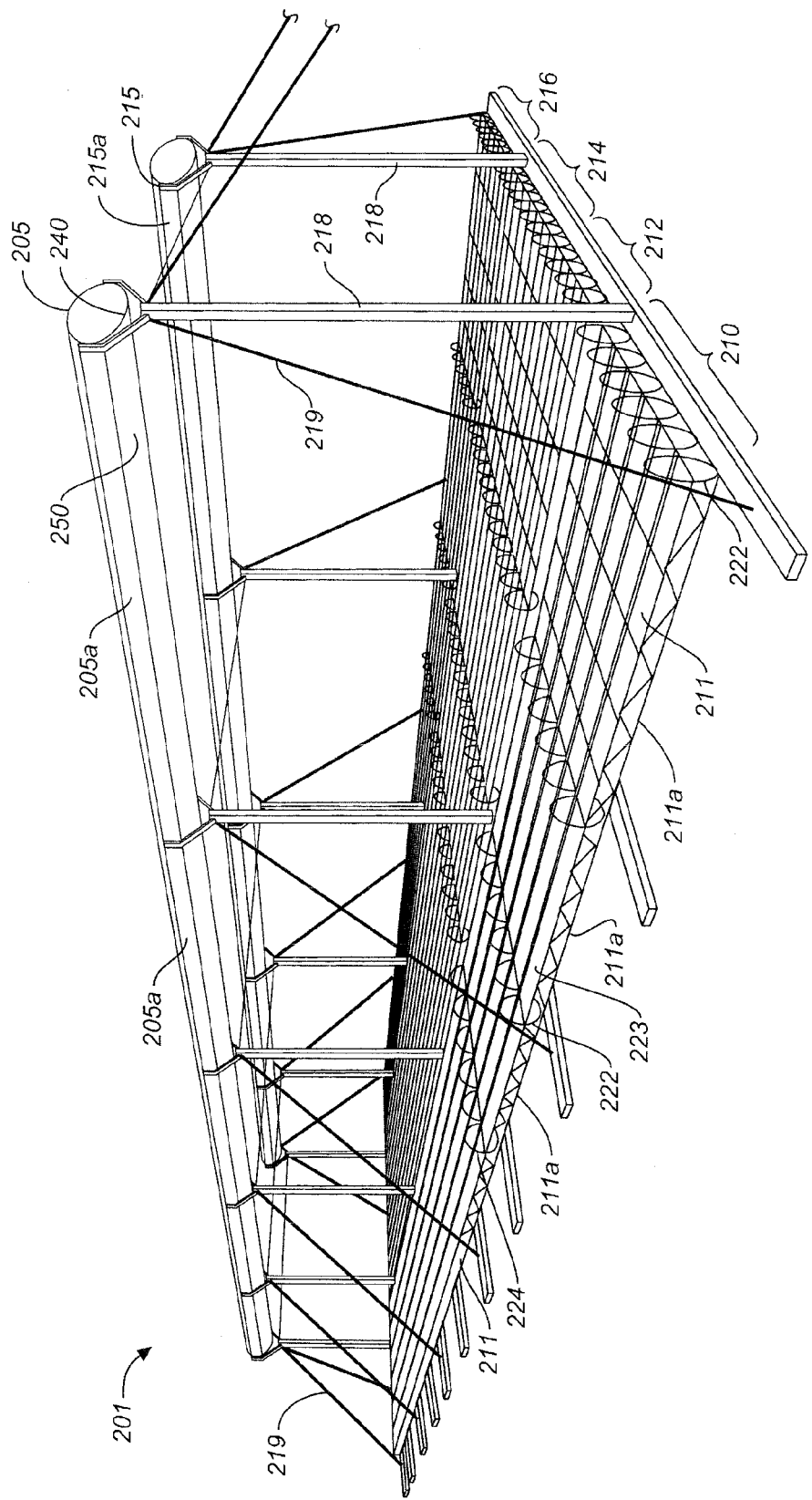

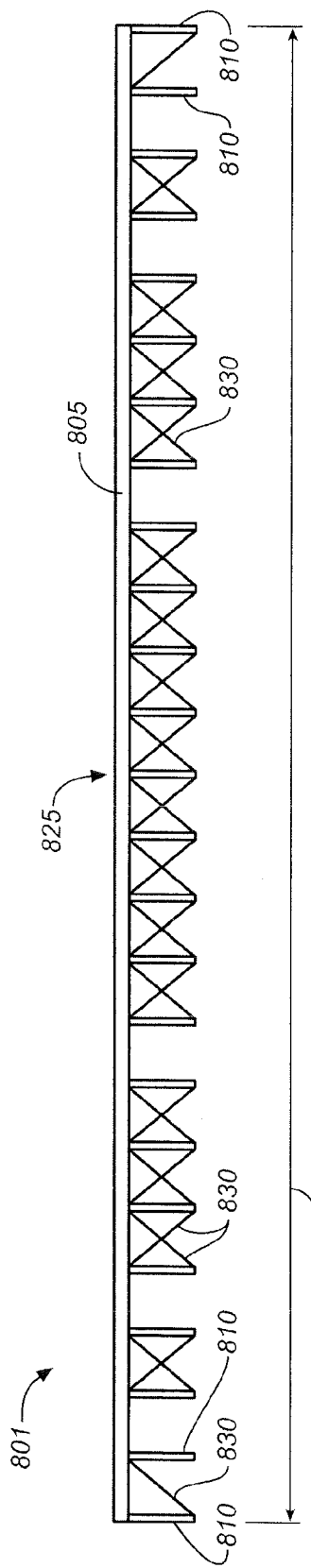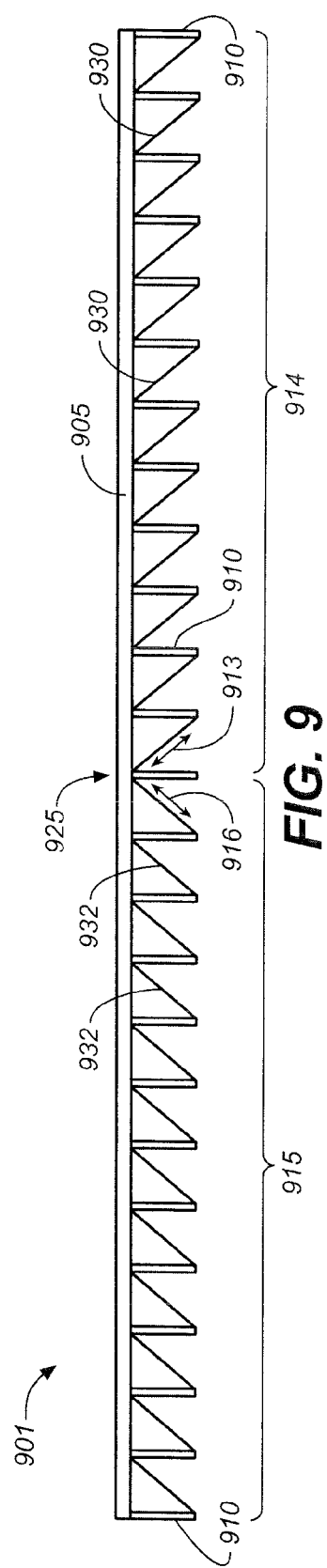

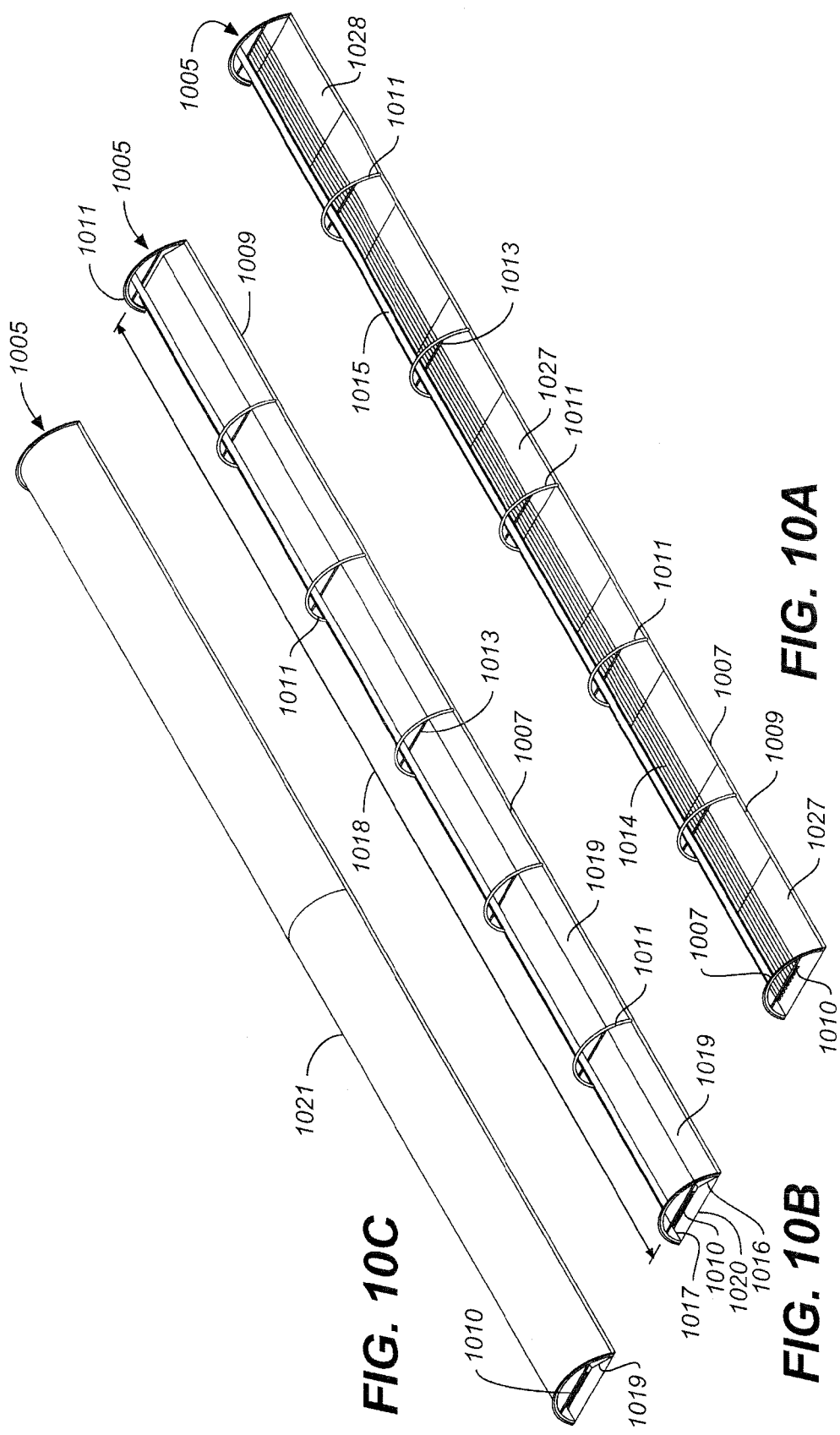

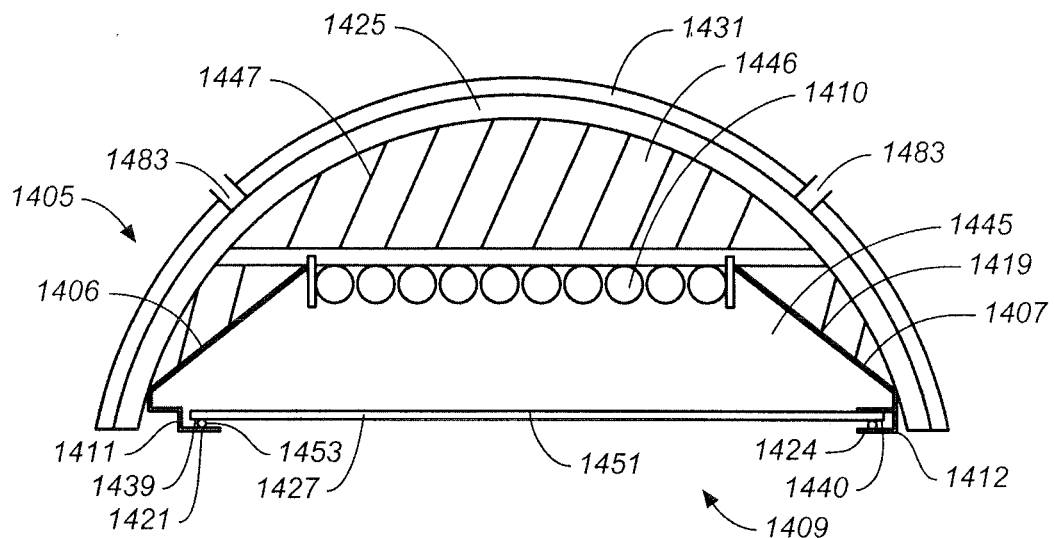
FIG. 14A
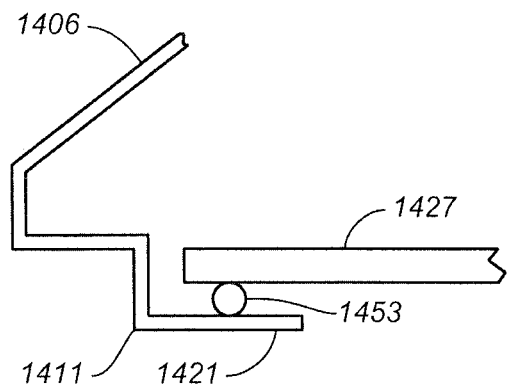 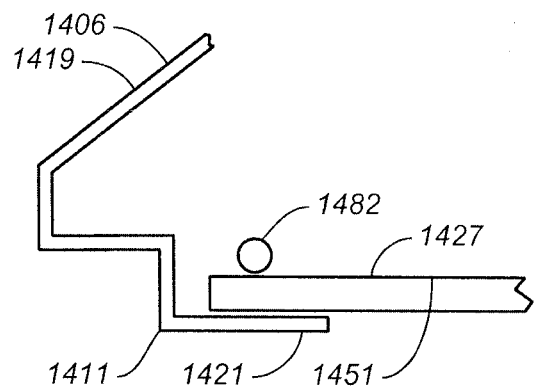
FIG. 14B  FIG. 14C

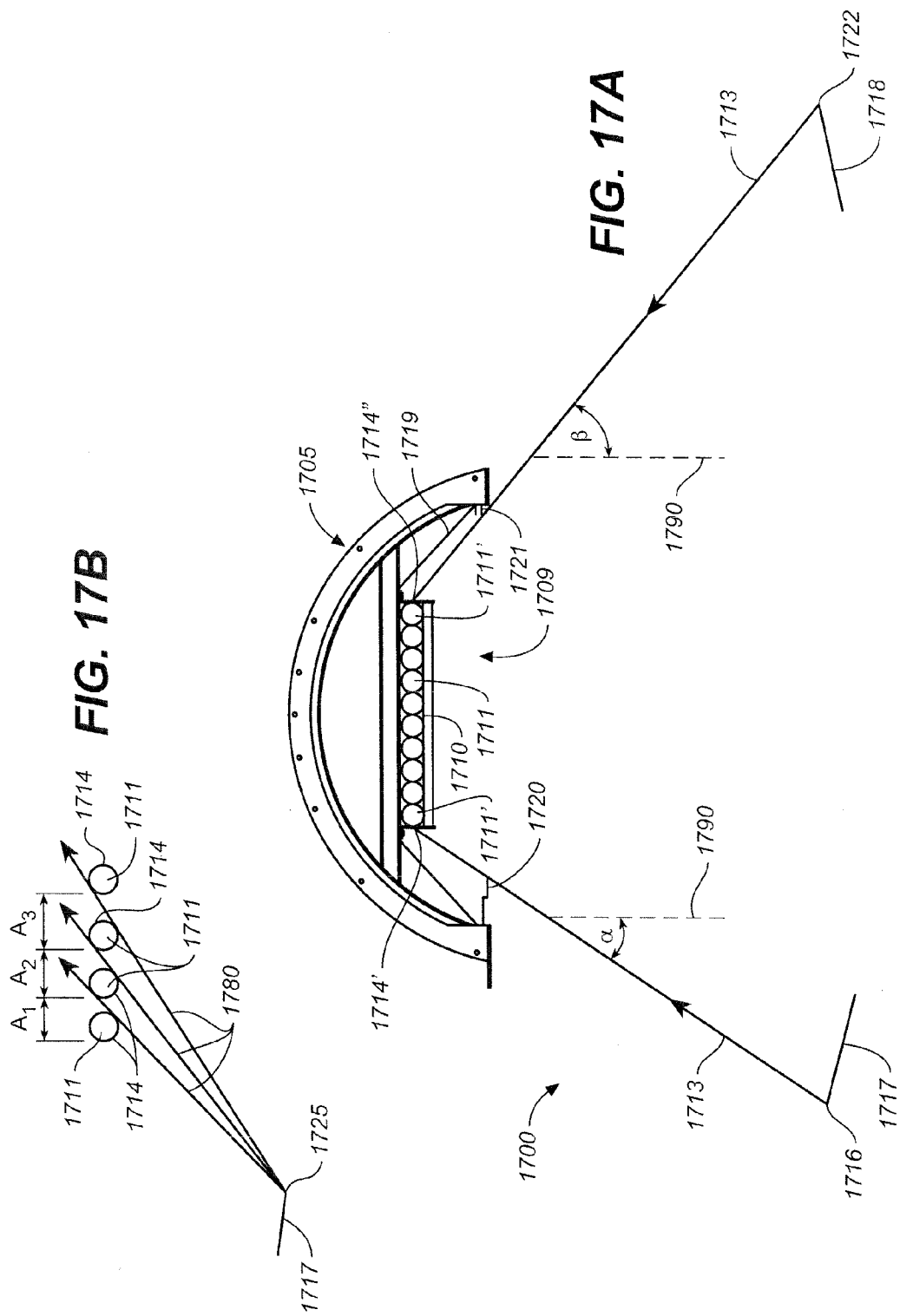

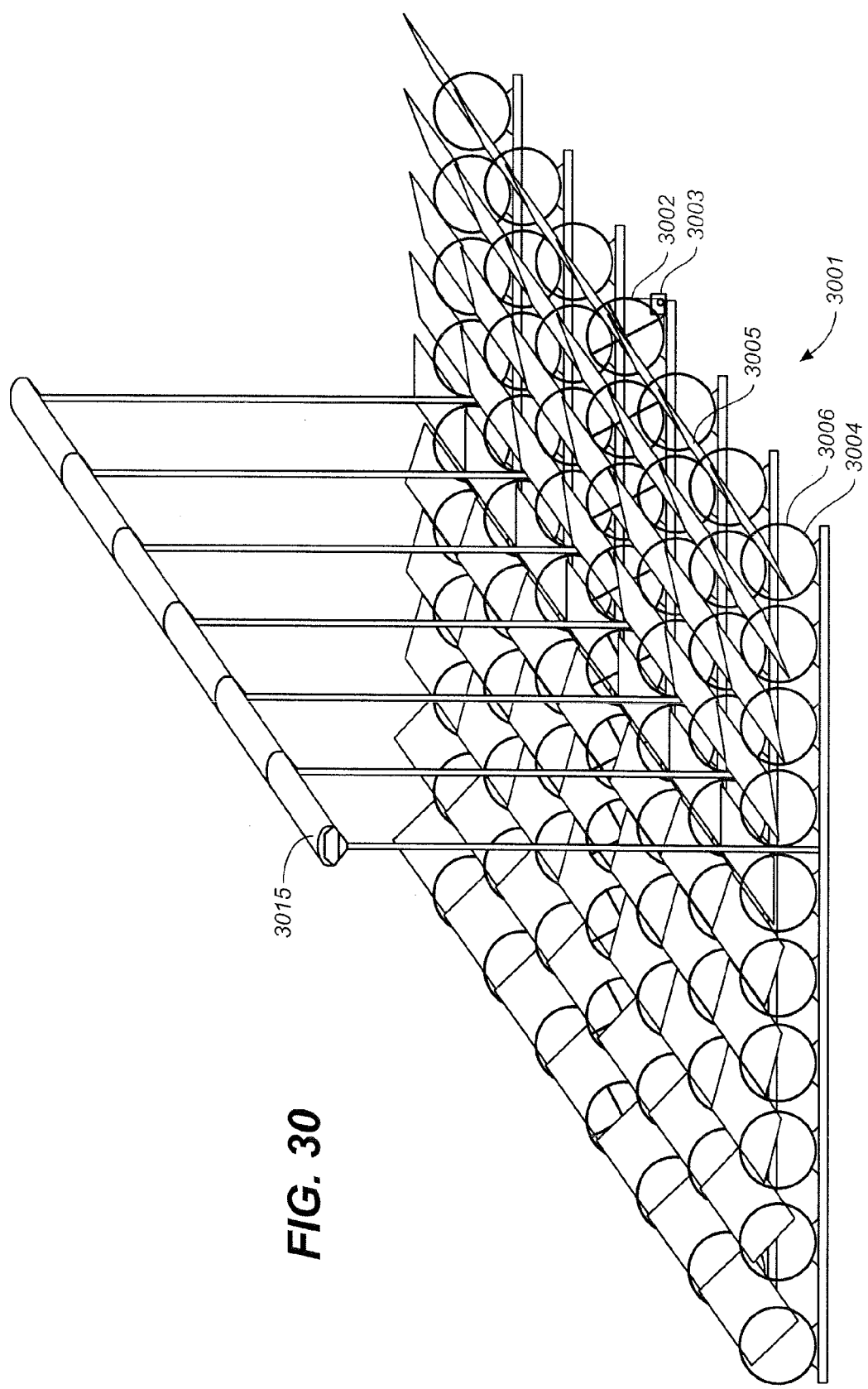

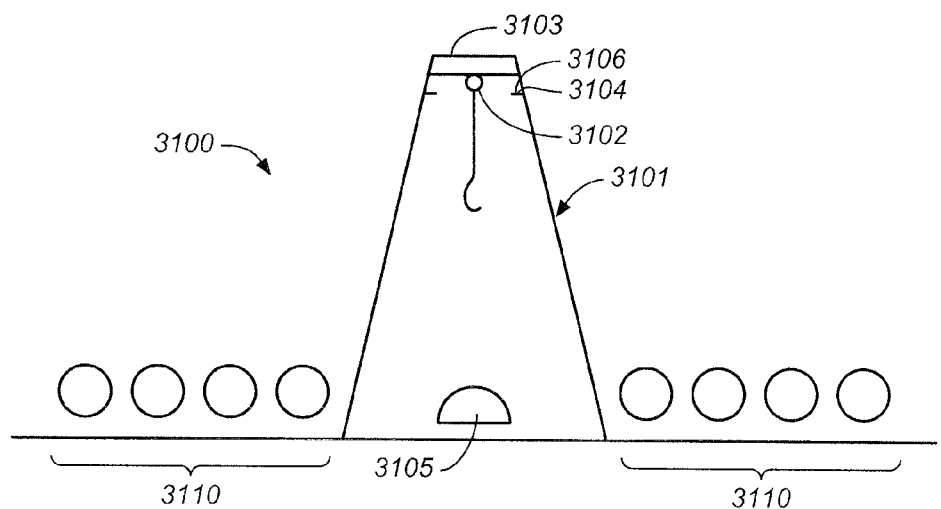
FIG. 31A
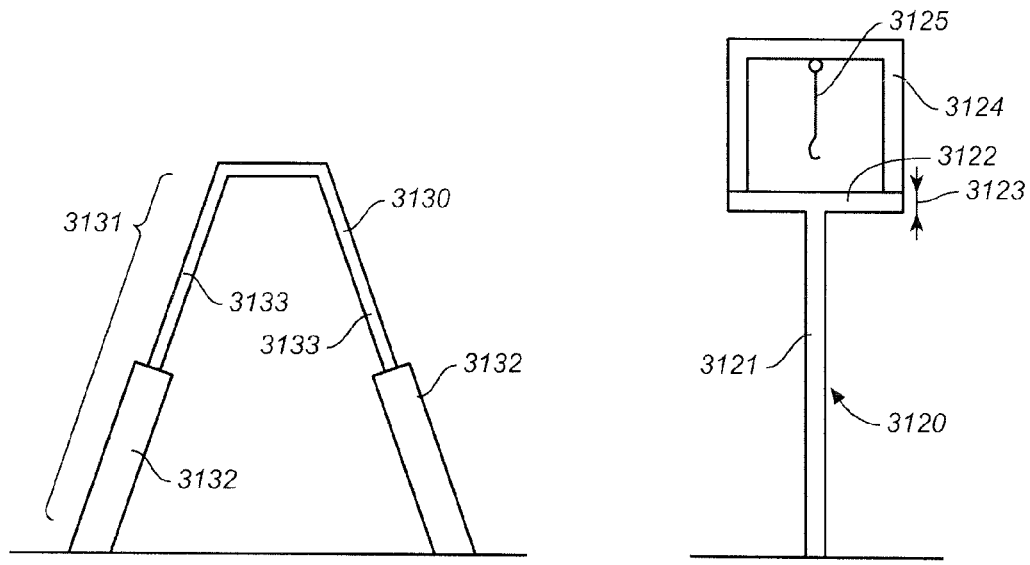
FIG. 31B
FIG. 31C

LINEAR FRESNEL SOLAR ARRAYS AND DRIVES THEREFOR

CROSS-REFERENCE TO RELATED APPLICATIONS

This application claims the benefit of priority to U.S. patent application Ser. No. 11/895,869, filed Aug. 27, 2007, entitled "Linear Fresnel Solar Arrays," petition granted to convert to a provisional patent application on Jan. 23, 2008 having U.S. Patent application Ser. No. 61/007,926, which is incorporated by reference herein in its entirety. This application is related to U.S. patent application Ser. No. 12/012,829, entitled "Linear Fresnel Solar Arrays and Receivers Therefor", and U.S. patent application Ser. No. 12/012,920, entitled "Linear Fresnel Solar Arrays and Components Therefor", each of which is filed concurrently herewith, and each of which is incorporated by reference herein in its entirety.

FIELD

This application relates to solar energy collector systems, and in particular to linear Fresnel reflector solar arrays. Described herein are reflectors, solar radiation absorbers, receivers, drives, support structures, stabilization elements, and related methods, that may be used in conjunction with solar energy collector systems.

BACKGROUND

Solar energy collector systems of the type referred to as Linear Fresnel Reflector (LFR) systems are relatively well known. LFR arrays include a field of linear reflectors that are arrayed in parallel side-by-side rows. The reflectors may be driven to track the sun's motion. In these systems, the reflectors are oriented to reflect incident solar radiation to an elevated distant receiver that is capable of absorbing the reflected solar radiation. The receiver typically extends parallel to the rows of reflectors to receive the reflected radiation for energy exchange. The receiver typically can be, but need not be, positioned between two adjacent fields of reflectors. For example, in some systems, n spaced-apart receivers may be illuminated by reflected radiation from (n+1) or, alternatively, (n−1) reflector fields. In some variations, a single receiver may be illuminated by reflected radiation from two adjacent reflector fields.

To track the sun's movements, the individual reflectors may be mounted to supports that are capable of tilting or pivoting. Examples of suitable supports are described in International Patent Publication Number WO05/003647, filed Jul. 1, 2004, and International Patent Publication Number WO05/0078360, filed Feb. 17, 2005, each of which is incorporated herein by reference in its entirety.

In most LFR systems, the receivers and rows of reflectors are positioned to extend linearly in a north-south direction, with the reflectors symmetrically disposed around the receivers. In these systems, the reflectors may be pivotally mounted and driven through an angle approaching 90° to track approximate east-west motion of the sun during successive diurnal periods. Some systems have been proposed in which the rows of reflectors are positioned to extend linearly in an east-west direction. See, e.g., Di Canio et al., Final Report 1977-79 DOE/ET/20426-1, and International Patent Application Serial No. PCT/AU2007/001232, entitled "Energy Collection System Having East-West Extending Linear Reflectors," filed Aug. 27, 2007, each of which is incorporated herein by reference in its entirety.

Solar collector systems are generally expansive in area, and are located in remote environments. In addition, solar collector systems must endure for many years in a harsh outdoor environment with relatively low operation, maintenance and repair requirements. Improved systems with reduced requirements for personnel, time, and/or equipment for operation, maintenance, and/or repair are desired. Further, it is desired that solar collector systems be facile to transport to and assemble in remote locations. Therefore, a need exists for improved solar collection systems and improved components for solar collector systems. Such components may include reflectors, receivers, drives, drive systems, and/or support structures. The improved components may lead to improved collection efficiency and improved overall performance for solar collector systems, e.g., LFR arrays. The improved components may also result in reduced operational, maintenance and/or repair requirements, improved longevity in harsh outdoor environments, improved portability, reduced assembly requirements, and reduced manufacturing time and/or costs.

SUMMARY

Described herein are solar energy collector systems, components for solar energy collector systems, and methods for installing solar energy collector systems. The components for solar energy collector systems include, but are not limited to, solar radiation absorbers, receivers, drives and drive systems, reflectors, and various support structures. The solar energy collection systems, solar radiation absorbers receivers, drives, drive systems, reflectors, support structures, and/or methods may be used, for example, in LFR solar arrays. The components and methods described herein may be used together in any combination in a solar collector system, or they may be used separately in different solar collector systems.

Drive systems for solar energy collector systems are described here. Some drive systems comprise two or more reflector supports, where each reflector support comprises a frame that is configured to support and rotate one or more reflector elements coupled thereto. In these systems, at least one reflector support frame may comprise a hoop-like frame, and at least one reflector support frame may comprise a frame that is substantially confined to one side of a plane generally defined by a reflective surface of the one or more reflector elements coupled thereto. For example, some drive systems may comprise a master reflector support coupled to one or more slave reflector supports so that rotation of the master reflector support frame drives corresponding rotation in the one or more slave reflector support frames coupled thereto. A master reflector support may for example be configured to drive three or more slave reflector support frames coupled thereto. In some variations, a master reflector support frame may comprise a hoop-like frame. At least one reflector support in some drive systems may comprise a base, a frame substantially confined to one side of a plane generally defined by a reflective surface of one or more reflector elements coupled thereto, and a hub configured to support the frame, where the hub is rotationally coupled to the base.

Additional variations of drive systems for solar energy collector systems are described here. These systems include a bidirectional motor configured to drive a gear, and a reflector support configured to support and rotate one or more reflector elements coupled thereto. The reflector support is configured to rotate the reflector elements to at least partially track diurnal motion of the sun, and the reflector elements are configured to direct incident solar radiation to an elevated receiver. In these systems, a chain may be engaged with the gear. The chain may be configured to wrap around an outer peripheral surface of the reflector support and to continuously engage the chain with an engagement member that is affixed to the outer peripheral surface of the reflector support so that the motor drives the reflector support via the chain.

In some variations of these drive systems, the chain may form a continuous loop and the engagement member may comprise a toothed gear-like structure. In other variations, the engagement member may comprise first and second attachment points and the chain may comprise first and second chain ends. In these variations, the first chain end may be configured to engage with the first attachment point and the second chain end may be configured to engage with the second attachment point. Tension applied to the chain in a first direction can rotate the reflector support in one of a clockwise and counterclockwise direction, and tension applied to the chain in a second direction can rotate the reflector support in the other of a clockwise and counterclockwise direction.

Other drive systems for solar energy collector systems are provided. These systems comprise a motor configured to drive a gear. The systems also comprise a reflector support configured to support and rotate one or more reflector elements coupled thereto. The reflector support is configured to rotate the reflector elements to at least partially track diurnal motion of the sun. The reflector elements are configured to direct incident solar radiation to an elevated receiver. A chain may be engaged with the gear and wrapped around and coupled to an outer peripheral surface of the reflector support, so that when the gear is driven by the motor, tension is applied to the chain to rotate the reflector support. In these systems, the chain may be threaded around a pivot arm. The pivot arm may be configured to adjust tension in the chain. For example, the pivot arm may comprise a height adjustment to adjust chain tension.

Still other variations of drive systems for solar energy collector systems are described. These systems include a motor configured to drive a gear. The systems also include a reflector support configured to support and rotate one or more reflector elements coupled thereto. The reflector support is configured to rotate the reflector elements to at least partially track diurnal motion of the sun and the reflector elements are configured to direct incident solar radiation to an elevated receiver. A chain may be engaged with the gear and wrapped around and coupled to an outer peripheral surface of the reflector support so that when the gear is driven by the motor, tension is applied to the chain to rotate the reflector support. A wheel may be mounted to a base and configured to contact the outer peripheral surface of the reflector support and to rotate as the reflector support rotates. The systems also may include a lateral stabilization member configured to reduce an amount of lateral movement between the wheel and the outer peripheral surface of the reflector support.

Drive systems for solar energy collector systems comprising a rotational position sensor are described here. These drive systems each comprise a motor configured to rotate a reflector support, where the reflector support is configured to support and rotate one or more reflector elements coupled thereto to at least partially track diurnal motion of the sun and to direct incident solar radiation to a receiver. The drive systems may also comprise a positional sensor configured to sense a rotational position of the reflector support to within at least about 0.2 degrees, at least about 0.1 degrees, at least about 0.05 degrees, at least about 0.02 degrees, or at least about 0.01 degrees. Any suitable positional sensor may be used in these drive systems. For example, in some drive systems the positional sensor may be mounted to the reflector support and comprise at least two elements. The two elements may be any suitable elements, e.g., capacitive elements or accelerometers. Comparative measurements between the at least two elements in the positional sensor may be used to determine the rotational position of the reflector support. In some variations, comparative measurements between the at least two elements may be used to determine an absolute tilt of the reflector support. Some drive systems may include a positional sensor that is configured to sense a rotational position of the reflector support while the reflector support is rotating.

Some variations of these drive systems may include a controller configured to provide input to the positional sensor and/or to receive output from the positional sensor. Certain variations of those drive systems may comprise a closed loop control configuration in which the controller is configured to receive input from the positional sensor to determine a rotational position of the reflector support, and to provide output instructions to the motor to rotate the reflector support to a desired rotational position. Drive systems may comprise one or more limit sensors, wherein each limit sensor may be configured to detect if the reflector support has rotated to a predetermined limit position. For example, some drive systems may comprise two limit sensors positioned on or near a periphery of the reflector support and oriented at about 270° relative to each other. In variations of drive systems comprising one or more limit sensors, at least one of the one or more limit sensors may be configured to be used as a reference position for the positional sensor.

Solar energy collector systems are provided that may include the rotational position sensors described above. These systems include a reflector support configured to support and rotate one or more reflector elements coupled thereto. The reflector support is configured to rotate the one or more reflector elements to at least partially track diurnal motion of the sun, and the one or more reflector elements are configured to direct incident solar radiation to an elevated receiver. The systems include a motor configured to rotate the reflector support, and a positional sensor configured to sense a rotational position of the reflector support to within at least about 0.2 degrees, at least about 0.1 degrees, at least about 0.05 degrees, at least about 0.02 degrees, or at least about 0.01 degrees. These systems may include a controller that is configured to receive input from the positional sensor and/or to provide output to the positional sensor. Some variations of the systems may further comprise a closed-loop control configuration in which the controller is configured to receive input from the positional sensor to determine the rotational position of the reflector support, and to provide output instructions to the motor to rotate the reflector support to a desired rotational position.

Drives for solar energy collector systems are provided. These drives comprise a first motor configured to rotate a first set comprising one or more reflector supports. Each reflector support in the first set may be configured to support and rotate one or more reflector elements coupled thereto. The first motor may be configured to be coupled to a variable frequency drive to control rotational position resolution imparted to the first set of reflector supports rotated by the first motor. For example, in some variations, the variable frequency drive may provide AC power having a frequency of about 1 Hz to about 6 Hz, or about 1 Hz to about 5 Hz (e.g., about 2 Hz, or about 3 Hz) to the first motor. The variable frequency drive may comprise a controller that is configured to be remotely programmable. In certain variations of the drives, the first motor may be configured to be switched between direct drive operation and operation through the variable frequency drive.

Some variations of the drives may comprise a second motor configured to rotate a second set comprising one or more reflector supports. Each reflector support in the second set may be configured to support and rotate one or more reflector elements coupled thereto. The second motor may also configured to be coupled to the variable frequency drive to control rotational position resolution imparted to the second set of reflector supports rotated by the second motor. In these variations, the first and second motors may be configured to be operated sequentially to rotate the first and second sets of reflector supports in a sequential manner. In other variations, the first and second motors may be configured to be operated at the same time, so that the first and second sets of reflector supports may be rotated at the same time. Each of the first and second motors may be configured to be switched between operation through the variable frequency drive, and operation in direct drive. The first and second motors may be configured to be switched independently from each other between operation through the variable frequency drive and operation in direct drive.

Still more drive systems for solar energy collector systems are described. These drive systems may comprise one or more variable frequency drives. Each variable frequency drive may be coupled to a set of motors, wherein each motor in the set is configured to drive one or more reflector supports. The reflector supports are each configured to support and rotate one or more reflector elements coupled thereto. The drive systems may comprise one or more switches, wherein each switch is configured to bypass at least one of the one or more variable frequency drives so that the set of motors coupled to the at least one of the one or more variable frequency drives operates in direct drive. In some variations of these drive systems, a single variable frequency drive may be coupled to a set comprising ten or more motors. A single switch may be configured to bypass more than one of the variable frequency drives.

Some variations of drives may have more than one rotational speed setting. For example, some drives may have a first slow rotational speed setting for relatively slow movement of the reflector support with a relatively high degree of rotational position accuracy and a second rotational speed setting corresponding to motor speeds that allow relatively faster rotation of the reflector support. Some variations may comprise a third rotational speed setting corresponding to very rapid rotation of a reflector support, e.g., the most rapid rotation of the reflector support desired. Different rotational speed settings may be achieved by supplying AC power having different frequency ranges to the motors in the drives. For example, the first rotational speed setting may be achieved by supplying AC power to a motor through a variable frequency drive operating at about 1 Hz to about 6 Hz, or about 1 Hz to about 5 Hz, e.g., at about 2 Hz or 3 Hz. The second rotational speed setting may be achieved by operating a motor in direct drive at about 50 Hz or about 60 Hz, e.g., by bypassing the variable frequency drive connected to the motor. The third rotational speed setting, if present, may be achieved by supplying AC power at a harmonic of the nominal AC power through the variable frequency drive to a motor, e.g., at about 100 Hz, or about 120 Hz.

Solar energy collector systems are provided. These systems each comprise an elevated receiver comprising a solar radiation absorber and first and second reflector fields positioned on opposite sides relative to a center of the receiver. Each reflector field comprises reflectors arranged into one or more parallel reflector rows that extend generally in a direction parallel to a length of the receiver. The reflectors each comprise a reflective surface configured to direct incident solar radiation to the solar radiation absorber in the receiver. At least a portion of each reflector row is configured to be driven by a motor, and each motor may be configured to be connected to a variable frequency drive. In some variations of these systems, a single variable frequency drive may be connected to ten or more motors. Some systems may further comprise a switch that is configured to bypass the variable frequency drive connected to a motor. The variable frequency drive may provide AC power having any suitable frequency to the motors connected thereto, e.g., a frequency of about 1 Hz to about 6 Hz, or about 1 Hz to about 5 Hz. Some variations of solar energy collector systems may have drives comprising more than one rotational speed setting, as described above.

BRIEF DESCRIPTION OF THE FIGURES

FIGS. 1A-1C illustrate an example of a solar energy collector system that includes two reflector fields directing incident solar radiation to an elevated receiver. FIG. 1A depicts a transverse, end-on view of the system, and FIGS. 1B-1C depict longitudinal, side views of the system.

FIG. 2A illustrates an example of a solar energy collector system that includes two elevated receivers.

FIG. 8 shows a variation of a solar energy collector system with an arrangement of longitudinal guy wires.

FIG. 9 shows another variation of a solar energy collector system with an arrangement of longitudinal guy wires.

FIGS. 10A-10C illustrate an example of a receiver.

FIGS. 11A, 11C and 11D illustrate cross-sectional views of the receiver, FIG. 11B provides a perspective view of the receiver, and FIG. 11E provides a bottom plan view of the receiver.

FIGS. 12B-12C show cross-sectional views along line I-I'.

FIGS. 14A-14F show variations of receivers in which ingress of external air into a cavity housing a solar radiation absorber through a pathway near a window is inhibited.

FIG. 16B is an enlarged view of encircled region A.

FIGS. 17A-17B illustrate an example of a method for determining spacings between solar radiation absorber tubes.

FIG. 25B is an enlarged view of encircled region B.

FIG. 26B is an enlarged view of encircled region C.

FIG. 28B is an enlarged view of encircled region D.

FIG. 30 illustrates an embodiment solar energy collector system comprising multiple reflector rows and multiple motors.

FIGS. 31A-31C illustrate various embodiments of vertical support structures for use in solar energy collector systems.

DETAILED DESCRIPTION

Figure 1A:
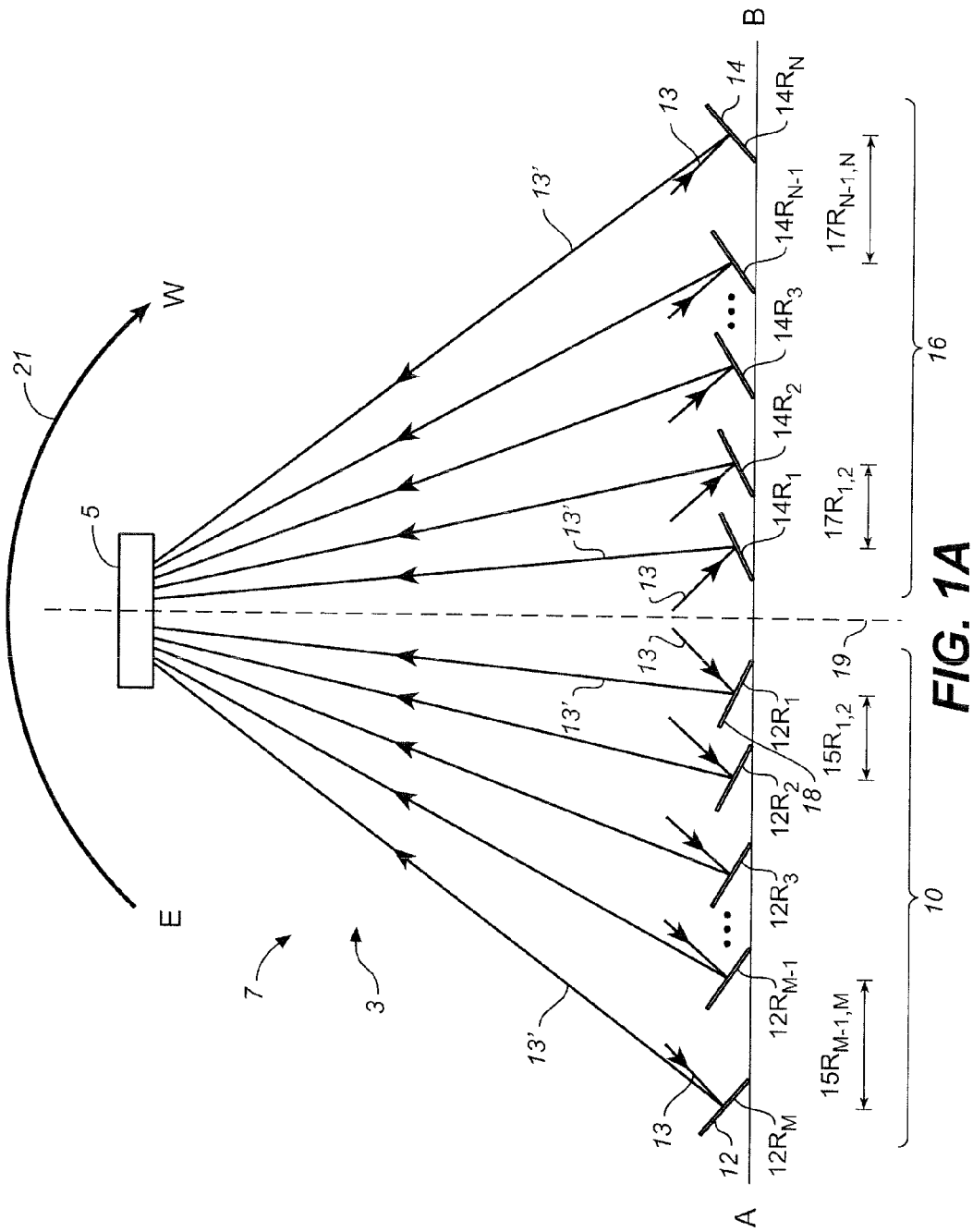

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will enable one skilled in the art to make and use the invention, and describes several embodiments, examples, adaptations, variations, alternatives and uses of the invention, including what is presently believed to be the best mode of carrying out the invention.

The terms "solar energy collector system," "solar collector system," and "solar array" are used interchangeably throughout this specification and in the appended claims. In addition, unless indicated otherwise, "array" refers to a solar array, and "absorber" refers to a solar radiation absorber. The singular forms "a," "an," and "the" include plural referents unless the context clearly indicates otherwise. Also, the term "parallel" is intended to mean "substantially parallel" and to encompass minor deviations from parallel geometries rather than to require that parallel rows of reflectors, for example, or any other parallel arrangements described herein be exactly parallel. The phrase "generally in a north-south direction" or as used herein is meant to indicate a direction orthogonal to the earth's axis of rotation within a tolerance of about +/−45 degrees. For example, in referring to a row of reflectors extending generally in a north-south direction, it is meant that the reflector row lies parallel to the earth's axis of rotation within a tolerance of about +/−45 degrees.

Disclosed herein are examples and variations of solar energy collector systems, components for solar energy collector systems, and related methods. The solar energy collector systems may be LFR solar arrays. The components may include reflectors for directing incident solar radiation to a receiver, receivers for receiving and at least partially absorbing solar radiation, solar radiation absorbers, drives and drive systems for positioning the reflectors, support structures for elevated receivers, support structures or carrier frames for reflector elements, and additional stabilizing elements, such as guy wires, for stabilizing or securing any part of a solar array. The components described here may be used in any combination in a solar energy collector system. Further, any suitable receiver, solar radiation absorber, reflector, drive, drive system, support structure, stabilizing element, or method disclosed herein, known to a person of ordinary skill in the art, or later developed, may be used in the solar collector systems described herein. Receivers, solar radiation absorbers, reflectors, drives, drive systems, associated support structures and stabilizing elements, and methods disclosed herein may be used in other solar collector systems (e.g., LFR solar arrays) known to one of ordinary skill in the art or later developed.

The following is a general description of solar energy collector systems that may be used in conjunction with any one of, or any combination, of the components for solar collector systems that are described below. Additional examples of solar energy collector systems are included throughout this detailed description in connection with specific components and methods disclosed herein, e.g., reflectors, receivers, absorbers, drives, drive systems, support structures, stabilizing elements, and related methods.

Referring to FIGS. 1A-1C, an example of a LFR array is illustrated. This example is presented generally to encompass systems or arrays that are arranged in either east-west or north-west orientations. LFR array 7 comprises an elevated receiver 5 that is positioned above, but horizontally between, two reflector fields, 10 and 16. The arrow 21 represents the diurnal east-west path of the sun over array 7. For a north-south oriented array, direction A will represent an eastern direction and direction B will represent a western direction. Reflector field 10 comprises reflectors 12 that are arranged in M parallel, side-by-side reflector rows $12R_1$-$12R_M$. Reflector field 16 comprises reflectors 14 that are arranged in N parallel, side-by-side reflector rows $14R_1$-$14R_N$. As shown in FIG. 1B, a single reflector row may comprise one or more reflectors, e.g., 2 to 6. Within a given reflector row comprising multiple reflectors, the multiple reflectors may extend generally along a common plane, e.g., reflectors 14 in reflector row 14R$_1$ may extend generally along common plane 18. Rays 13 represent the path of solar radiation from the sun incident on the reflectors 12 and 14. Rays 13' represent the path of solar radiation reflected from reflectors 12 and 14 to elevated receiver 5. In typical LFR arrays, the reflectors may be curved mirrors that form a line focus at the receiver.

Referring now to FIG. 1C, the angle of incidence θ is shown between an incident ray 13 and an axis Z normal to the incident reflective surface 20 of a reflector (e.g., a reflector 12). The reflector has a width D. Because ray 13 is incident on the surface 20 at a non-normal angle θ, the effective collection width d of the reflector is given by d=D cos(θ). Therefore, the effective collection area of a reflector decreases as the angle of incidence increases. In addition, reflective losses may increase as the angle of incidence increases, and optical aberrations such as astigmatism may increase as the angle of incidence increases. Optical aberrations may reduce the ability to focus solar radiation reflected by a reflector to the receiver, thereby blurring the focus of radiation incident on the receiver and decreasing collection efficiency.

For systems having multiple reflector fields, the reflector fields may be symmetric or asymmetric with respect to a receiver. The composition and/or arrangement of the reflector fields may, for example, be determined to increase ground area usage and/or system collection efficiency. Referring again to FIG. 1A, the two reflector fields 10 and 16 may be symmetric or asymmetric with respect to elevated receiver 5. In this example, receiver 5 has a plane of symmetry 19. M and N, representing the number of reflector rows on opposite sides of plane 19, may be the same or different. In variations of arrays that are designed to be oriented east-west, M and N may be different. The reflector field on the pole side of the receiver (e.g., the north pole for a system being used in the northern hemisphere) may have more reflectors than the reflector field on the equatorial side of the receiver). Examples of east-west arrays are described in U.S. patent application Ser. No. 11/895,869, filed Aug. 27, 2007, and International Patent Application Serial No. PCT/AU2007/001232, filed Aug. 27, 2007, each of which has previously been incorporated herein by reference in its entirety. Alternatively, the number of reflector rows on opposite sides of a center of a receiver (e.g., M and N in FIG. 1A) may be the same. For example, arrays designed to be oriented north-south may be symmetrical with respect to the number of reflectors in two reflector fields reflecting solar radiation to a common receiver.

For a given reflector field, adjacent reflector rows may be spaced apart by a constant row spacing, or by variable row spacings. For example, reflectors in a first reflector row that are less tilted relative to reflectors in an adjacent second reflector row may be packed closer together with the reflectors in the adjacent second row, without causing shading. Referring again to FIG. 1A, the spacing between adjacent reflector rows x and x+1 in reflector field 10 is 15R$_{x,x+1}$, where 1≤x≤M. The spacing between adjacent reflector rows y and y+1 in reflector field 12 is 17R$_{y,y+1}$, where 1≤y≤N. Thus, the inter-reflector row spacings 15R$_{x,x+1}$ may be constant, or 15R$_{x,x+1}$ may be varied as x is varied, and the inter-reflector row spacings 17R$_{y,y+1}$ may be constant, or 17R$_{y,y+1}$ may be varied as y is varied.

In certain variations of arrays, the spacing between adjacent reflector rows may vary generally as the distance between the reflectors rows and the receiver. That is, reflector rows closer to the receiver may be spaced closer together than reflector rows further from the receiver. For example, as illustrated in FIG. 1A, for reflector field 10, the spacing between the first two rows of reflectors 15R$_{1,2}$ closest to receiver 5 may be smaller than the spacing between spacing 15R$_{M-1,M}$ between the two rows of reflectors that are most distant from receiver 5. Similarly, for reflector field 16, the spacing between the first two rows of reflectors 17R$_{1,2}$ closest to receiver 5 may smaller than the spacing 17R$_{N-1,N}$ between the two rows of reflectors most distant from receiver 5. Such reflector row spacing variations may be appropriate for north-south oriented arrays. In certain variations of arrays, the inter-row spacing between reflector rows may vary between reflector fields. Such a configuration may be appropriate for east-west oriented arrays. For example, reflector rows in an equatorial field may be spaced closer together than reflector rows in a polar field, because the reflectors in a reflector row in an equatorial field may be less tilted with respect to reflectors in an adjacent row.

The use of variable row spacings may allow closer packing of reflector rows, resulting in improved use of ground area and/or reduction of shading of reflectors caused by adjacent reflectors. In some systems, a reflector area to ground area ratio may be greater than about 70%, or greater than about 75%, or greater than about 80%. Combinations of constant spacings and variable spacings between reflector rows may be used. For example, a first group of reflector rows, e.g., those closest to the receiver, may be spaced apart by a first constant relatively narrow spacing. A second group of reflector rows, e.g., those farthest from the receiver, may be spaced apart by a second constant relatively wide spacing. In addition, different spacing schemes may be used between different reflector fields in a single system. For example, one reflector field may have constant reflector row spacings and one reflector field may have variable reflector row spacings. For north-south oriented arrays including reflector rows that are about 2.3 meters wide directing solar radiation to an absorber of about 0.6 meter wide positioned about 15 meters above the reflectors, center-center inter-row reflector separations may range from about 2.6 meters to almost 3 meters (e.g., about 2.9 meters).

It should be noted that the diurnal sun moves through an angle less than about 90° in the north-south direction, as compared with an angle approaching about 180° in the east-west direction. Therefore, for east-west oriented arrays, each reflector in a reflector field need only pivotally move less than about 45° to follow the sun during each diurnal period. As a result, the angles of incidence for reflectors in a polar reflector field are generally less than those for reflectors in an equatorial reflector field. Hence, a reflector in a polar reflector field may have greater effective collection area and produce improved focus at the receiver than a corresponding reflector in the equatorial reflector field positioned the same distance from the receiver. Because of the improved efficiency of polar reflectors, the overall collection efficiency of a solar array may be improved by increasing the relative reflector area in the polar reflector field as compared to the equatorial reflector field, e.g., by increasing the number of reflectors in the polar field.

Solar energy collector systems may comprise multiple elevated receivers, and multiple reflector fields configured to direct incident light to the elevated receivers. Referring now to FIG. 2A, solar array 201 includes four reflector fields, 210, 212, 214, and 216. Reflector row 211 includes multiple reflectors 211a. Reflectors 211a in a reflector row may be coupled together in a collinear fashion. For example, reflectors 211a may be coupled together via a common reflector support 222 (e.g., a hoop) at junction regions 223. Supports 222 may be configured to rotationally drive one or more reflectors coupled thereto to at least partially track diurnal motion of the sun. Reflectors in a single row or a segment of a single row may be driven by a drive, e.g., by a motor (not shown) coupled to a master reflector support 224, which may be positioned internally within the row or row segment to be driven to reduce torsional effects at portions of reflector rows located furthest from the master reflector support. Row segments comprising 2, 4, 6, or any suitable number of reflectors may be driven by a drive coupled to a master reflector support. Reflector rows or row segments may be driven individually, or reflector rows or row segments may be driven collectively, in groups (e.g., regionally). A single drive may rotate more than one reflector row or row segment, or multiple drives may be synchronized or coordinated to rotate more than one reflector row or row segment at the same time.

A drive system used in the arrays may comprise any suitable reflector supports that are configured to support and rotate one or more reflector elements. In general, the reflector supports comprise a frame portion configured to support one or more reflector elements, a base, and a linkage rotationally coupling the frame portion to the base so that the frame portion may be rotated through the linkage to position the one or more reflector elements. The reflector supports may be selected to reduce the amount of shading from the support on any reflector element, e.g., one or more reflector elements supported by that reflector support and/or one or more reflector elements supported by adjacent or nearby reflector supports. For example, a reflector support in a drive system may be configured such that a frame portion of the reflector support is substantially confined to one side of a planar region generally defined by a reflective surface of one or more reflector elements supported by the frame, e.g., so that the frame is substantially beneath that reflective surface during operation. A reflector support may also be configured to have strength and/or stability, e.g., torsional strength and/or stability, such that one or more reflector elements supported by that reflector support does not substantially twist or distort when that reflector support is rotated.

As described above, a reflector support in a drive system may be configured to be a master reflector support or a slave reflector support, or to be convertible between a master reflector support and a slave reflector support. A master reflector support may be coupled to a drive (e.g., a drive comprising a motor). A slave reflector support may not be directly coupled to a drive, and instead may be coupled to a master reflector support (or another slave support that is coupled to a master support) so that rotation of the master reflector support drives coordinated rotation in the slave reflector support. In that manner, a single drive may be used to rotate a reflector row or reflector row segment. A master reflector and drive may be configured to drive any suitable number of slave reflector supports, e.g., one, two, three, four, five, six, seven, eight, nine, ten, or eleven, or even more.

Figure 2B:
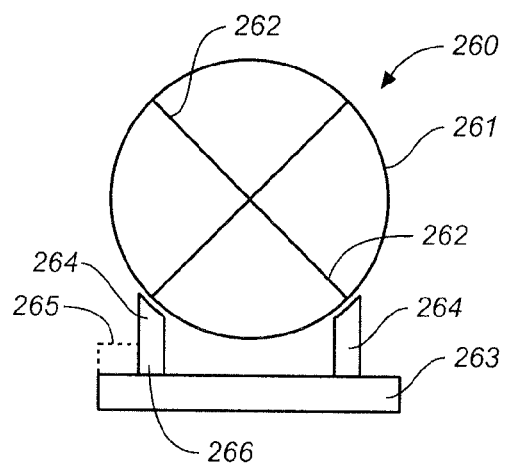
FIGS. 2B-2D illustrate various examples of reflector supports that may be used in solar energy collector systems.
Figure 2C:
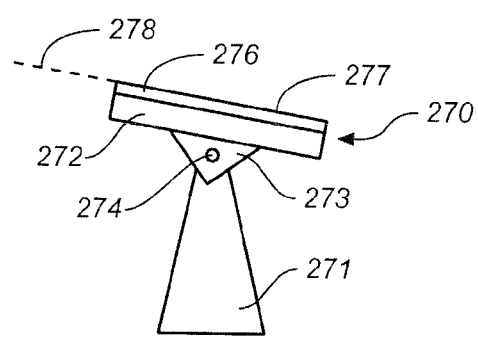
Figure 2D:
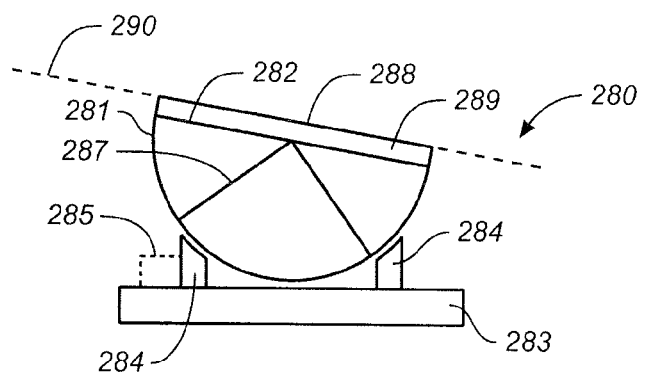

Some variations of reflector supports that may be used in drive systems for solar energy collector arrays, e.g., linear Fresnel reflector arrays, are illustrated in FIGS. 2B-2D. Each of these variations of supports may be configured as a master reflector support or as a slave reflector support. Referring first to the variation illustrated in FIG. 2B, reflector support 260 comprises a hoop-like frame 261 that is configured to support one or more reflector elements (not shown). The frame 261 may optionally comprise one or more cross-members 262. If present, cross-members 262 may add torsional strength to the frame. In some variations, a reflector element (not shown) may be coupled to a cross-member 262. In the particular variation illustrated in FIG. 2B, reflector support 260 may comprise a base 263 and a linkage rotationally coupling frame 261 to the base. In this particular example, the linkage comprises one or more rotational elements 264 (e.g., wheels). If reflector support 260 is configured to be a master reflector support, a drive (e.g., a motor) 265 may be coupled to the reflector support. A drive may be coupled to a master support in any suitable manner, e.g., using one or more gears, belts, drive chains, pivot arms and the like. If reflector support 260 is configured to be a slave support, then a drive 265 may not be directly coupled to the reflector support 260, and instead the reflector support 260 may coupled to and driven by another reflector support (e.g., through one or more longitudinal members (not shown) extending between reflector supports). Additional details regarding drive systems incorporating such hoop-like reflector supports are provided below.

Other variations of reflector supports may be used in the drive systems and arrays described herein. Referring now to FIG. 2C, a reflector support 270 comprises a base 271 and a frame 272. The base 272 may for example comprise one or more posts or pedestals. One or more reflector elements 276 may be supported by frame 272. The frame 272 may be rotationally coupled to the base 271 via a linkage. In this example, the linkage comprises a hub 273 comprising one or more bearings configured to rotate about an axle 274, where the hub 273 is configured to support frame 272. In some variations, axle 274 may comprise two stub axles. In this variation, frame 272 is substantially confined to one side of a plane 278 generally defined by a reflective surface 277 of one or more reflector elements 276. Thus, frame 272 may be substantially beneath reflective surface 277 during operation and may therefore reduce shading by the reflector support 270 on any reflector elements in the array. It should be pointed out that reflective surface 277 may be curved (concave), so that plane 278 may be only generally or approximately defined by reflective surface 277. If reflector support 270 is configured to be a master support, a drive (not shown) may be coupled to axle 274 and/or hub 273 to rotate frame 272 about axle 274. Any suitable drive may be used to rotate frame 272 about axle 274. For example, any combination of gears, belts, drive chains, pivot arms, and the like coupled to a motor may be used. If reflector support 270 is configured to be a slave support, it may be coupled to and driven by another reflector support (e.g., through one or more longitudinal members (not shown) extending between reflector supports).

Still other variations of reflector supports may be used. Referring to FIG. 2D, a reflector support 280 may comprise a frame 281 that comprises a portion of a hoop. Although the variation shown in FIG. 2D shows frame 281 as an approximately 180° arc of a hoop, other variations are possible in which different frames having arcs extending either more or less than about 180° around a hoop are used. Frame 281 may optionally comprise one or more spokes 287 that may provide torsional stability to the reflector support. Frame 281 may comprise a cross-member 282 that may for example be coupled to one or more reflector elements 289. Similar to the variation illustrated in FIG. 2B, reflector support 280 may comprise one or more rotational elements 284 (e.g., wheels) which may be mounted to a base 283. In this variation, frame 281 is confined to one side of a plane 290 generally defined by reflective surface 288 of the one or more reflector elements 289. Therefore, reflector supports similar to those illustrated in FIG. 2D may cause reduced shading of reflector elements in a solar array. As with reflector supports 260 and 270, reflector support 280 may be configured as a master support configured to be driven by a motor 285, or may be configured as a slave support that is coupled to and driven by another reflector support (e.g., via one or more longitudinally members (not shown) extending between reflector supports).

Figure 2E:
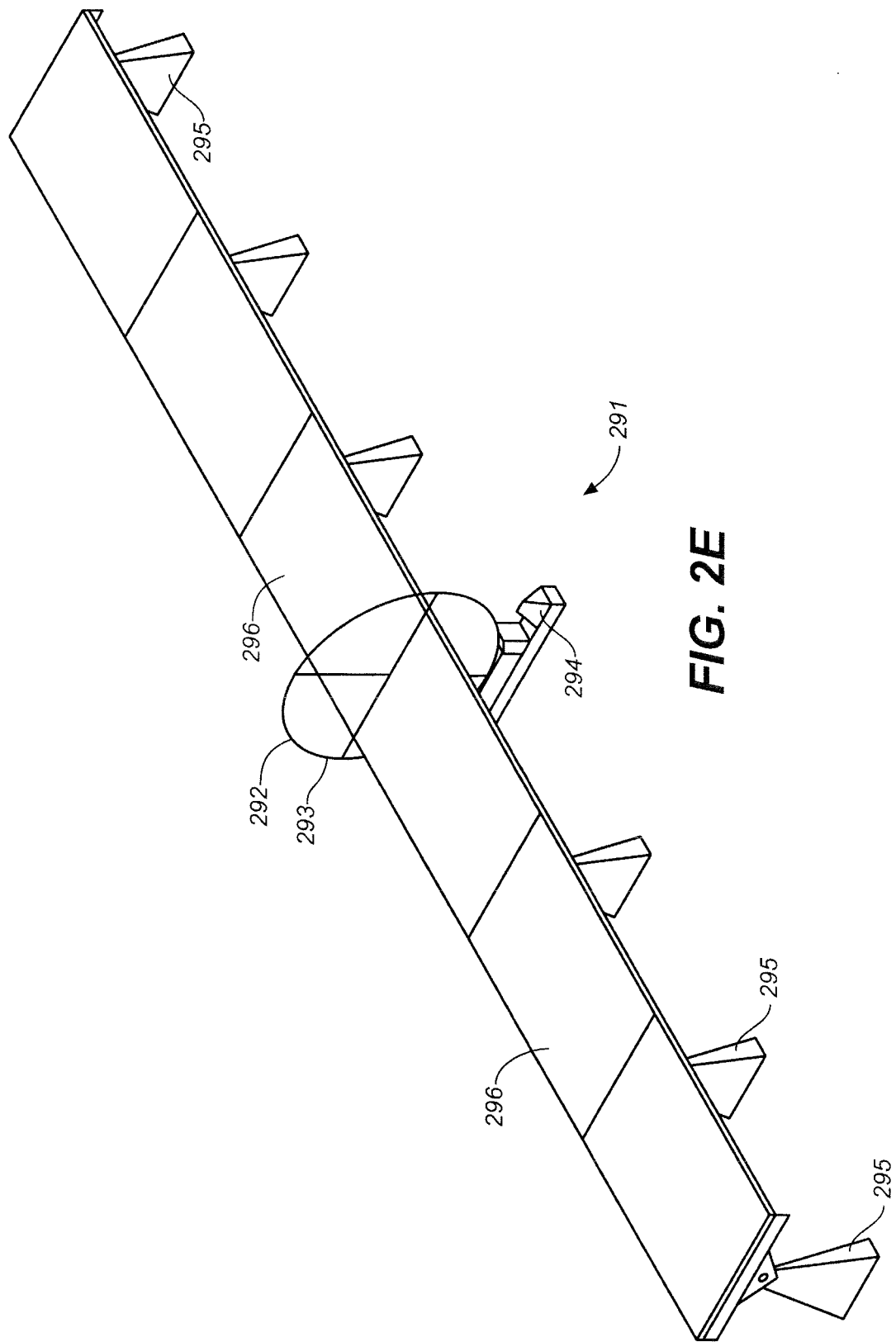
FIG. 2E illustrates an example of a drive system for use in a solar array comprising a combination of reflector support types.

Any combination of reflector supports and reflector support types may be used within an array or within a reflector row in an array. The combination of reflector supports may be selected to provide increased torsional stability along a row, reduced shading, ease of installation, ease of manufacturing, and/or cost. In some variations of arrays, such as array 201 illustrated in FIG. 2A, a majority of reflector supports may comprise hoop-like frames. In FIG. 2E, a drive system 291 for use in an array (e.g., in a portion of a reflector row in an array) is illustrated in which a master reflector support 292 comprises a hoop-like frame 293 and is driven by drive 294. Slave reflector supports 295 are in turn coupled lengthwise together via longitudinally-extending member (not shown) so that reflective elements 296 extend between adjacent ones of the reflector supports. Rotation of master support 292 then drives rotation of all reflector elements 296 in the row or row segment. In the drive system variation illustrated in FIG. 2D, slave supports 295 are selected to be similar to those illustrated in FIG. 2C, which may reduce the overall shading experienced by an array comprising drive system 291. Other combinations of reflector supports may be used within a row or row segment, e.g., slave supports at one or both ends of a row segment may comprise hoop-like frames.

As indicated above, some arrays may comprise more than one receiver. Array 201 in FIG. 2 includes two receivers 205 and 215. Receiver 205 is elevated above and positioned horizontally between reflector fields 210 and 212, and receiver 215 is elevated above and positioned horizontally between reflector fields 214 and 216. Reflectors in reflector fields 210 and 212 are configured to direct incident solar radiation to receiver 205, and reflectors in reflector fields 214 and 216 are configured to direct incident solar radiation to receiver 215. Receivers may have a generally horizontally-oriented aperture (e.g., aperture 250 for receiver 205), through which solar radiation is directed to be incident on a solar energy absorber (not shown) in a receiver. In some variations, a window that is substantially transparent to solar radiation may cover at least part of a receiver aperture (e.g., window 240 is placed in aperture 250 of receiver 205). The receivers may comprise multiple receiver structures (e.g., 205a and 215a) that are joined together to form an elongated receiver. Receivers 205 and 215 are supported with vertical support structures (e.g., stanchions) 218 and stabilized with guy wires 219. The guy wires may be ground-anchored, or they may be anchored to another structure.

A LFR array may occupy a ground area of about $5\times10^3$ m$^2$ to about $25\times10^6$ m$^2$. For example, an array may comprise a single receiver and two fields of reflectors arranged on opposite sides of the receiver to occupy a ground area of about $8.5\times10^3$ m$^2$. Other arrays may comprise multiple receivers and multiple reflector fields to occupy larger ground areas, e.g., about $5\times10^6$ m$^2$ to about $25\times10^6$ m$^2$. For example, the arrays illustrated in FIGS. 1A-1C and FIG. 2A may comprise a portion of a larger LFR array having a plurality of receivers and a plurality of reflector fields. In larger arrays, the plurality of receivers and corresponding reflector fields may be arranged side-by-side and parallel to each other, as are receivers 205 and 215 and reflector fields 210, 212, 214, and 216 in FIG. 2A. In other variations of systems, the plurality of receivers and reflector fields may be arranged in alternate configurations.

The reflectors used in the solar energy collector systems may be any suitable reflectors described here, known to one of ordinary skill in the art, or later developed. Non-limiting examples of suitable reflectors are disclosed in International Patent Applications Nos. PCT/AU2004/000883 and PCT/AU2004/000884, each of which is hereby incorporated by reference herein in its entirety.

Figure 3:
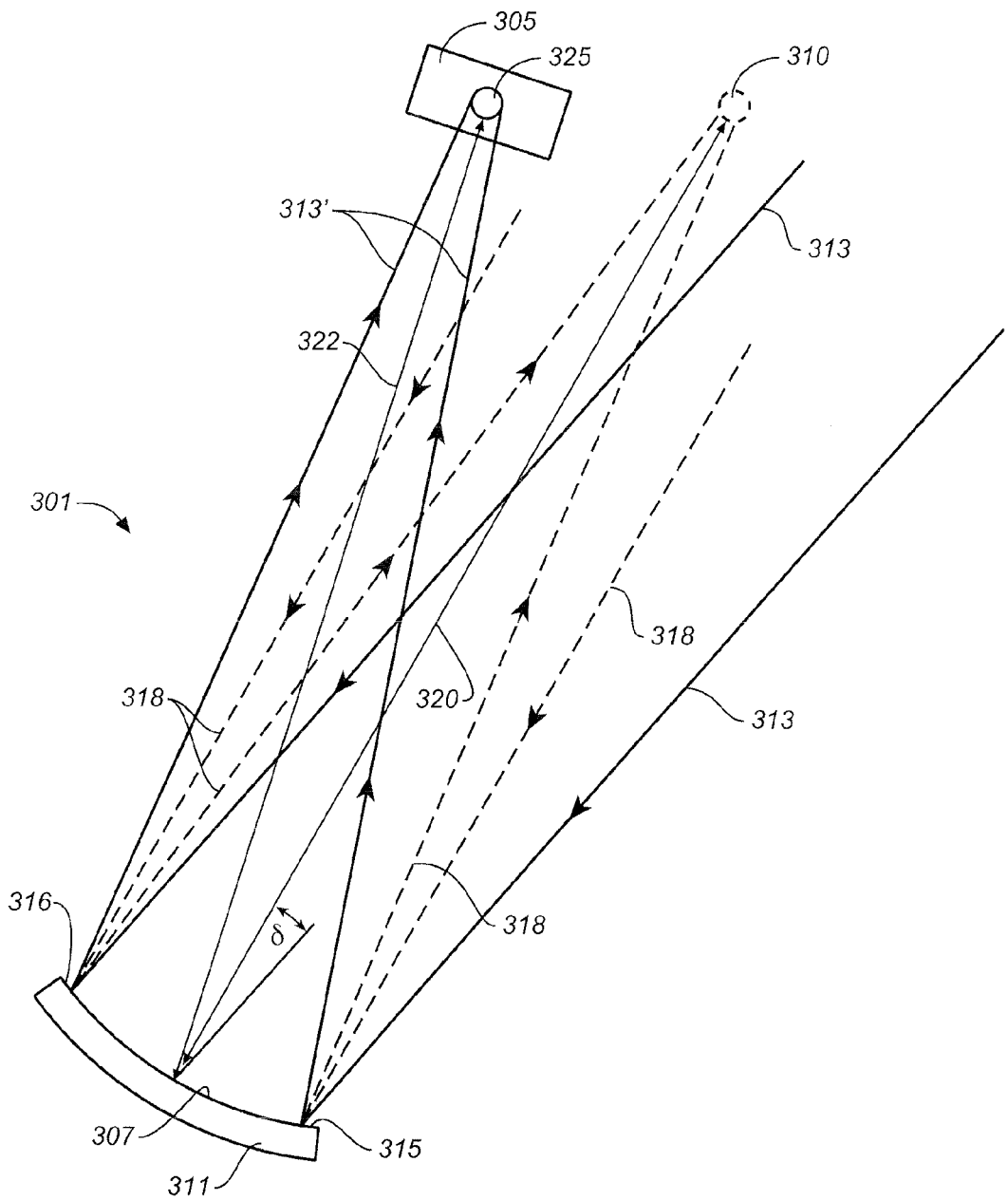
FIG. 3 illustrates an example of a reflector element having a reflective surface that focuses reflected solar radiation at a receiver.
Figure 4:
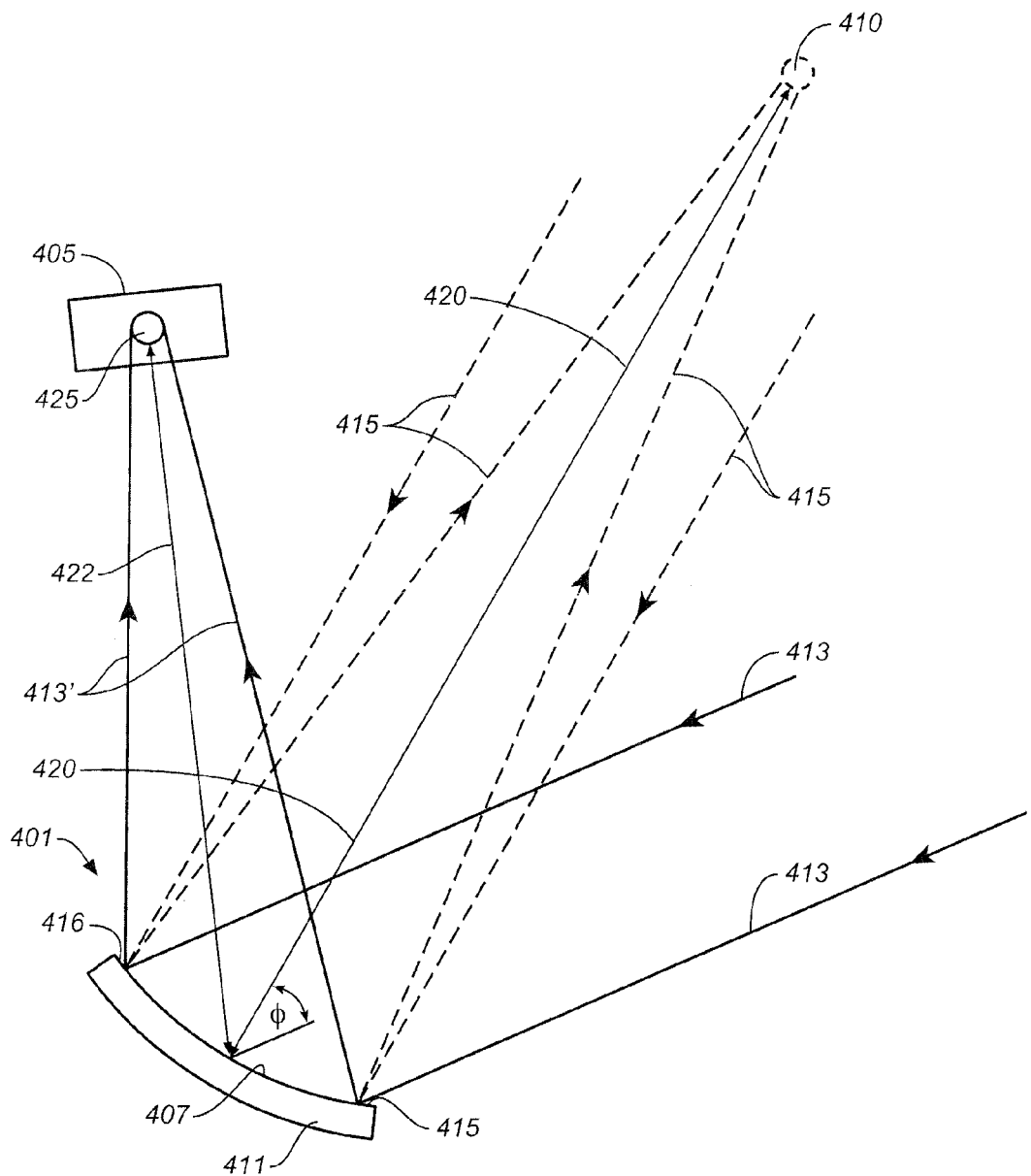
FIG. 4 illustrates another example of a reflector element having a reflective surface that focuses reflected solar radiation at a receiver.

As illustrated in FIGS. 3 and 4, suitable reflectors may have, for example, circular arc or parabolic cross-sections to focus the reflected radiation at a target distance. Typically, the focused image may be a line focus. Focal lengths of reflectors may be from about 10 meters to about 25 meters. For reflectors having circular arc cross-sections, these focal lengths correspond to radii of curvature of about 20 meters to about 50 meters, respectively. Some variations of reflectors may have focal lengths that are approximately equivalent to a distance from a reflective surface of the reflector to the receiver. Other variations of reflectors may have focal lengths that are longer than a distance from a reflective surface of the reflector to the receiver.

Referring now to FIG. 3, a solar array 301 includes a reflector 311 that is configured to direct incident solar radiation to an elevated receiver 305 that includes a solar radiation absorber (not shown). Reflector 311 may be part of a reflector field comprising parallel rows of reflectors directing incident light to receiver 305, where the rows of reflectors are driven to at least partially track diurnal motion of the sun. A reflective surface 307 of reflector 311 reflects light beam 313 that is incident at angle 6 so that reflected light beam 313' forms a focused image 325 at receiver 305 (e.g., at a solar radiation absorber in receiver 305). In some variations, reflector 311 may be configured to provide a line focus, e.g., reflector 311 may be a cylindrical mirror. For reference, dashed lines 318 illustrate the path of a light beam that is incident on reflective surface 307 at a normal angle and is reflected to form a focused image 310 at a distance 320 from reflective surface 307. Distance 320 corresponds to the focal length of reflector 311. However, for light beam 313 that is incident on reflective surface 307 at a non-normal angle δ, light rays 313' reflected from first and second reflector edges 315 and 316 may form their sharpest focused image 325 at a distance 322 that does not correspond to focal length 320, e.g., at a distance that is less than focal length 320. Thus, reflectors for light that is close to normal incidence may have a focal length that is approximately equal to a distance between the reflective surface and the receiver, and reflectors for light that is far from normal incidence may have focal lengths longer than a distance between their reflective surfaces and the receiver. Increased overall system collection efficiency may be achieved by using the latter reflectors to at least partially compensate for astigmatic effects due to non-normal incidence of light.

As the distance between a reflector and its corresponding receiver increases, the required focal length for the reflector may also increase. Accordingly, the size of the focused image at the receiver may also increase. If the focused image is larger than the receiver, or leaks past the receiver, then the collection efficiency of the receiver may be decreased. Reflectors that are positioned the farthest from the receiver are closest to the periphery of the array. Hence, the angle of incidence on a surface of the receiver increases for peripherally-positioned reflectors, which may lead to increased losses at the receiver, e.g., reflective losses and/or losses due to poor focusing of astigmatic reflections as discussed above.

Referring now to FIG. 4, a solar array 401 includes a reflector 411 that is configured to direct incident solar radiation 413 to a receiver 405 that includes a solar radiation absorber (not shown). Similar to reflector 311 in FIG. 3, reflector 411 may be part of a reflector field. Reflective surface 407 of reflector 411 reflects light beam 413 that is incident at angle φ so that reflected light beam 413' forms a focused image 425 at receiver 405 (e.g., at a solar radiation absorber in receiver 405). In some variations, reflector 411 may be configured to provide a line focus, e.g., reflector 411 may be a cylindrical mirror. For reference, dashed lines 415 illustrate the path of light beam that is incident on reflective surface 407 at a normal angle and is reflected to form a focused image 410 at a distance 420 from reflective surface 307. Distance 420 corresponds to the focal length of reflector 411. In this example, incident light beam 413 strikes reflective surface 407 at a relatively large non-normal angle $\phi$. Light rays 413' reflected from first and second reflector edges 415 and 416 may form their sharpest focused image 425 at a distance 422 is less than focal length 420. To compensate for this astigmatic effect, the focal length of a reflector may be chosen to be longer than the distance between the reflective surface of the reflector and the receiver, e.g., an absorber in the receiver. For example, reflectors having a focal length from about 1% to about 15% (e.g., about 1%, about 2%, about 5%, about 10%, or about 15%) longer than the distance between their reflective surface and the receiver may be used.

In some arrays, peripheral reflectors positioned relatively far from a receiver may have focal lengths longer than their distance from the receiver. Some variations of arrays may comprise a series of parallel reflector rows each directing incident light to an elevated receiver. The focal lengths of the reflectors in the respective reflector rows may follow a progression so that those reflectors farthest from a transverse center of the receiver are the longest. Such progressions may include monotonic increases in reflector focal length as a distance from the transverse receiver center increases, or any general trend or general correlation between increasing reflector focal length with increasing receiver-reflector distances. In some arrays, only the outermost reflector rows may comprise reflectors having focal lengths longer than their respective reflective surface-solar absorber distances. For example, for arrays having two reflector fields directed to a single absorber, only two or four of the most peripheral rows may have focal lengths longer than their respective reflective surface-solar absorber distances. Solar energy collector systems utilizing one or more reflectors having focal lengths longer than their distance to the receiver may have overall collection efficiencies, such as annualized light collection efficiencies, that are increased by about 1%, about 2%, about 3%, about 4%, about 5%, about 6%, or even more, e.g., about 10%.

Reflectors may have any suitable dimensions. Of course, reflectors may be unitary n nature, and comprise a single reflector element, or reflectors may comprise multiple reflector elements. Dimensions of reflectors and/or reflector elements may be selected based any combination of the following considerations: system collection efficiency, manufacturing requirements, manufacturing costs, availability of materials, cost of materials, ease of handling and/or transportation, field maintenance requirements, lifetime, and/or ease of installation. In some variations, reflectors may have lengths of about 10 meters to about 20 meters, and widths of about 1 meter to about 3 meters. The reflectors may have lengths of about 10 to about 20 meters, e.g., about 12 meters, about 14 meters, about 16 meters, or about 18 meters, and widths of about 1 meter to about 3 meters, e.g., about 1.3, about 1.4 meters, about 1.5 meters, about 1.6 meters, about 1.7 meters, about 1.8 meters, about 1.9 meters, about 2.0 meters, about 2.1 meters, about 2.2 meters, about 2.3 meters, about 2.4 meters, about 2.5 meters, about 2.6 meters, about 2.7 meters, about 2.8 meters, or about 2.9 meters. The reflectors may have lengths of about 16 meters and widths of about 2.2 meters. In some cases, focal lengths of reflectors or reflector elements may be indicated in a readily discernible manner, e.g., by color coding, to aid in assembly of solar arrays.

One or more reflector rows in a solar energy collector system may have an overall length of about 200 meters to about 600 meters, e.g., about 200 meters to about 400 meters, or about 400 meters to about 600 meters. In some systems, reflector rows may have the same or similar overall lengths. As illustrated in FIG. 2A, reflector rows may comprise groups of reflectors that are interconnected to form a row segment that may be driven collectively. Such a row segment may comprise, for example, 2 reflectors, 4 reflectors, 6 reflectors, or any suitable number of reflectors. A collectively-driven row segment may be driven by one or more motors. Reflector rows or row segments may be driven sequentially, e.g., one row segment rotated at a time, or reflector rows or row segments may be driven simultaneous, e.g., more than one row segment rotated at once in a bulk move. Drives and drive systems that may be used for rotating and positioning reflectors are described in more detail below.

The receiver or receivers in solar energy collector systems may be any suitable receiver described herein, known to one of ordinary skill in the art, or later developed. Suitable receivers may include, for example, those disclosed in International Patent Application No. PCT/AU2005/000208, which is hereby incorporated by reference in its entirety. Receivers may be, for example, photovoltaic receivers capable of absorbing incident solar radiation and converting the solar radiation to electricity, or thermal receivers capable of absorbing incident solar radiation to heat a working or heat exchange fluid in the receiver. For example, a heat exchange fluid such as water may be flowed through the receiver. As shown in FIG. 2A, receivers when installed may be elongated and have an overall or generally horizontal orientation, with a generally horizontally-oriented aperture that allows transmission of light to a solar radiation absorber in the receiver.

As indicated above, some variations of receivers may comprise multiple receiver structures. The receiver structures may be interconnected. Receiver structures may be arranged and/or interconnected in a longitudinal (i.e., lengthwise) and/or a transverse (i.e., widthwise) manner to form receivers. Receivers may have overall lengths, including receiver structures, that are similar to the overall length of the corresponding reflector rows, e.g., about 200 meters to about 600 meters (e.g., about 200 meters to about 400 meters, or about 400 meters to about 600 meters). Receiver structures may have lengths of, for example, about 8 meters to about 20 meters and overall widths of about 0.5 meters to about 3 meters, e.g., about 0.5 meters to about 1 meter, or about 1 meter to about 2 meters, or about 2 meters to about 3 meters. For example, in some variations a receiver structure may have a length of about 12 meters and an overall width of about 1.3 to about 1.4 meters. Suitable receivers may have one or more solar radiation absorbers, where the absorbers are tubes and/or flat plates, or groups of tubes and/or flat plates. One or more absorbers, including a group of tubes and/or flat plates making up an absorber, may have a width of about 0.3 meter to about 1 meter, or any other suitable width.

In solar energy collector systems including multiple receivers, receivers may be spaced apart by about 20 to about 35 meters, or by any suitable inter-receiver spacing. The receivers may be elevated above the reflectors with their absorbers positioned at a height of about 10 meters to about 20 meters above the reflectors, e.g., about 15 meters above the reflectors. In arrays with multiple receivers, the receivers may be positioned all at the same or similar heights above the reflectors, or at different heights above the reflectors.

Elevated receivers may be supported by any suitable method. For example, receivers may be supported by vertical support structures such as stanchions, as illustrated in FIG. 2A. The vertical support structures, in turn, may be supported or stabilized by cables or guy wires, e.g., guy wires that are anchored to the ground and/or to another anchoring structure. In some variations, two or more guy wires may be used to support a single vertical support structure, e.g., two guy wires that extend laterally from opposing sides of a vertical support structure as illustrated for guy wires 219 stabilizing support structures 218 in FIG. 2A.

Guy wires, if present, may extend generally laterally or longitudinally from a vertical support structure. For example, as discussed in more detail below, one or more ground-anchored guy wires may extend laterally from a vertical support structure. Alternatively, or in addition, one or more longitudinal guy wires may extend between adjacent ones of the vertical support structures. Any combination of lateral and/or longitudinal guy wires may be used to stabilize vertical support structures supporting a receiver. For example, at least some vertical support structures may not be stabilized by any lateral guy wires. In other variations, only alternate ones of vertical support structures may be stabilized by lateral guy wires. In still other variations, only every third or fourth or greater interval vertical support structure may be stabilized by lateral guy wires.

When a set of guy wires comprising two or more guy wires is used to stabilize a vertical support structure in a system, one guy wire in the set may be asymmetric relative to another guy wire in the set by having a different spring constant or resonance than the other guy wire. Resonances in guy wires may be excited by external environmental effects such as wind and/or seismic activity, as well as internal effects such as motor vibrations or reflector motions. By selecting a set of guy wires that includes guy wires with different natural resonances to stabilize a support structure, the solar energy collector system as a whole may be stabilized. If the resonance frequencies in guy wires do not match, an excited resonance in one wire may not amplify a resonance in another wire. In addition, if the resonance frequencies of guy wires used to stabilize a support structure are different, an excited resonance in one wire may not couple to and excite the same resonances in the system, again leading to improved system stability. Further, one guy wire in a set may be chosen to have a resonance that can couple with and damp a resonance in one or more different guy wires in the set.

Spring constants or resonances of a guy wire may be varied in any suitable manner, e.g., by changing the length, the material, the tension, and/or a diameter of the guy wire. For guy wires comprising more than one strand, a spring constant of the guy wire may be varied by varying the number of strands, the diameter, and/or the material composition of one or more strands. In addition, a pattern of weaving, braiding, and/or intermeshing of strands used to form the guy wire may be changed to adjust a spring constant of the wire.

Figure 5:
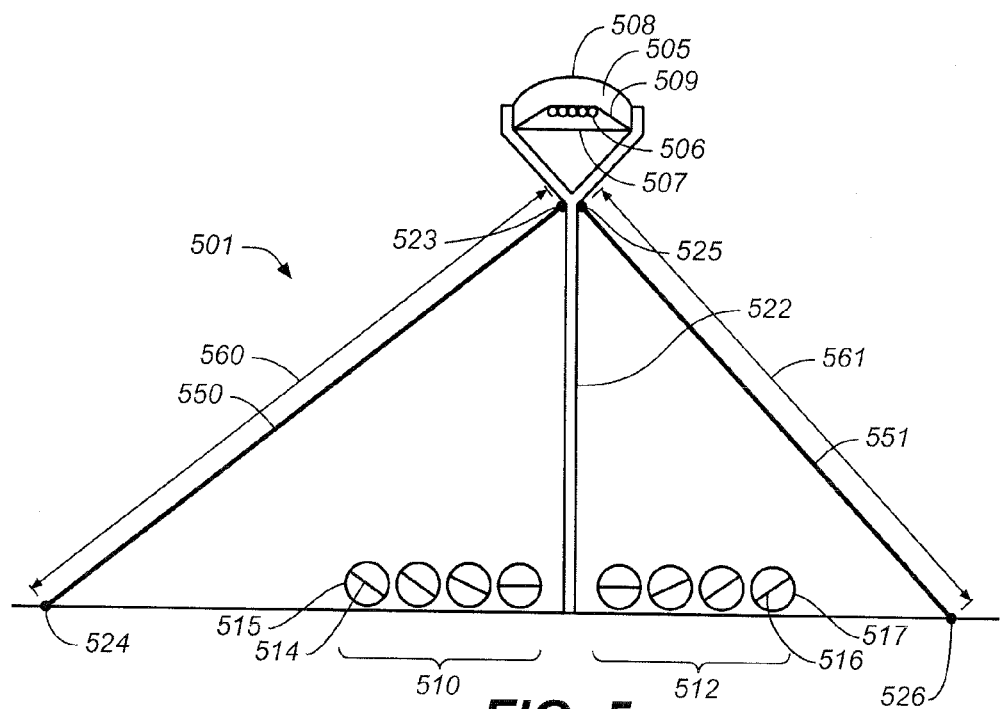
FIG. 5 provides an example of a solar energy collector system that includes asymmetric lateral guy wires.

For the array 501 illustrated in FIG. 5, a vertical support structure 522 holds elevated receiver 505 above, but horizontally between reflector fields 510 and 512. In this variation, receiver 505 includes absorber 506, window 507, receiver channel 509, and roof 508. Reflector field 510 includes reflectors 514 that are supported and positioned by carrier frames 515. Reflector field 512 includes reflectors 516 that are supported and positioned by carrier frames 517. Guy wires 550 and 551 stabilize vertical support structure 522, with guy wire 550 extending laterally, generally in the direction of reflector field 510, and guy wire 551 extending laterally, generally in the direction of reflector field 512. Guy wires 550 and 551 may be ground-anchored, or anchored to another anchoring structure. Guy wire 550 is coupled to vertical support structure 522 at a first coupling point 523, anchored at a first anchoring point 524, and has a first resonant frequency between the first coupling and anchoring points 523 and 524. Guy wire 551 is coupled to vertical support structure 522 at a second coupling point 525, anchored at a second anchoring point 526, has a second resonance frequency between second coupling and anchoring points 525 and 526. In this variation, guy wires 550 and 551 have different resonance frequency due to their different respective lengths, 560 and 561, between first coupling and anchoring points 523 and 524, and between second coupling and anchoring points 525 and 526. Thus, a resonance excited in guy wire 550, e.g., by wind or vibration, and transferred to vertical support structure 522 or another part of array 501 may not be excited or amplified by guy wire 551. Further, a resonance excited in one of guy wire 550 or 551 may couple to and damp a resonance excited in the other of guy wire 551 and 550. In some variations, the coupling mechanism of guy wires to a vertical support member (e.g., at coupling points 523 and 525) may be designed to reduce transfer of resonances excited in guy wires to other parts of the array. For example, the coupling points may include vibration damping materials or structures.

Figure 6:
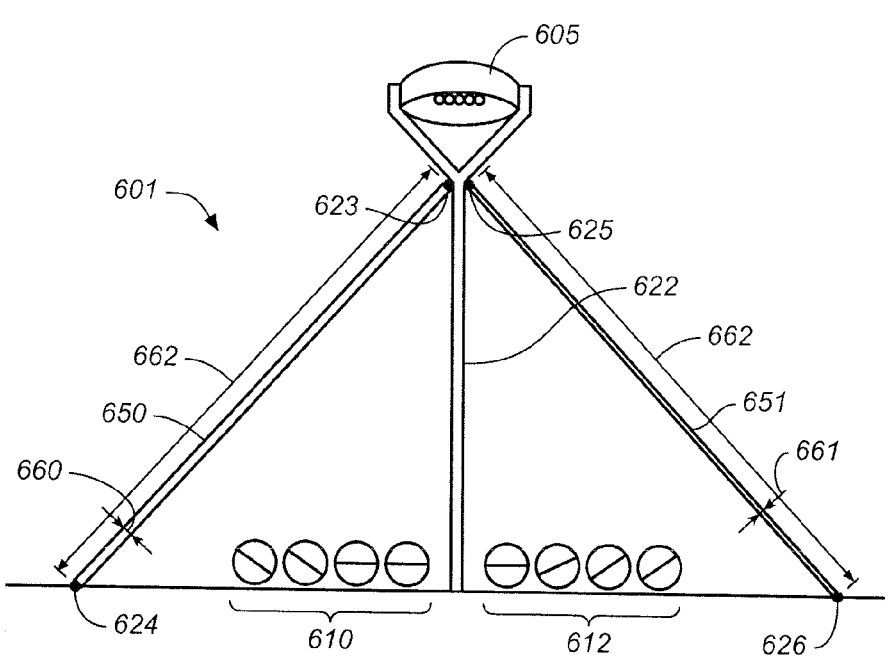
FIG. 6 shows another example of a solar energy collector system that includes asymmetric lateral guy wires.

As indicated above, the natural resonance frequencies of guy wires may be tuned using techniques other than or in addition to changing wire length. For example, as illustrated in FIG. 6, array 601 includes a vertical support structure 622 supporting an elevated receiver 605 above, but horizontally between, reflector fields 610 and 612. Guy wire 650 is coupled to vertical support structure 622 at first coupling point 623, anchored to the ground or an anchoring structure at first anchoring point 624, and has a first resonance frequency between first coupling and anchoring points 623 and 624. Guy wire 651 is coupled to vertical support structure 622 at second coupling point 625, anchored to the ground or to an anchoring structure at second anchoring point 626, and has a second resonance frequency between second coupling and anchoring points 625 and 626. In this variation, guy wires 650 and 651 have the same length 662, but still have different resonance frequencies due to their different respective widths, 660 and 661.

Asymmetric guy wires in a set of guy wires may have resonance frequencies that are different by any suitable amount to improve stability in a solar energy collector system. For example, one guy wire in a set may have a resonance frequency that is about 20%, about 30%, about 40%, about 50%, about 60%, about 70%, or about 80% different than another guy wire in the set. As used herein, when two guy wires are referred to as having different resonance frequencies, it is meant that two guy wires should not have the same fundamental resonance frequencies, and also should not be overtones or harmonics of each other.

Figure 7:
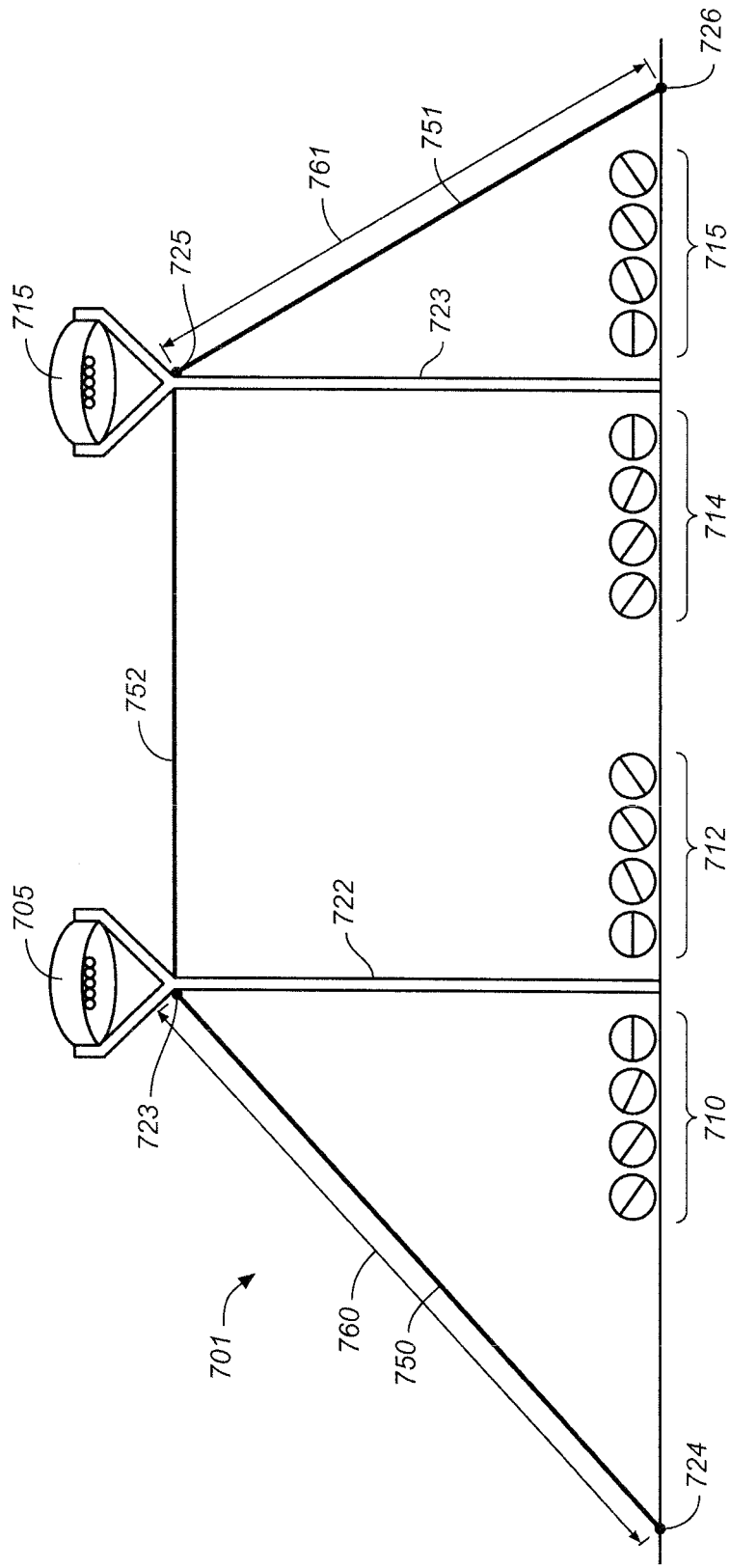
FIG. 7 illustrates another variation of a solar energy collector system with asymmetric lateral guy wires.

Guy wires may be selected and arranged in any suitable manner to support and stabilize a series of vertical support structures in a solar array. For example, as shown in FIGS. 5 and 6, a set of guy wires comprising two asymmetric guy wires may be used to support a single vertical support structure. In other variations, a set of guy wires comprising two asymmetric guy wires may be used to support more than one vertical support structure. For example, as illustrated in FIG. 7, array 701 includes vertical support structures 722 and 723. Vertical support structure 722 supports receiver 705 above and horizontally between reflector fields 710 and 712. Vertical support structure 723 supports receiver 715 above and horizontally between reflector field 714 and 716. A first guy wire 750 is attached to vertical support structure 722 at a first coupling point 723, extends laterally to one side of array 701, and is anchored to the ground or an anchoring structure at first anchoring point 724. First guy wire 750 has a first resonance frequency between first coupling and anchoring points 723 and 724. A second guy wire 751 is attached to vertical support structure 723 at a second coupling point 725, extends laterally from an opposing side of array 701, and is anchored to the ground or to an anchoring structure at a second anchoring point 726. The second guy wire has a second resonance frequency between second coupling and anchoring points 725 and 726. In this variation, guy wires 750 and 751 have different respective lengths 760 and 761, leading to different resonances that do not couple effectively to each other. In some cases, the resonances of one of the anchored wires may be chosen so that it couples to and damps a resonance in another wire.

As shown in FIG. 7, some variations of arrays may include an interconnection member between adjacent vertical support structures. Interconnection member 752 interconnects and stabilizes vertical support structures 722 and 723. Interconnection member may be a wire, a cable, a bar, or any suitable structure that can stabilize vertical support structures and also minimizes shading on reflectors below. In arrays such as that shown in FIG. 7, where an additional interconnection member couples together two vertical support structures, the anchored guy wires may be selected to have resonances that are different than the interconnection member, e.g., by choosing a different length, thickness, structure, or type of material.

Some vertical support structures, e.g., a vertical support structure at the end of a row of vertical support structures supporting an elongated receiver, may be stabilized by a set of guy wires that includes more than two guy wires, e.g., three or four guy wires. Sets of guy wires comprising three or more guy wires may comprise any combination of symmetric and asymmetric guy wires, as long as at least one of the guy wires in the set has a different resonance frequency than another of the guy wires in the set.

In addition to laterally-extending guy wires, an arrangement of longitudinal guy wires may be included in arrays to stabilize elevated receivers and/or other portions of the arrays. For example, an arrangement of longitudinal guy wires may assist in longitudinal system stabilization for seismic events or other motions that excite longitudinal modes in the system, whereas laterally-extending guy wires may provide stabilization against wind and/or seismic events that may primarily excite transverse modes in the system.

For some receivers such as thermal receivers, the absorption of solar radiation can cause a large increase in temperature for one or more receiver components. These large temperature fluctuations will cycle with the diurnal path of the sun. For elongated receivers, extensive anisotropic thermal expansion and contraction may occur. For example, some elongated thermal receivers comprise a plurality of solar absorber tubes (e.g., metal pipes carrying a heat exchange fluid such as water and steam). As the absorber tubes absorb radiation and increase in temperature, an anisotropic expansion occurs primarily along the length of the tubes. For elongated receivers having lengths of 200 meters or more, thermal expansion and contraction on the order of centimeters or tens of centimeters may occur. Arrangements of support structures and stabilizing elements (e.g., longitudinal guy wires) for elevated receivers that can accommodate repeated thermal expansion and contraction are desired. For example, as illustrated in FIG. 2A, elevated receivers may be supported by vertical support structures that allow the receiver to slide longitudinally relative to the support structure. Support structures and/or stabilizing elements that cannot adequately accommodate the cyclical thermal expansion and contraction may cause system damage and/or fatigue over time.

Examples of suitable arrangements for longitudinal guy wires that may be used to stabilize elevated receivers are shown in FIGS. 8 and 9. As illustrated in FIG. 8, solar energy collector system 801 comprises a plurality of vertical support structures 810. These vertical support structures are distributed along a length 803 of elevated receiver 805. Receiver 805 may be configured to be able to slide relative to structures 810. In between two adjacent ones of the plurality of vertical support structures 810 are longitudinal guy wires 830. The amount of thermal expansion and contraction of one or more longitudinal components of a receiver (e.g., an absorber comprising stainless steel or carbon steel pipes containing heat exchange fluid and/or a component in thermal contact with the absorber) increases as a distance from a longitudinal center 825 of receiver 805 increases. To reduce the amount of dimensional cycling due to thermal effects experienced by the longitudinal guy wires and structures to which they are attached, an arrangement of longitudinal guy wires in which the density of longitudinal guy wires generally decreases as a distance from a longitudinal center of receiver increases may be used. As used herein, a density that "generally decreases" is meant to encompass any decreasing trend of the number of longitudinal guy wires per unit length, and is not necessarily limited to monotonic decreases in longitudinal guy wire density.

The density of longitudinal guy wires may be decreased in any suitable manner. For example, as illustrated in FIG. 8, longitudinal guy wires may not be installed between every pair of adjacent vertical support structures. Alternatively, or in addition, for vertical support structures positioned near the longitudinal center of the receiver, two diagonally crossed longitudinal guy wires may be used between a pair of adjacent vertical support structures, and a single diagonal longitudinal guy wire may be used between a pair vertical support structures positioned further away from the longitudinal center of the receiver. Although vertical support structures 810 in FIG. 8 are depicted as generally equally spaced along the length 803 of the elevated receiver 805 for ease of illustration, any appropriate spacing of vertical support structures may be used. For example, the density of longitudinal guy wires may be decreased at least in part by generally increasing the spacing between adjacent vertical support structures as the distance from the longitudinal receiver center increases.

Referring now to FIG. 9, another example of an arrangement of longitudinal guy wires is shown that may be used to stabilize a solar energy collector system while accommodating thermal expansion and contraction of one or more components of a receiver. The array 901 depicted in FIG. 9 comprises an elevated receiver 905 supported by vertical support structures 910 that are distributed along a length 903 of receiver 905. Receiver 905 may be configured to be able to slide relative to structures 910. To one side of the longitudinal center 925 of receiver 905, the arrangement of longitudinal guy wires comprises a first set 914 of wires 930 extending diagonally between adjacent vertical support structures 910 in a first diagonal direction 913. A second set 915 of wires 932 extends in a second diagonal direction 916. The second diagonal direction may be related to the first diagonal direction. For example, if the first diagonal and second diagonal directions may be symmetrical relative to a vertical axis of symmetry. Arrays using any combination of the longitudinal wire arrangements depicted in FIGS. 8 and 9 may be used.

Variations of improved receivers for use in solar energy collector systems are described here. FIGS. 10A-10C illustrate various components that may be used in the make up of an elongated receiver. As shown in FIG. 10A, a receiver 1005 may comprise a skeletal frame 1007. Frame 1007 may comprise side rails 1009, transverse arched or peaked structural members 1011, and transverse bridging members 1013. Frame 1007 may also comprise one or more spine members 1015 extending longitudinally between structural members 1011. Receiver 1005 includes a solar radiation absorber 1010 that may comprise a plurality of generally parallel, lengthwise-oriented pipes or tubes 1014 for carrying a heat exchange fluid. The absorber 1010, or a portion of absorber 1010, may be supported by (e.g., suspended from) frame 1007.

In general, as shown in FIG. 10B, receivers may include a receiver channel for housing the absorber and providing a thermally insulating still air environment to increase efficiency of the receiver. Receiver 1005 in FIG. 10B comprises receiver channel 1019 that comprises first and second sidewalls 1016 and 1017. The first and second sidewalls extend along a length 1018 of the receiver channel. The sidewalls of the receiver channel may be flared or angled outwardly. Disposed between the first and second sidewalls is a longitudinal aperture 1020. The aperture may extend over the entire length of the receiver channel, or may extend over only a portion of the length of the receiver channel. The solar radiation absorber may be housed within or substantially within the longitudinal cavity of the receiver channel so that solar radiation incident upon the solar radiation absorber has been transmitted through the aperture. In some variations, a receiver channel may be in the form of trough with a concave surface facing the absorber, fabricated from thin metal sheeting, such as stainless steel sheet metal. A receiver channel may comprise multiple segments, or be unitary in nature. In addition, receiver channels may comprise elements or be attached to elements that can provide structural integrity or support. For example, receiver channels may comprise longitudinal side rails or transverse bridging members. Alternatively, or in addition, receiver channels may be attached to a frame comprising longitudinal side rails or transverse bridging members. For example, as shown in FIG. 10B, receiver channel 1019 may be attached to and supported by any subset or combination structural features of frame 1007, including side rails 1009, structural members 1011, spine member 1015, and transverse bridging members 1013. As shown in FIG. 10C, a roof 1021 may be disposed over frame 1007. The roof may be unitary in nature, or may comprise multiple sections, as in FIG. 10C. The roof may be designed to shield the internal portions of the receiver from environmental effects, and/or to impart stability (e.g., strength and/or rigidity such as longitudinal stability) to the elongated receiver. In addition, the roof may have a smooth outer surface to provide a low wind profile and to provide improved ability to shed environmental debris.

In some variations of receivers, a window may be disposed in the aperture. The window may be substantially transparent to a broad portion of the solar radiation spectrum, e.g., the portion of the solar radiation spectrum that passes through the atmosphere. The window may be positioned over a portion of the aperture, or may substantially cover the aperture. Windows may be planar or curved. For example, windows may be curved with a concave surface facing the solar radiation absorber. As illustrated in FIG. 10A, window 1027 comprises multiple window sections 1028. Windows may be fabricated from any suitable material that exhibits high transmission over a broad range of the solar spectrum, and that exhibits sufficient physical and mechanical properties to withstand harsh environmental effects. For example, glass or plastic that can withstand years of exposure to UV radiation and/or high winds of up to 100 mph may be selected. If glass is used, it may have a minimum thickness of about 3 mm to about 4 mm, for example. Some variations of receiver windows may be made from glass having relatively low iron content.

As indicated above, the receiver channel (and the window disposed over the aperture, if present) forms a longitudinal cavity that houses the solar radiation absorber and may increase the collection efficiency of the absorber. The receiver channel may function to retain heat in the cavity and to increase energy conversion efficiency, e.g., by reflecting stray solar radiation back to the absorber, providing a still air environment around the absorber to reduce convective losses, and/or have a construction that reduces or eliminates thermal shorts that conduct heat away from the absorber. For a solar radiation absorber to be positioned substantially within the receiver channel, it is meant that a substantial part of the absorbing portion of the absorber is positioned inside the receiver channel, but that portions of the absorber may extend outside the receiver channel, e.g., pipe extensions, pipe fittings, pipe couplings, header manifolds, and/or valves may be positioned outside the receiver channel.

Some variations of receivers may include one or more window support members that are configured to allow installation of a window in a direction that is transverse to the length of the receiver channel. The one or more window support members may also function to support a window once it has been installed into a receiver. Because of the length of the elongated receivers used in some solar collector systems such as LFR solar arrays, transverse installation of windows may be easier than longitudinal installation. Windows may be easier to handle in a transverse direction, leading to reduced risk of window breakage and reduced space requirements for the installation. In addition, transverse installation of windows into receivers may facilitate assembly of those receivers at or near ground level, rather than after they have been elevated above reflector fields.

Window support members that allow transverse installation of a window into a receiver may be disposed along one or both of the first and second longitudinal sidewalls of the receiver channels in the receivers. Window support members may be continuous, e.g., a continuous slot designed to be slidably engaged with an edge of a window, or a continuous ledge designed to support a window. Alternatively, a window support member may be discontinuous, e.g., a series of periodic structures spaced along the length of the receiver channel. For example, a window support member may comprise a series of slot sections designed to be slidably engaged with an edge of a window, or a series of ledge sections.

Referring now to FIGS. 11A-11E, an example of a receiver that is configured to allow transverse installation of a window is shown. There, receiver 1105 comprises a longitudinal receiver channel 1119 that has a first sidewall 1106 and a second sidewall 1107. In some variations, sidewalls 1106 and 1107 may be flared out from a receiver channel back wall 1108 so that receiver channel 1119 has a trough-like shape. An aperture 1109 is disposed between the sidewalls. In this example, aperture 1109 extends along the length 1118 of receiver channel 1119. However, as stated above, in some variations of receivers, the aperture may extend only over a portion of the length of a receiver channel. Absorber 1110 that comprises a plurality of parallel absorber tubes is suspended from a transverse bridging member 1113 of frame 1133, and positioned between the two sidewalls 1106 and 1107 and opposed to aperture 1109 so that light incident upon absorber 1110 has been transmitted through the aperture 1109. A roof 1131 may be supported by a frame 1133 and positioned over channel 1119 to form a volume 1132 between the channel 1119 and the roof 1131. Vertical support structure 1147, which may comprise a shelf 1146 and cross-bars 1145, supports receiver 1105.

Figure 11A:
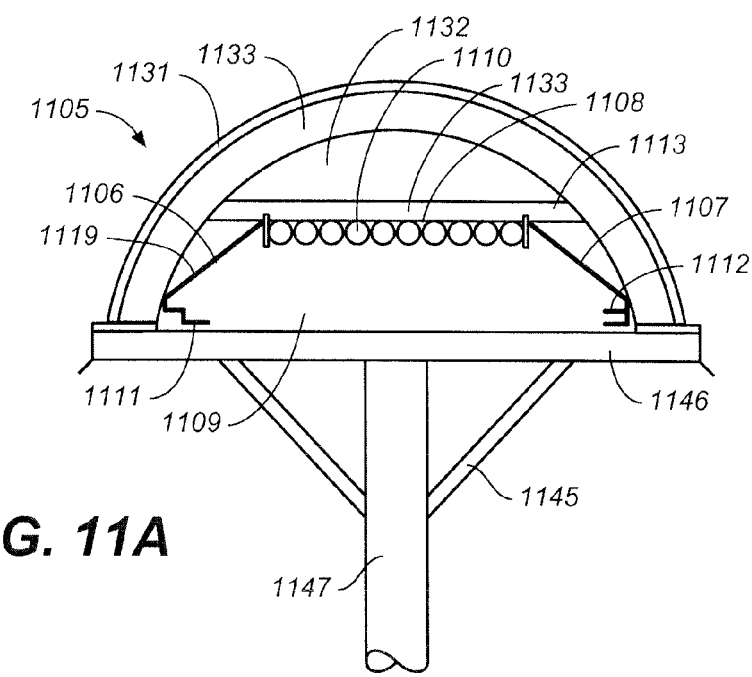
FIGS. 11A-11E illustrate an example of a receiver that is configured to allow transverse window insertion.
Figure 11B:
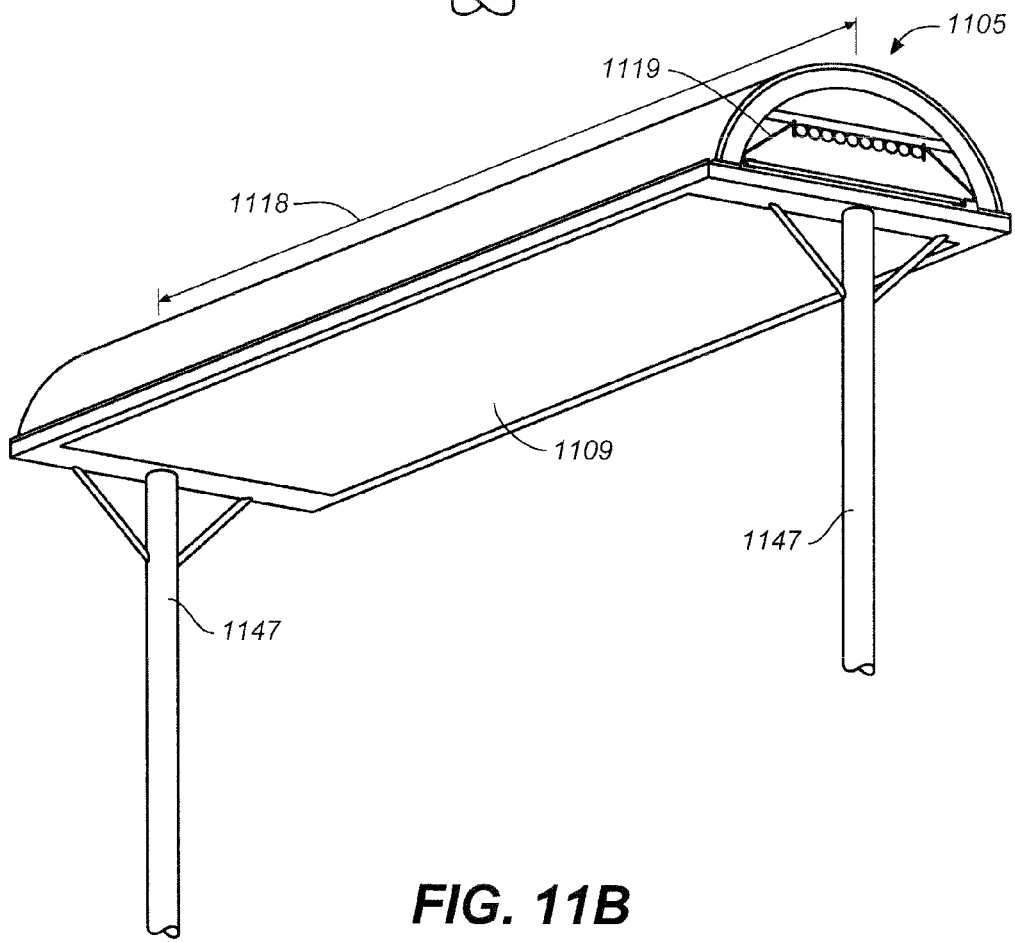
Figure 11C:
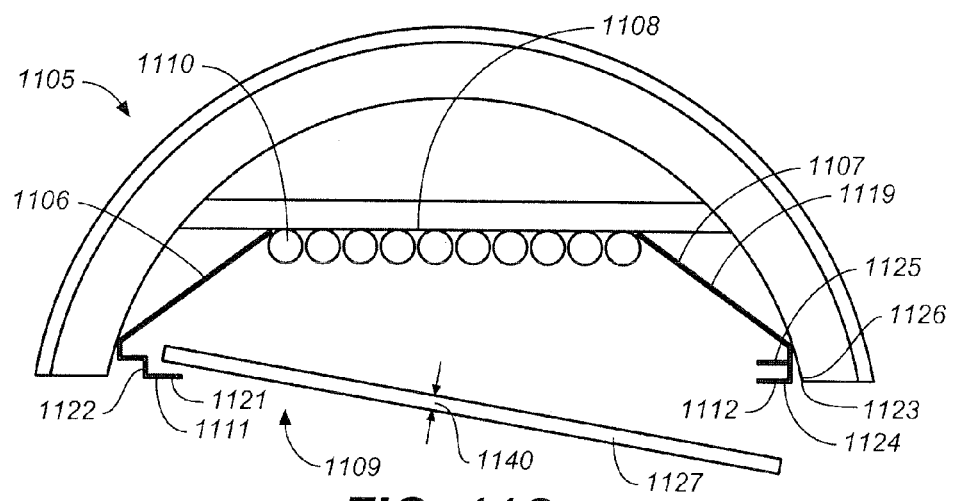
Figure 11D:
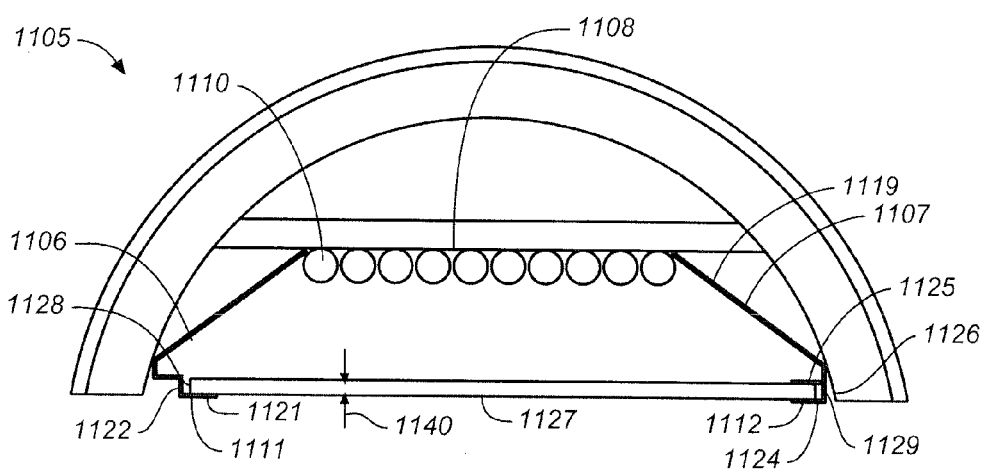
Figure 11E:
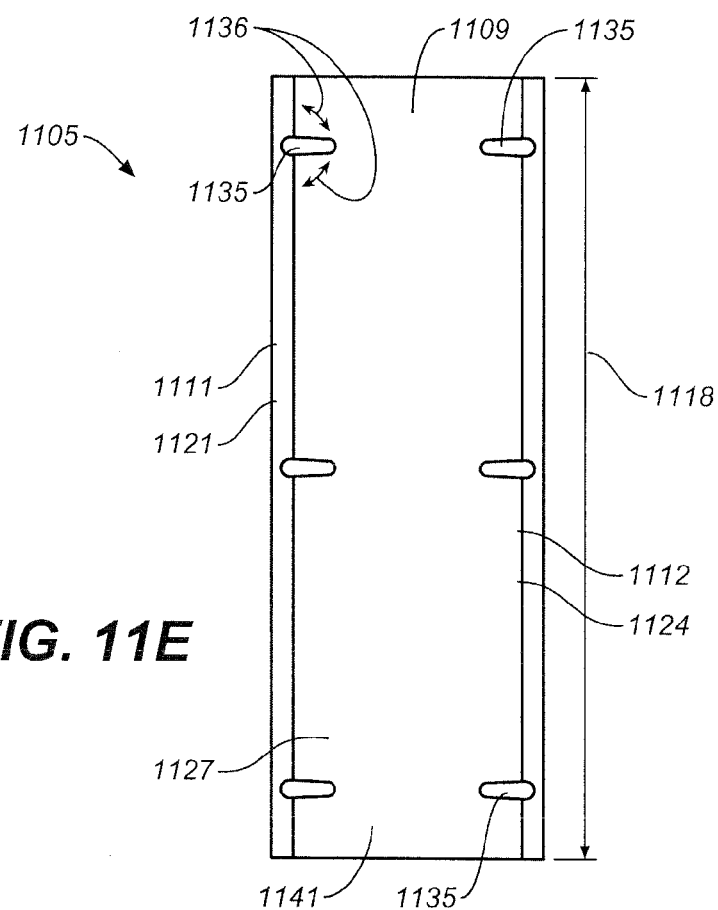

Some variations of receivers may include two window support members that allow transverse installation of a window into a receiver and subsequent support of that window in the receiver once it has been installed. Referring again to FIGS. 11A-11E, a first window support member 1111 may be disposed along the first sidewall 1106. A second window support member 1112 may be disposed along the second sidewall 1107. Referring now to FIGS. 11C-11D, the first window support member 1111 may comprises a ledge 1121 and a step 1122, and the second window support member 1112 may comprise a slot 1123 that has a lower slot surface 1124, an upper slot surface 1125 and a slot sidewall 1126. Slot 1123 may be slidably engaged with an edge of a window 1127, so that a space between upper slot surface 1125 and lower slot surface 1124 is at least thick enough to accommodate a thickness 1140 of the window 1127.

As shown in FIG. 11C, window 1127 may be inserted transversely into receiver 1105 by tilting window 1127 between window support members 1111 and 1112. Window 1127 may then be inserted into slot 1123 and placed upon ledge 1121 so that window 1127 is supported by ledge 1121 and lower slot surface 1124. The outer longitudinal edges 1128 and 1129 of window 1127 may be positioned between step 1122 and slot sidewall 1126, respectively. Slot 1123, ledge 1121, and step 1122 may be configured in any suitable manner to allow transverse installation of the window and subsequent support of the window. For example, the space between upper and lower slot surfaces 1125 and 1124, respectively, may be larger than window thickness 1140, so that window 1127 may be tilted slightly and still be at least partially inserted between surfaces 1124 and 1125. Alternatively, or in addition, upper slot surface 1125 may extend less far from a sidewall of the receiver channel than lower slot surface 1124. In some variations, the height of step 1122 may be less than the height of upper slot surface 1125 to reduce the amount of tilt of window 1127 required to fit the window in its installed position between step 1122 and slot sidewall 1126.

In some variations, tabs (e.g., spring tabs) may be used to secure windows to receivers. Any suitable tabs may be used, and tabs may be distributed along the length of the receiver channel as necessary to secure the window in the receiver. Referring now to the bottom plan view of the receiver in FIG. 11E, tabs 1135 may be used to secure the window 1127 to the receiver 1105. Tabs 1135 may be designed to contact a bottom surface 1141 of window 1127 to support the window from the bottom after the receiver is installed. Alternatively, or in addition, tabs 1135 may be designed to contact a top surface of window 1127, to provide downward force on the window to hold it against window support members 1111 and 1112. Tabs may be positioned along one or both longitudinal sidewalls of the receiver channel. As indicated by arrows 1136, tabs 1135 may be rotated away from aperture 1109 for window installation, but rotated to extend slightly over aperture 1109 to secure the window 1127 to the receiver.

Figure 12A:
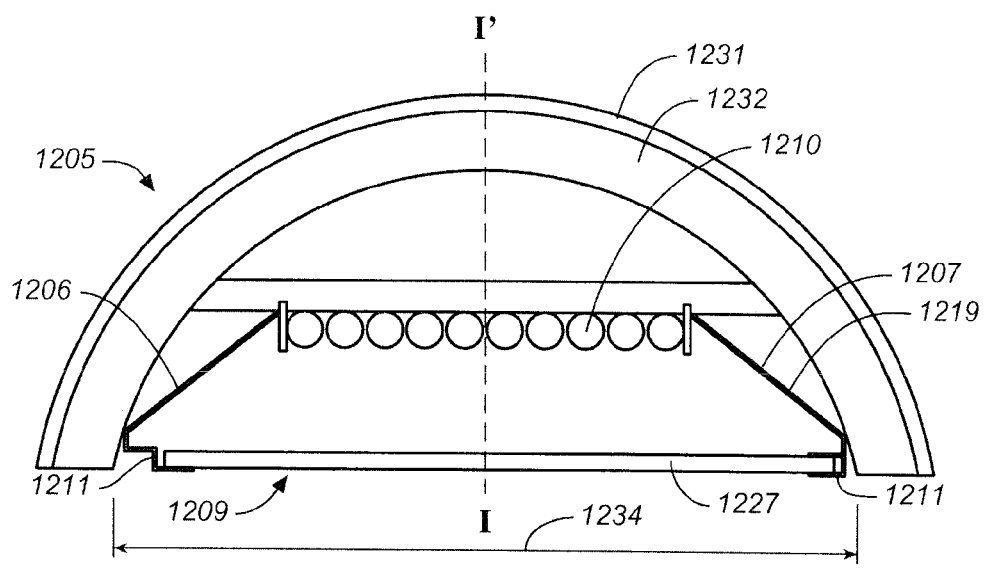
FIGS. 12A-12C illustrate variations of receivers including windows with overlapping window sections.
Figure 12B:
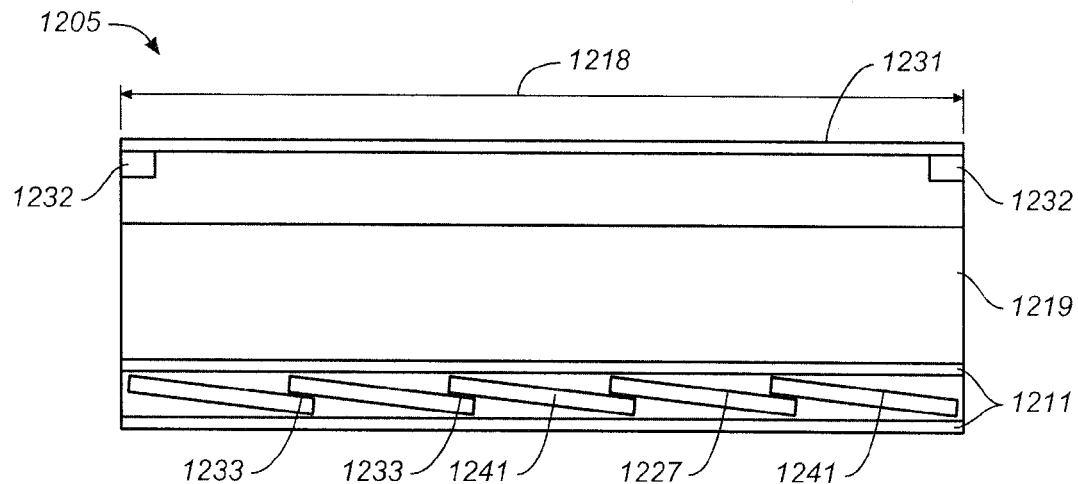
Figure 12C:
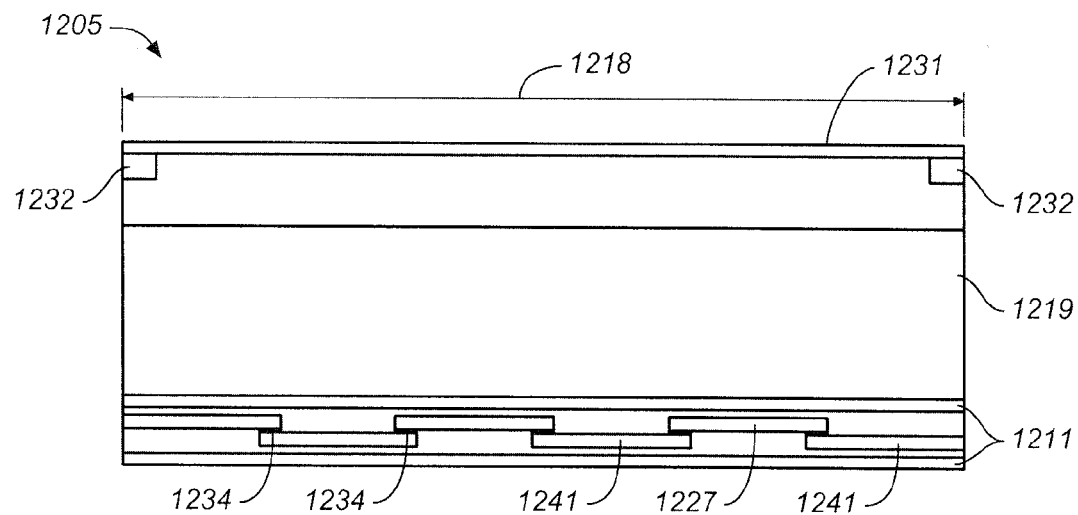

Other variations of receivers are illustrated in FIGS. 12A-12C. These receivers include a window that comprises two or more overlapping window sections that are distributed along the length of the aperture over which the window is disposed. Thus, as shown in FIG. 12A, receiver 1205 includes a receiver channel 1219 that houses absorber 1210. Receiver 1205 may also include a roof 1231 supported by frame 1232, and positioned over receiver channel 1219. Receiver channel 1219 comprises first and second sidewalls 1206 and 1207, respectively. Aperture 1209 extends between the first and second sidewalls. As shown in FIGS. 12B-12C, window 1227 may include overlapping window sections 1241 that are distributed along a length 1218 of aperture 1209. Thus, overlap regions 1234 extend along a transverse width 1234 of receiver channel 1219. Windows may be supported and/or secured by window support members 1211, which may be similar to those window support members illustrated in FIGS. 11A-11E. Any scheme can be used to overlap the window sections to form a window. One scheme of overlapping window sections is illustrated in FIG. 12B. Another scheme is illustrated in FIG. 12C. Combinations of window section overlap schemes may be used in a single window, or in a single receiver.

Windows may include any suitable number of window sections. For example, a rectangular window having dimensions of approximately 1 meter by approximately 10 meters may comprise 5 window sections, each having dimensions of approximately 1 meter by approximately 2 meters. Although window 1227 is depicted in FIGS. 12B and 12C as comprising approximately equivalent window sections, window sections in the same window may be the same or different. Window sections may overlap by any suitable amount, e.g., about 0.5 inch, about 1 inch, or about 2 inches.

Utilizing a window in a receiver that comprises overlapping window sections may present certain advantages over the use of windows comprising non-overlapping window sections. A joint between window sections that comprises an overlapped regions may not require additional sealing of that joint to prevent leakage in or out through that junction. Also, the friction between overlapping window sections may prevent the migration or "walking" of window sections relative to each other, or to the receiver channel. Such migration of window sections may be caused by vibration within a solar energy collector system and/or by thermal expansion and contraction of one or more receiver components. In addition, overlapping window sections may be able to accommodate expansion and contraction due to thermal cycling of the glass and/or other components in the receiver.

Solar energy collector systems including such receivers with a window comprising overlapping window sections are also provided. Receivers such as those illustrated in FIGS. 12A-12C may be used in combination with first and second reflector fields, as illustrated in FIGS. 1A-1C. The first and second reflector fields may comprise reflectors that each comprise a reflective surface configured to direct incident solar radiation to be at least partially incident on the solar radiation absorber in the receiver. The reflectors may be driven to at least partially track diurnal motion of the sun.

Figure 13:
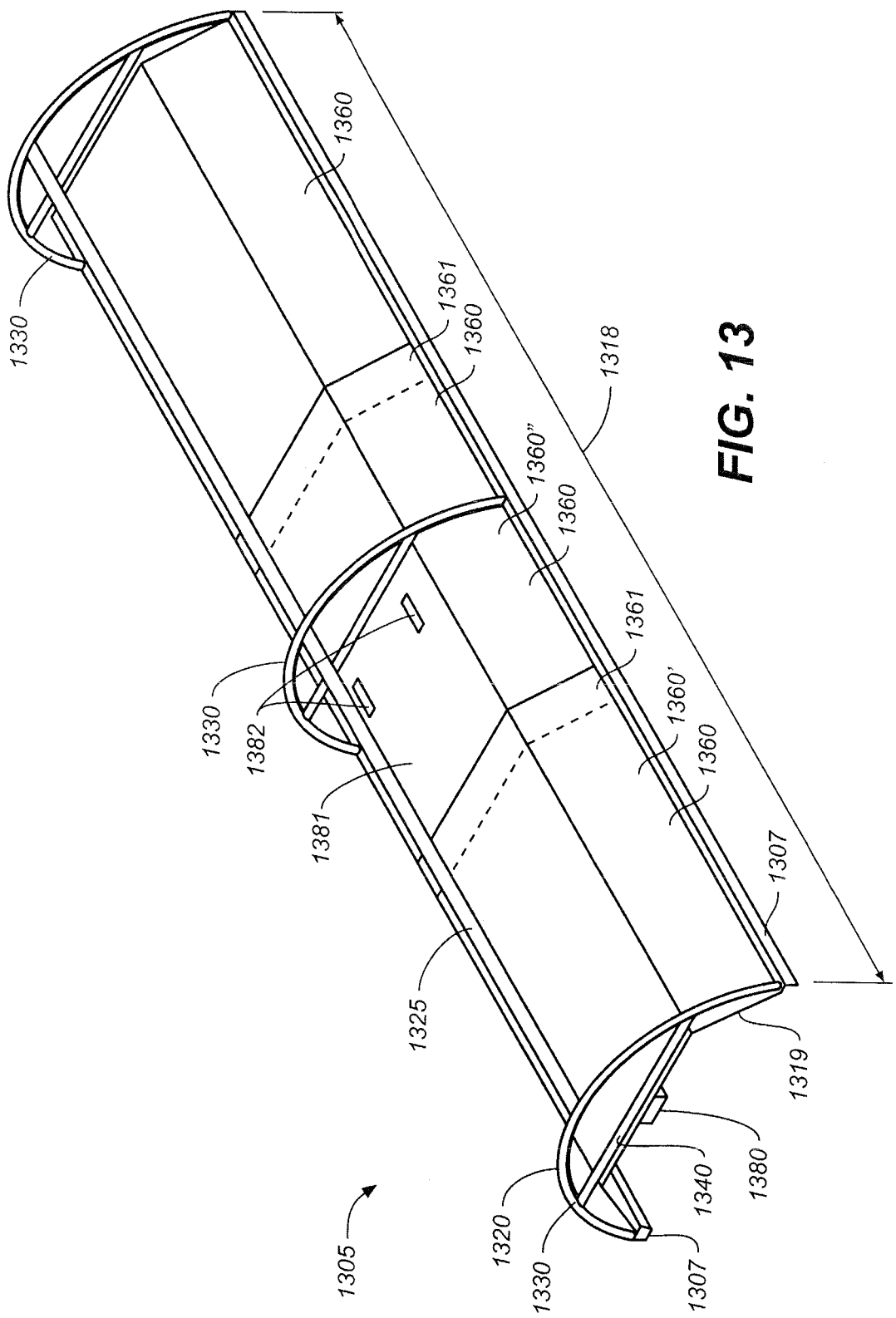
FIG. 13 shows a variation of a receiver that is configured to accommodate longitudinal thermal expansion and contraction.

Some variations of receivers may include other features that accommodate longitudinal thermal expansion. For example, receiver channels may comprise multiple sections that may slide or longitudinally translate relative to each other. Thus, as illustrated in FIG. 13, receiver 1305 includes receiver channel 1319. Receiver channel 1319 may comprise multiple receiver channel sections 1360 that are distributed along a length 1318 of receiver channel 1319. The receiver channel sections may translate longitudinally with respect to each other to accommodate longitudinal thermal expansion and expansion due to cyclical heating and cooling of one or more receiver elements, e.g., the absorber. The receiver channel sections may be designed to accommodate longitudinal thermal expansion in any suitable manner. For example, as illustrated in FIG. 13, the sections 1360 may comprise overlap regions 1361 and be slidably coupled with each other.

One or more receiver channel sections in a receiver may be supported by a frame. For example, as illustrated in FIG. 13, receiver channels sections 1360 may be supported by a frame 1320 that may, for example, comprise side rails 1307, arched or peak structural members 1330, transverse bridging members 1340, and/or spine member 1325. One or more receiver channel sections 1360 may be supported by frame 1320, e.g., by attaching to any subset or combination of side rails 1307, structural members 1330, transverse bridging members 1340 and spine member 1325. In some variations, one or more receiver channel sections may be suspended from a frame in a manner that accommodates longitudinal expansion and contraction. In these variations, receiver channel sections may be suspended from a frame in any suitable manner. For example, receiver channel section 1360' may be slidably attached a central bracket 1380 that is attached to frame 1320. Also illustrated in FIG. 13 is receiver channel 1360" that may be attached by attachment elements 1382 to frame 1320 near a central region 1381 of receiver channel section 1360" to allow longitudinal expansion and contraction. Attachment elements 1382 may have any configuration or design, but in some variations, they may comprise a bolt or pin inserted through a slot that is oriented generally parallel to the length of the receiver channel. The bolt or pin may operate to secure the receiver channel, while the slot allows the receiver channel to translate longitudinally. Receivers such as those illustrated in FIG. 13 may include one or more windows that can accommodate longitudinal thermal expansion, such as those illustrated in FIGS. 12A-12C.

Some variations of receiver channels may comprise one or more expandable elements (not shown) placed between adjacent receiver channel sections. Non-limiting examples of suitable expandable elements include elements with one or more folds that can be at least partially unfolded in the longitudinal direction, such as an accordion-shaped element, a fibrous element, a woven element such as a metal screen or mesh, a spring element, and/or an elastomeric element. Expandable elements, if present between sections of a receiver channel, may be lined with a reflective surface (e.g., a metal coating or a metal foil) to reduce thermal losses and/or to improve the reflection of stray light back to one or more solar absorbers present in the receiver channel.

Some variations of receivers may comprise multiple receiver sections that are coupled together with expansion joints. Referring back to FIG. 2A, an expansion joint (not shown) may be placed between two adjacent receiver sections 205a of receiver 205. In these variations of receivers, expansion joints may be placed between some, or all, receiver sections. For example, in some variations, groups of three receiver sections each having a length of about 10 meters may be directly coupled together, and an expansion joint may be inserted between the groups of three receiver sections. The expansion joints may allow longitudinal thermal expansion and contraction without stressing the receivers, components of the receivers, and/or support structures for the receivers. One or more expansion joints distributed over an elongated receiver having a total length of about 200 meters to about 400 meters may collectively be able to accommodate at least 3 cm of expansion and contraction, e.g., 5 cm, about 10 cm, about 15 cm, or about 20 cm. Non-limiting examples of suitable expansion joints include bellows-like or accordion-like folded elements (e.g., folded metal elements), foldable mesh elements (e.g., metal mesh elements), and foams.

Additional receiver designs are provided that may reduce the amount of buildup on a receiver window from external environmental contaminants. The reduced buildup on the windows may lead to receivers that have improved collection efficiencies, longer field lifetimes and/or reduced maintenance requirements. Referring now to FIGS. 14A-14B, a receiver 1405 comprises a receiver channel 1419 that, in turn, comprises two longitudinal sidewalls 1406 and 1407, and a longitudinal aperture 1409 disposed between the longitudinal sidewalls 1406 and 1407. The sidewalls and the aperture each extend along a length of the receiver channel. The aperture may extend along the entire length of the channel, or along a portion of the length of the channel. A solar radiation absorber 1410 is positioned in the channel 1419. A roof 1431 may be positioned over receiver channel 1419 and supported by frame 1425 so that a volume 1446 is formed between receiver channel 1419 and roof 1431. A window 1427 may be disposed in the aperture 1409 so that the window and the receiver channel together form a longitudinal cavity 1445 that houses the solar radiation absorber 1410. Volume 1446 is in fluid communication with cavity 1445. Solar radiation incident upon the absorber 1410 is transmitted through the aperture 1409, and the window 1427, if present.

A junction may be formed between a window and a receiver channel. The junction may be present along one or both longitudinal sides of the receiver channel. For the example shown in FIGS. 14A-14C, junction 1439 is present along one longitudinal side of channel 1419 and junction 1440 is present along the opposing longitudinal side of channel 1419. Junction 1439 is formed when window 1427 rests on ledge 1421 of window support member 1411, and junction 1440 is formed when window 1427 rests on lower surface 1424 of window support member 1412. Window support members 1411 and 1412 may, for example, be similar to those illustrated in FIGS. 11A-11E. Since the cavity housing the solar radiation absorber is at or near ambient pressures, air from the outside environment may leak through one or more junctions between the window and the receiver channel into the cavity, for example, because of convective currents that are generated from the heat generated within the cavity. Air from the environment may carry with it environmental contaminants such as dust and moisture. These contaminants may preferentially coat on the inner window surface, especially if the window is relatively cool compared to the rest of the cavity. Solar radiation transmitted through the window may cause such deposits to be baked on the inner window surface, which may lead to a substantial degradation of the optical quality of the window over time. Thus, it may be desired to inhibit the ingress of air into a cavity housing a solar radiation absorber through a junction between the window and the receiver. As illustrated in FIGS. 14A-14F, this may be accomplished in some instances by configuring a receiver so that a rate of air flow into cavity 1419 through junction 1439 and/or junction 1440 may be slower than a rate of air flow into cavity 1445 through volume 1446.

Some variations of receivers may comprise a thermally insulating material 1447 disposed in all or a portion of volume 1446. In these receivers, air traveling through volume 1446 to reach cavity 1445 may contain air contaminants such as dirt and moisture. These contaminants may be at least partially filtered out by the insulating material 1447 before that air contacts the inner surface 1451 of window 1427. Any suitable insulating material may be disposed in the volume between a roof of the receiver and the receiver channel that permits airflow through the insulating material. For example, fiberglass, glass wool, and/or an open cell foam may be used. Optionally, the insulating material may be at least partially clad with a reflective metal layer to inhibit heat conduction and heat radiation out of the cavity 1445. If used, an air-permeable reflective metal layer may be selected, e.g., a perforated metal foil or a metal mesh.

The passage of air into the cavity housing the absorber through a junction between a receiver channel and a window may be inhibited relative to the passage of air into the cavity through the volume above the receiver channel using any suitable scheme. For example, in some variations, a sealing member may be positioned in a junction between a window and a receiver channel. FIG. 14B shows an expanded view of junction 1439 between window 1427 and receiver channel 1419. In the example shown there, a sealing member 1453 is positioned between window 1427 and ledge 1421 of window support member 1411. An analogous sealing member (not shown) may be positioned between slot surface 1424 and window 1427. Such sealing members may be any suitable sealing members. For example, sealing members may be selected that maintain their sealing function while still allowing the window to move longitudinally (e.g., slide) relative to the receiver channel to accommodate differential thermal expansion and contraction between the window and the receiver channel. One example of such a sealing member that may be used is a fiberglass rope that is laid longitudinally along ledge 1421 or slot surface 1424. The rope may have any suitable diameter, e.g., about 10 mm, or about 15 mm, or about 20 mm. The window may slide longitudinally with respect to the receiver channel as the fiberglass rope may slide relative to the window surface and or receiver surface against which it is pressed. In other variations, a low-outgassing elastomer may be used as a sealing member. The elastomer may stretch to allow the window to move longitudinally relative to the receiver channel while still maintaining a seal between the window and the receiver channel. Elastomers having low out-gassing properties may be used to reduce the probability that contaminants from the elastomer will be deposited on a window surface as the elastomer is heated. In some variations of receivers, spring tabs may be used to force the window against the sealing member.

Alternatively, or in addition to using a sealing member in a junction between a window and a receiver channel, a positive pressure of filtered or otherwise purified air may be supplied into the cavity to inhibit the ingress of external air into the cavity. For example, dry nitrogen, or purified air that has been passed over a desiccant and/or through a filter (e.g., a particle filter) may be flowed into the cavity to inhibit ingress of external air into the cavity. As illustrated in FIG. 14C, such air flow may be provided near the inner surface 1451 through inlet 1482, e.g., to provide clean air flow, which may be laminar flow, near the inner surface 1451.

In some variations of arrays, filtered air may be directed into a receiver through a supporting structure. Referring now to FIG. 14F, receiver 1455 is supported by structure 1465. Support structure 1465 may comprise at least one tubular region that is capable of piping filtered air to receiver 1455. For example, the interior of a hollow leg 1466 may be used to channel air from the ground to elevated receiver 1455. In these examples, a blower on the ground (not shown) may be configured to force air through hollow leg 1466, through filter 1468, and into receiver 1455 via flexible connection 1469.

In other variations of receivers, an air path through the insulating material may be facilitated to cause air flow to preferentially enter the cavity through the insulating material rather than through the junction between the window and the receiver channel. For example, a rate of air flow through the insulating material may be greater than a rate of air flow through the junction between the window and the receiver channel. The rate of air flow through the insulating material may be increased in any suitable manner. For example, as illustrated in FIG. 14A, vents 1483 may be provided in roof 1431 or in a region of an end cap (not shown) that is configured to cover the transverse end of volume 1446. Vents 1483 in roof 1431 may be covered vents, and/or positioned to the sides of roof 1431 to reduce the amount of moisture and dust that may enter through the vents.

Figure 14D:
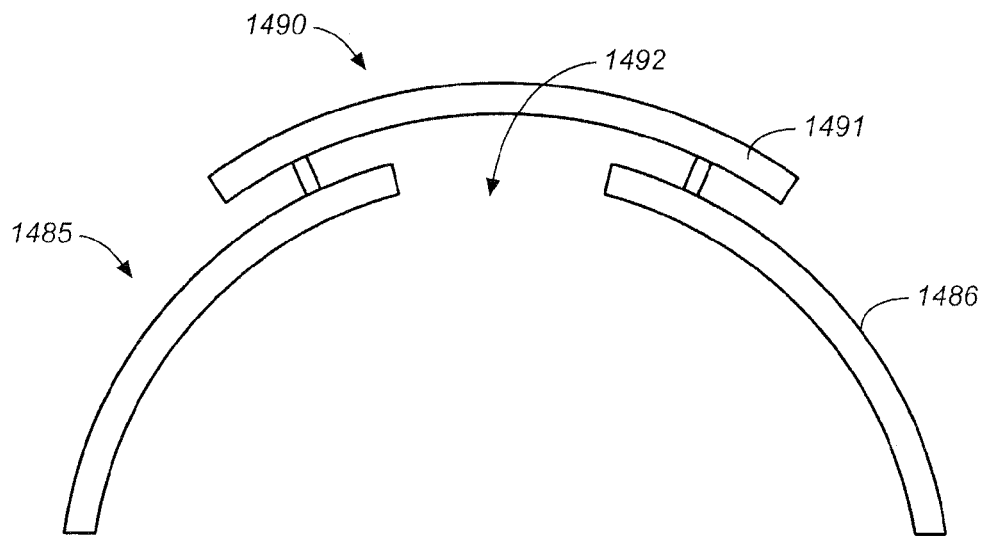
Figure 14E:
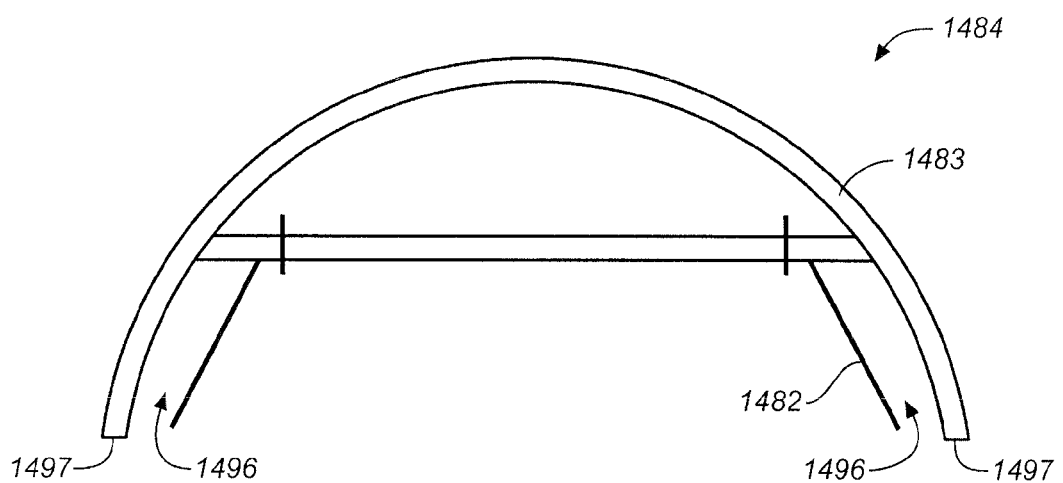
Figure 14F:
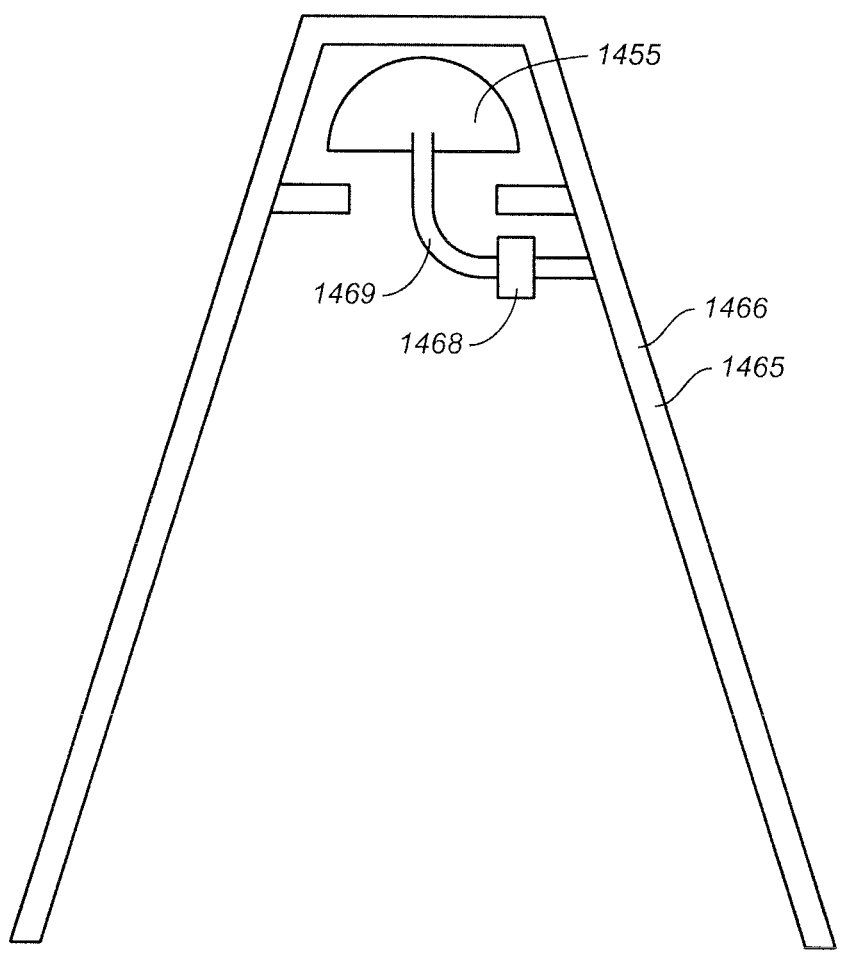

Non-limiting variations of various vent configurations are illustrated in FIGS. 14D-14E. In the example shown in FIG. 14D, roof 1486 of receiver 1485 comprises a vent structure 1490 that comprises a single opening 1492 with a cover 1491. The cover 1491 is positioned over and vertically spaced above the opening 1492 to allow airflow through the opening while reducing the ingress of environmental contaminants. In these variations, the opening 1492 may, for example, be located near the peak of roof 1431' to increase air flow through the vent structure 1490. Referring now to the example shown in FIG. 14E, receiver 1484 comprises an air passage 1496 that provides air flow under a roof edge 1497, e.g., between roof 1483 and receiver channel 1482. Air passage 1496 may extend continuously along the length of the receiver, or may comprise multiple air passages distributed along the length of the receiver under the roof edge 1497. Air passages 1496 may be present along one or both roof edges 1497.

Additional variations of receivers are provided here. These receivers comprise a roof extending along a length of the receiver channel. Some roofs may have corrugations extending longitudinally along a length of the roof, e.g., roofs formed from corrugated metal sheets. Another variation of a roof may have a transverse cross-section that forms a smooth outer surface with a concave surface facing the channel and a solar radiation absorber housed in the channel. The transverse cross-section of the roof may have profile that generally follows a parabola, an arc of a circle or an ellipse, or may have a peaked profile, or any other smooth surface that is generally without horizontal surfaces or crevices or other features that may trap or retain environmental debris. A roof having a smooth outer surface may also have a reduced wind profile. The structure of the roof, including its cross-sectional profile, may be selected to impart increased strength and/or rigidity (e.g., longitudinal stability) to the receiver. For example, a roof having a parabolic profile or a profile following an arc of a circle or an ellipse may impart longitudinal rigidity to an elongated receiver to reduce bending and/or torsion. The roof is configured to shed environmental debris (e.g., dust, dirt, and/or moisture) away from the window. In some variations, the roof may be configured to shed environmental debris below a junction between the window and the receiver channel.

Figure 15:
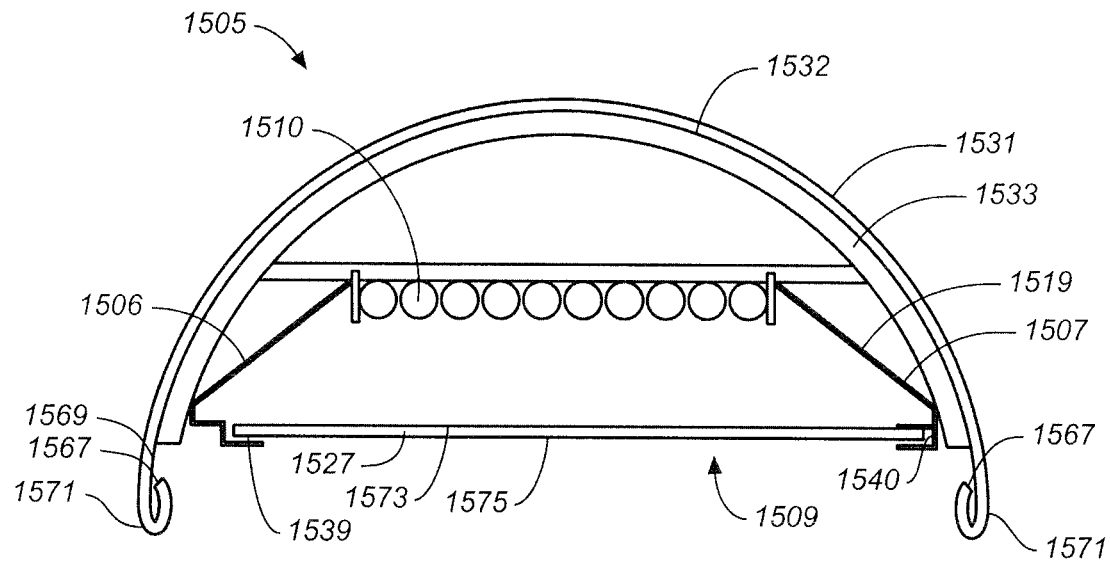
FIG. 15 shows a variation of a receiver comprising a roof configured to shed environmental debris away from a window in the receiver.

Referring now to FIG. 15, receiver 1505 includes receiver channel 1519. Roof 1531 is positioned over receiver channel 1519, so that it has a concave surface 1532 facing the receiver channel 1519 that houses solar absorber 1510. The profile of roof 1531 is smooth, comprising no significant horizontal ledges, crevices, or other features that may trap or retain environmental debris. In this variation of a receiver, a window 1527 is disposed in the aperture 1509 between sidewalls 1506 and 1507 of receiver channel 1519. The window 1527 forms junctions 1539 and 5140 with receiver channel 1519. Such junctions may, for example, be formed between a window and a window support member similar to any of those illustrated in FIGS. 11A-E. Roof 1531 may be supported on frame 1533. The roof 1531 may be attached to frame 1533 in any suitable manner, e.g., by welding, bolting, riveting, and/or with the use of adhesive. In this variation, the roof 1531 extends below junction 1426 to enable the roof to shed environmental debris away from the window. In addition, in this variation, roof 1531 is designed so that moisture and other contaminants do not collect on an edges 1567 or on an inner surface 1569 of roof 1531. In this variation, end sections 1571 of roof 1531 are curled inward and upward so that moisture and contaminants are shed away from edges 1567, to increase the barrier for any external contaminants to reach the inner surface 1569, and to shed external environmental debris away from either an inner surface 1573 or outer surface 1575 of window 1527. In some variations of receivers, a protective coating such as a plastic or rubber coating that can resist water, UV, ozone, and/or other environmental exposures may be added to the external surface of a roof. For example, a rubber sheet made of EPDM rubber (ethylene propylene diene monomer rubber) may be used. However, a roof such as that illustrated in FIG. 15 may demonstrate reduced or slowed corrosion effects to increase the lifetime of the roof, even without additional protective coatings (such as rubber coatings). Increased durability of a receiver roof may, in turn, increase the lifetime of a receiver in the field.

Any suitable material or combination of materials may be used for receiver roofs. For example, a metal sheeting material may be used, such as steel, or a galvanized metal sheet. Curved or peaked metal sheets formed into roofs may provide a roofs with smooth, downward-sloping surfaces capable of shedding environmental debris away from the window, and may also impart longitudinal stability to the receiver, e.g., by resisting longitudinal bending and/or torsion. Other variations may include roofs at least partially formed from plastics, e.g., reinforced lightweight composites that have properties to withstand continuous UV exposure and high temperatures experienced by the receivers. In some variations, the roofs may comprise an additional layer such as a rubber layer that may provide enhanced water, dust, and/or UV resistance.

Figure 16B:
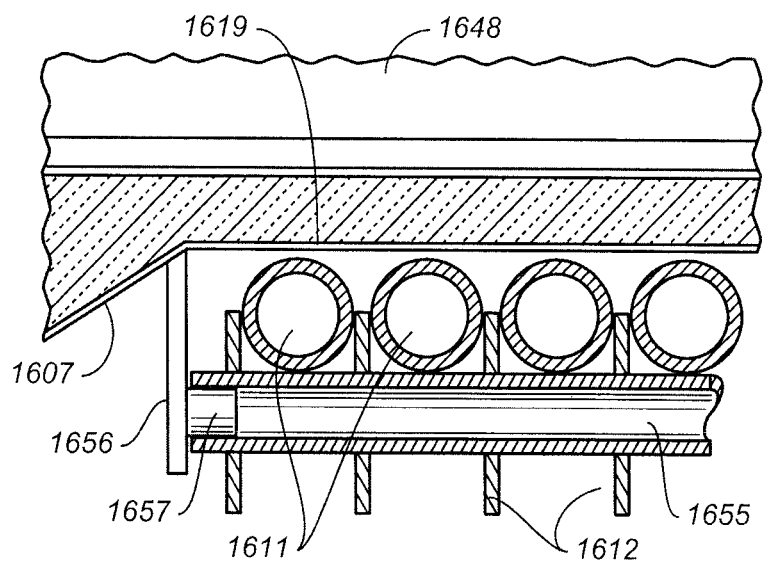
FIGS. 16A-16B illustrate an example of a receiver that comprises solar radiation absorbing tubes, with spacers positioned between adjacent tubes.
Figure 16A:
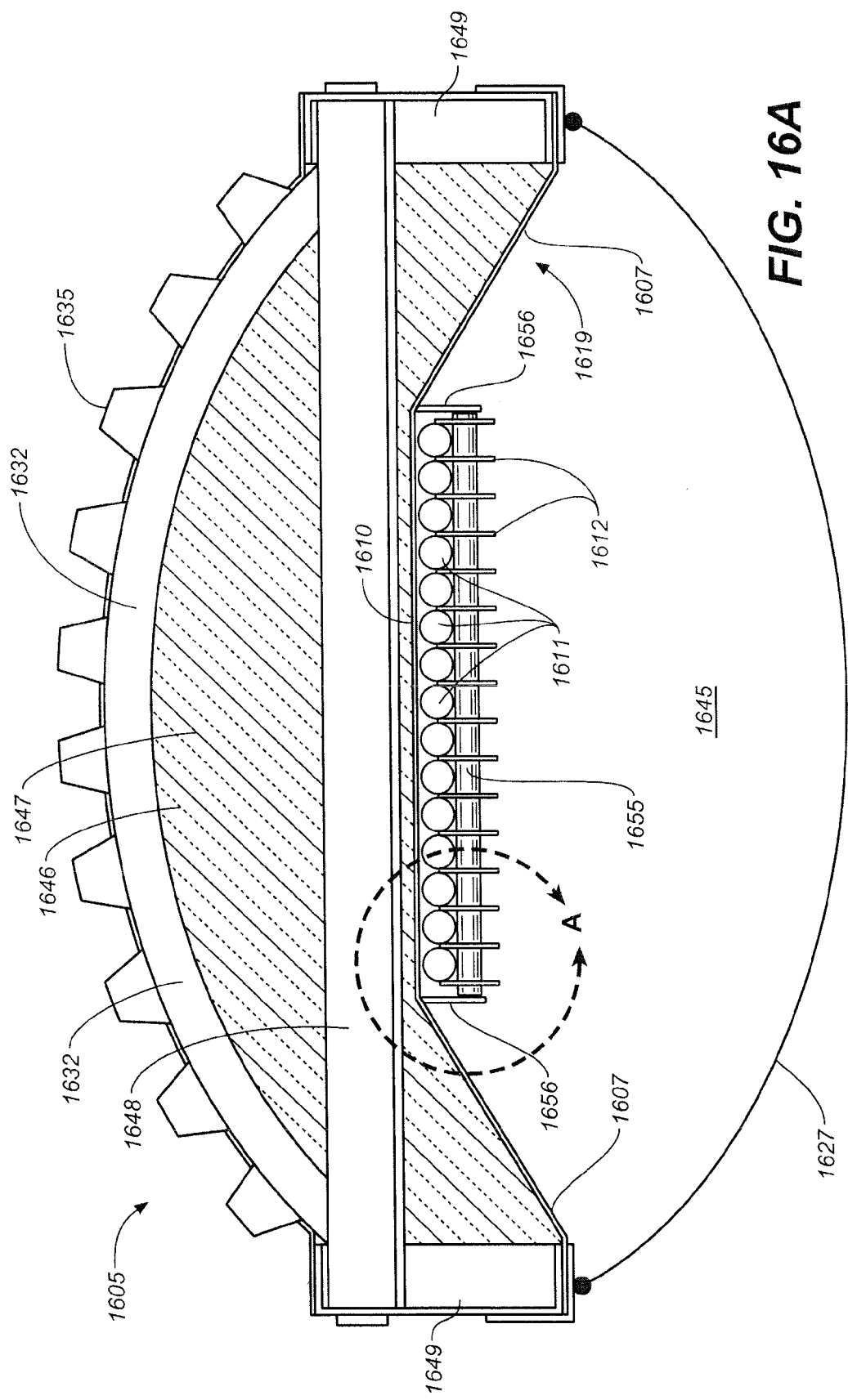

As described above, the receivers in thermal solar energy collector systems such as LFR solar arrays may comprise a plurality of solar absorber tubes that are configured to absorb incident solar radiation and to transfer energy from the solar radiation to a heat exchange fluid (e.g., water and steam) carried by the tubes. Because the temperature of the solar absorber tubes may vary dramatically over the course of a day with the movement of the sun, the tubes expand, contract and move. In some receivers, movement of tubes relative to each other may be accommodated to maintain inter-tube spacings, and/or to reduce damage or stress in the tubes and/or associated structures. Referring now to FIGS. 16A-16B, receiver 1605 comprises a solar absorber 1610 that, in turn, comprises a plurality of generally parallel tubes 1611 arranged lengthwise in the receiver. The absorber 1610 is housed within a longitudinal cavity 1645 formed between receiver channel 1619 and window 1627. Although window 1627 is depicted as curved, it may also be flat. For example, these receivers may comprise any combination or subset of windows, window support members, and/or receiver channels as discussed here. Receiver channel 1619 comprises sidewalls 1606 and 1607, which may be outwardly flaring. A frame 1632 supports absorber 1610. In certain variations, frame 1632 may comprise an arched structural member 1632, a transverse bridging member 1648, and/or side rails 1649 to provide structural support for receiver components. A roof 1635 may be positioned over receiver channel 1619 and supported by frame 1632. Although roof 1635 is illustrated in this example as a corrugated roof (e.g., a corrugated metal roof) comprising corrugations extending along the length of the receiver, other variations may include smooth roofs, similar to those illustrated in FIG. 15. The volume 1646 formed between roof 1635 and receiver channel 1619 may comprise a thermally insulating material 1647. Optionally, the insulating material may be clad with a reflective metal layer to inhibit heat conduction and heat radiation out of the cavity 1645.

The number and/or dimensions of absorber pipes or tubes in an absorber may be selected for specific system requirements. However, it is generally desired that each absorber tube have a diameter that is small relative to a cross-sectional dimension of the aperture of the receiver channel (e.g., aperture 1609 in receiver channel 1619 in FIG. 16A) so that plurality of absorber tubes may approximate a flat plate absorber surface, as opposed to a single tube collector positioned within a radiation-concentrating trough. For example, a ratio of the diameter of the absorber tube to a cross-sectional dimension of a receiver channel aperture may range from about 0.01:1.00 to about 0.1:1.00. Each absorber tube may have an outside diameter of about 25 mm to about 160 mm. An absorber may comprise about 6 to about 30 absorber tubes arranged side-by-side within the receiver channel. By positioning absorber tubes within a receiver channel so that only the underside of the absorber tubes is illuminated, reduced heat emission from the non-illuminated top side may result, which may increase energy efficiency. Moreover, since the water in the tubes is below a steam level, this arrangement causes the desired result of concentrating the incident light on the portion of the tube containing water rather than steam. Additional, non-limiting examples of absorber configurations are provided in International Patent Application Number PCT/AU2005/000208, which has already been incorporated by reference in its entirety.

Individual absorber tubes may or may not be spaced apart by one or more spacers. In some variations, tubes may be spaced together as closely as possible, e.g., touching or with small intervening (not necessarily fixed) gaps of about 1 mm to about 4 mm, e.g., about 2 mm, or about 3 mm. In other variations, spacers may be used to provide or maintain spacings between at least some, but not necessarily all, adjacent ones of the plurality of tubes while accommodating thermal expansion, contraction, and movement. Referring again to FIGS. 16A-16B, spacers 1612 may be provided between absorber tubes 1611. Spacers 1612 may be selected in any suitable manner to provide or maintain space between adjacent absorber tubes. The absorber tubes 1611 may be supported below by one or a series of rollers 1655 that each extend transversely between sidewalls 1656. Rollers 1655 may be coupled to sidewalls 1656 through fittings 1657 that allow rotational movement. Spacers 1612 may, for example, be disk-shaped spacers that may rotate with respect to rollers 1655. Additional examples of inter-tube spacings and roller configurations to support absorber tubes are provided below.

In some variations of receivers, absorber tubes may be coated with a solar absorptive coating. The coating may comprise, for example, a solar spectrally selective surface coating that remains stable under high temperature conditions in ambient air, for example, a black paint that is stable in air under high-temperature conditions. Non-limiting examples of solar spectrally selective coatings are disclosed in U.S. Pat. Nos. 6,632,542 and 6,783,653, each of which is incorporated herein by reference in its entirety.

To increase the collection efficiency of a receiver, the amount of light leaking past or between absorber tubes may be reduced. In addition, relatively uniform irradiation of absorber tubes may be desired, e.g., to reduce the formation of hot spots which may lead to inefficient energy conversion. Referring now to FIGS. 17A-17B, one variation of a solar energy collector system 1700 may comprise a solar radiation absorber 1710 that comprises a plurality of absorber tubes 1711, and a first reflector 1717. First reflector 1717 may be configured to reflect incident solar radiation 1713 to a first absorber tube 1711' in absorber 1710. A second reflector 1718 may be configured to reflect incident solar radiation 1713 to a second absorber tube 1711" in absorber 1710. Reflectors 1717 and 1718 may each be part of a reflector row or reflector row segment in a reflector field. Reflectors 1717 and 1718 may be part of different reflector fields, e.g., reflector 1717 may be part of a first reflector field and reflector 1718 may be part of a second reflector field, or reflectors 1717 and 1718 may be part of the same reflector field. The receiver 1705 may include an elongated receiver channel 1719, with an aperture 1709 extending transversely between receiver channel sidewalls. Optionally, the receiver 1705 may comprise window support members 1720 and 1721 extending along opposite sides of aperture 1709. Window support members may, for example, be similar to those discussed in connection with FIGS. 11A-11E.

So that light does not leak past the outer circumferential edges of the first absorber tube 1711', first reflector 1717 may be oriented so that its outer edge 1716 is aligned with a tangent extending from outer circumferential edge 1714' of first absorber tube 1711'. Similarly, second reflector 1718 may be oriented so that its outer edge 1722 is aligned with a tangent extending from outer circumferential edge 1714" of second absorber tube 1711". Angle $\alpha$ indicates approximately the largest angle of incidence (relative to normal 1790) for a ray directed from first reflector 1717 to first absorber tube 1711', and angle $\beta$ indicates approximately the largest angle of incidence for a ray directed from second reflector 1718 to second absorber tube 1711".

Referring now FIG. 17B, spaces (e.g., spaces $A_1$-$A_3$) may be provided between adjacent absorber tubes in a receiver to accommodate relative thermal expansion and/or movement of the absorber tubes. To reduce or minimize the amount of solar radiation directed and lost through the inter-tube spacing, the spacing between absorber tubes may be set as shown in FIG. 17B. The absorber tubes may be spaced apart by setting the spacing (e.g., with a spacer) between absorber tubes such that an inner edge of a reflector that is closest to the receiver (e.g., inner edge 1724 of reflector 1717) is aligned with tangents 1780 to outer circumferential edges 1714 of receiver tubes 1711. Spacings $A_1$-$A_3$ result, where the spacings refer to a distance between the outermost points of adjacent absorber tubes. The use of such inter-tube spacings may allow tubes to be spaced apart without significantly reducing collection efficiency. If the inner edge of a reflector or reflector row on each side of the receiver is positioned the same distance from the receiver, this method of setting inter-tube spacings will result in spaces between absorber tubes that vary, with spaces between outer absorber tubes smaller than those between inner absorber tubes. Once the inter-tube spacings are set, such spacings may be maintained with spacers. For example, spacers similar to those illustrated in FIGS. 16A-16B may be used. In some variations, the inter-tube spacings may be simplified by using a uniform inter-tube spacing equal to the smallest such spacing determined by the method illustrated in FIG. 17B for some or all adjacent pairs of absorber tubes.

Figure 18A:
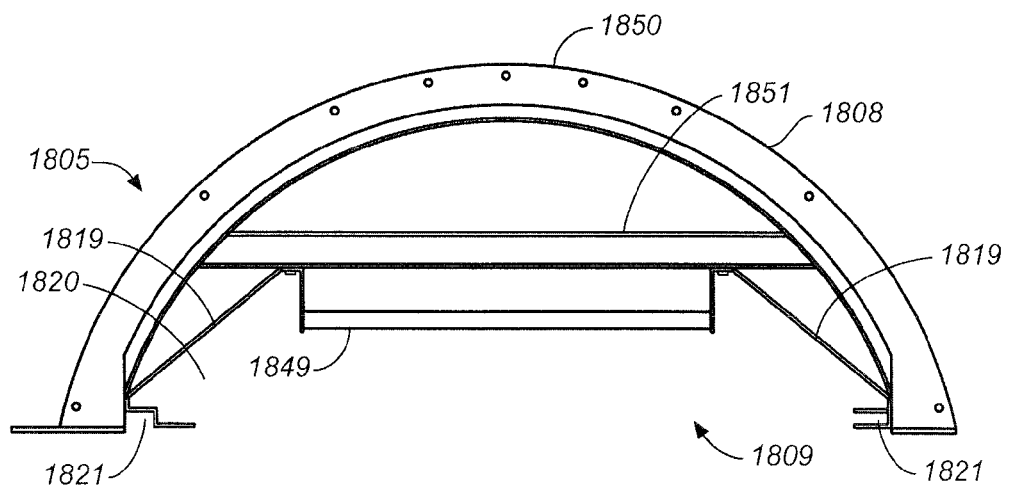
FIGS. 18A-18C shows an example of a receiver in which the number and/or quality of thermal conduction paths between a cavity housing solar radiation absorber and structural elements of the receiver have been reduced.
Figure 18B:
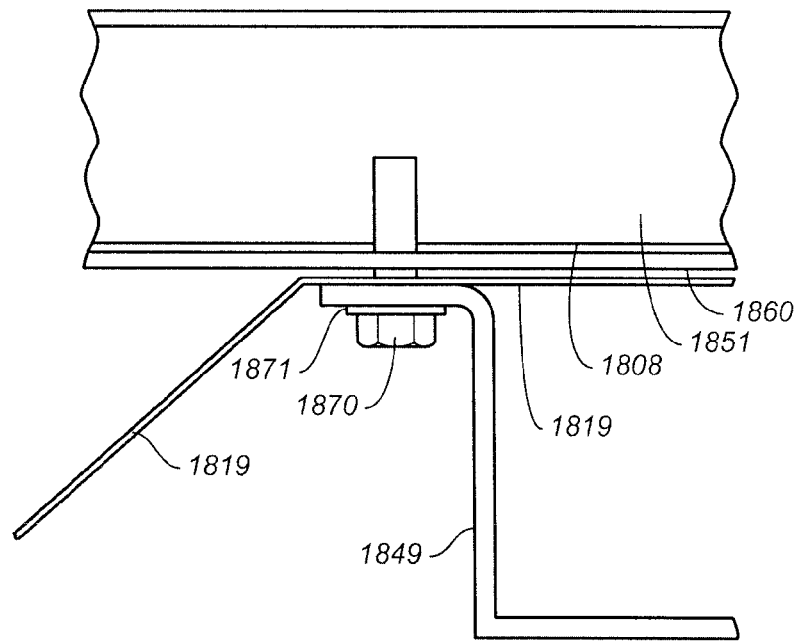
Figure 18C:
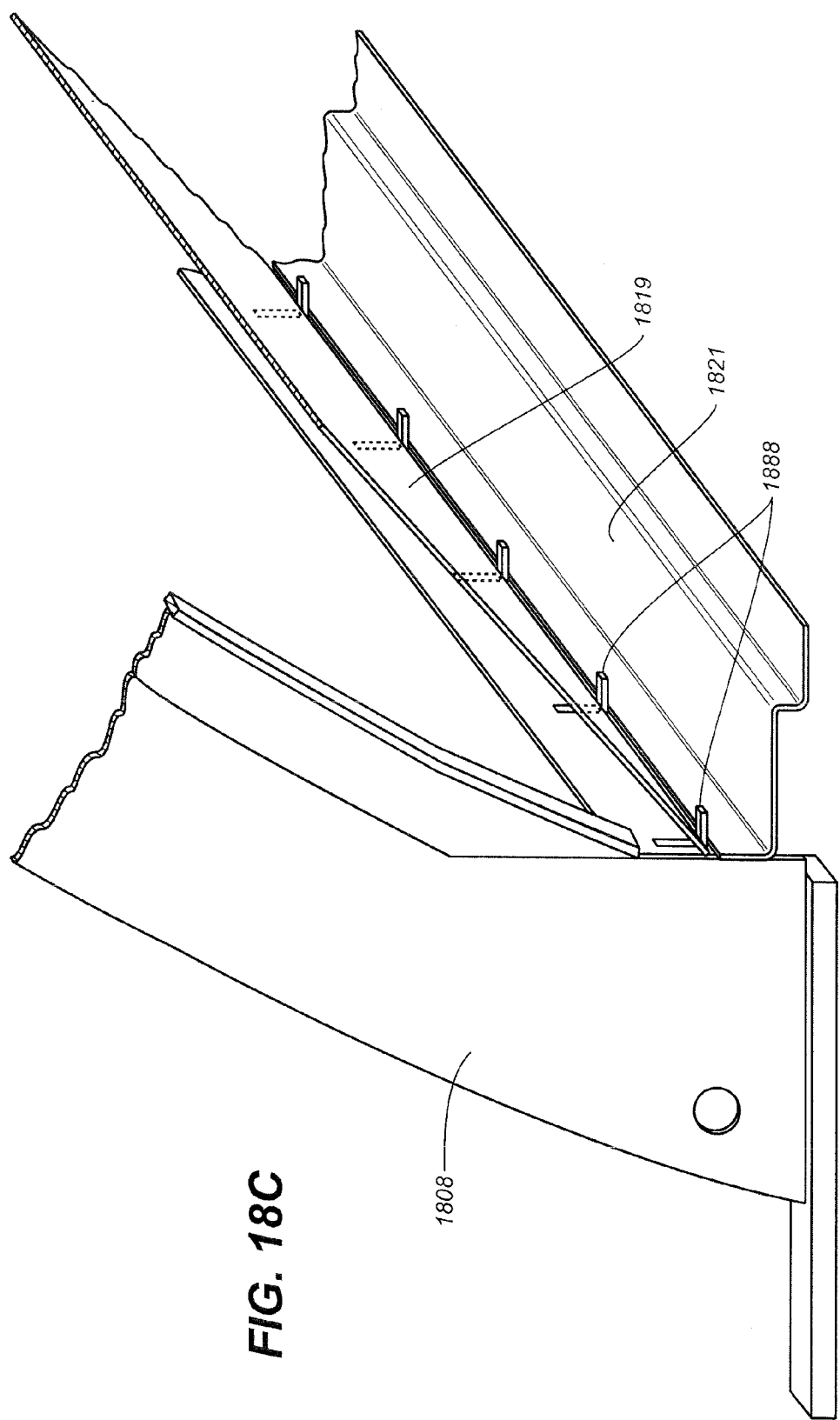

Improved receivers may be designed to reduce the number and/or effectiveness of thermal conduction paths (i.e., thermal shorts) between the cavity housing the solar radiation absorber and other structures in the receiver. Reducing thermal shorts may increase solar collection efficiencies of a receiver or of a solar energy collection system comprising such a receiver, e.g., by about 2%, about 3%, about 5%, or even more. Referring now to FIGS. 18A-18C, receiver 1805 comprises receiver channel 1819 that houses a solar radiation absorber (not shown) in an elongated cavity 1820. The solar radiation absorber may be supported by an absorber support 1849. The absorber support 1849 and receiver channel 1819 may each be coupled to frame 1808. Frame 1808 may, in some variations, comprise arched structural member 1850 and transverse bridging member 1851. Spaces and/or thermally insulating standoffs may be inserted between the receiver channel 1819 and frame 1808, and/or between the absorber support 1849 and frame 1808 to reduce or interrupt thermal conduction pathways.

FIG. 18B shows an expanded view of a junction between absorber support 1849 and transverse bridging member 1851 of frame 1808. A space 1860 is provided between receiver channel 1819 and transverse bridging member 1851. The space 1860 interrupts thermal conduction paths between the receiver channel 1819 and the frame 1808, and between the absorber support 1849 and the frame 1808 by reducing or eliminating surface area contact with the frame. Further, any thermal path between the structures of the thermal cavity and the frame via connection bolt 1870 between the frame 1808 and the absorber support 1849 may be reduced, e.g., by providing a thermally insulating washer 1871 between bolt 1870 and absorber support 1849, and/or coating the bolt or the orifices through which the bolt extends with an insulating material. Although not shown in FIG. 18B, thermally insulating standoffs, such as ⅛" thick fiberglass tape, may be provided in space 1860.

Other types of thermal separation members may be used between metal structures in a receiver to reduce heat conduction away from the receiver channel. For example, FIG. 18C provides an expanded view of an interconnection region between receiver channel 1819 and frame 1808 near window support member 1821. As shown there, the contact area between the receiver channel 1819 and the frame may be reduced by supporting receiver channel 1819 on a set of spaced-apart thermal separation members 1888 (e.g., brackets) that are distributed along a length of an interconnection region between the receiver and the frame. In some variations, thermal separation members 1888 may be metal. In other variations, thermal separation members may be at least partially formed from thermally insulating materials, thereby improving the degree of thermal isolation between frame 1808 and receiver channel 1819. Although not shown in detail in FIGS. 18A-18C, analogous thermal separation members may be used between receiver channel 1819 and the opposite side of frame 1808, near window support member 1822.

Thermal separation members may have any suitable dimensions that can effectively reduce or interrupt thermal contact, e.g., by reducing or eliminating the contact area between two thermally conductive (e.g., metal) surfaces. Any suitable thermal separation members may be used. As discussed above in connection with FIG. 18C, thermal separation members may be thermally conductive in some instances, as long as they reduce thermal contact. In other cases, thermal separation members may be at least partially formed from a thermally insulating material. Non-limiting examples of thermally insulating materials include paints, polymeric coatings, rubbers, composites, insulating tape, glasses, and ceramics. For example, insulating tape (e.g., fiberglass tape) having a thickness of about 1 mm or less, e.g., about 0.5 mm or less, or about 0.3 mm or less, may be used between the absorber support and the frame, and/or between the receiver channel and the frame. Other steps may be taken to further reduce thermal shorts between structural components in a receiver to increase collection efficiency. For example, screws, rivets, or clamps that secure components to the absorber or to the receiver channel may be selected to have reduced thermal conductivities, or thermally insulating coatings may be provided on such screws, rivets, and/or clamps.

As indicated above, for example, in connection with FIGS. 16A-16B, solar radiation absorber tubes may be supported by one or more rollers extending transversely across a receiver channel. The one or more rollers turn as the tubes expand and contract longitudinally, thereby allowing continuous support of the tubes. To reduce the amount of energy required to turn the rollers, hollow rollers may be used. However, hollow rollers may not have sufficient strength across their transverse span to support the tubes and the heat exchange fluid flowing through the tubes.

Figure 19A:
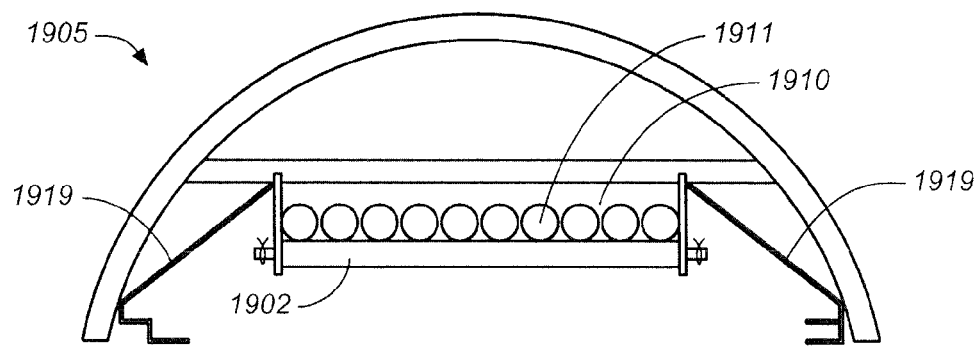
FIGS. 19A-19D illustrate a variation of a receiver in which tubes carrying heat exchange fluid are supported by one or more rollers.
Figure 19B:
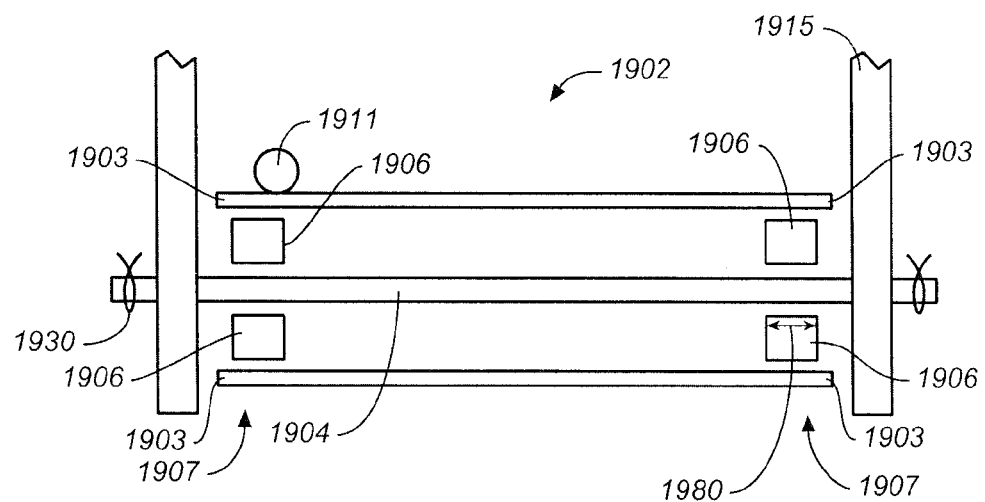

In some variations of receivers, rollers for supporting heat exchange-fluid tubes may be designed that required a reduced amount of energy to turn. Examples of such rollers are illustrated in FIGS. 19A-19B. There, receiver 1905 includes absorber 1910 that comprises absorber tubes 1911 supported by roller 1902. Roller 1902 comprises an outer cylinder 1903 and an inner shaft 1904. The outer cylinder 1903 may be supported on inner shaft 1904 at each end 1907 by bushings 1906. Pins 1930 (e.g., cotter pins) may be used to secure roller 1902 between side walls 1915. The inner shaft 1904 may be a solid rod, or a nearly solid rod. Thus, the inner central shaft 1904 may provide roller 1902 with sufficient transverse strength to support tubes 1911, and the hollow cylinder 1903 that contacts the tubes 1911 can rotate freely from inner shaft 1904, and can thus turn with less energy as tubes 1911 expand and contract longitudinally. Reduced friction between tubes 1911 and roller 1902 may also reduce frictional damage tubes 1911, e.g., to an absorptive coating applied the exterior of the tubes.

In some variations of rollers such as those illustrated in FIGS. 19A-19B, a ratio between a diameter of an outer cylindrical member supported on an inner central shaft may be about 2, or about 3, or about 4, or even higher, e.g., about 5. An inner shaft may have a diameter of about ¼", so that an outer diameter of an outer cylinder supported on the inner shaft may be between about 0.5" and 1.5", e.g., about 1". In some variations, outer cylinders may have an outer diameter of about 1", and an inner diameter of about ¾". Bushings may have any suitable width 1980 to support a hollow cylinder on central shaft. For a receiver having a width of about 1.3 meters, about 10 parallel absorber tubes each having outer diameters of about 2" may be supported on a series of rollers spaced longitudinally apart by about 8 feet. In this series of rollers, a hollow cylinder having an inner diameter of about ¾" cm may be supported on a central shaft having an outer diameter of about ¼", where about 0.5" wide bushings may provide the ½" standoff distance between the outer diameter of the central shaft and the inner diameter of the hollow cylinder are used at both ends, and allow the hollow cylinder to rotate independently of the shaft.

Figure 19C:
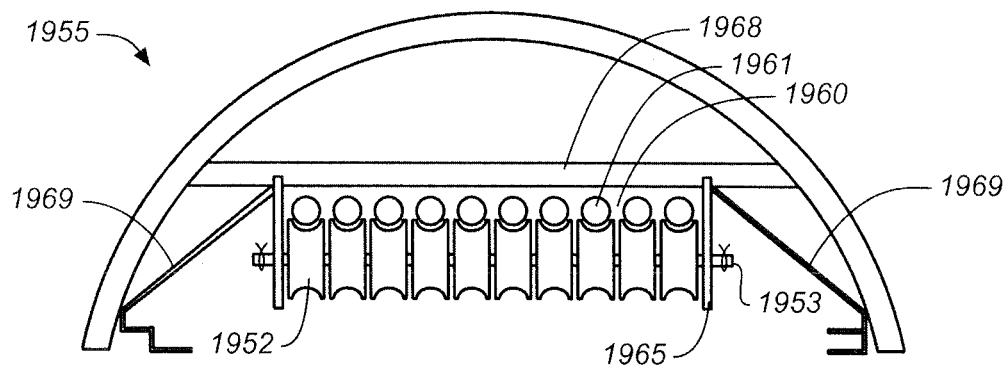
Figure 19D:
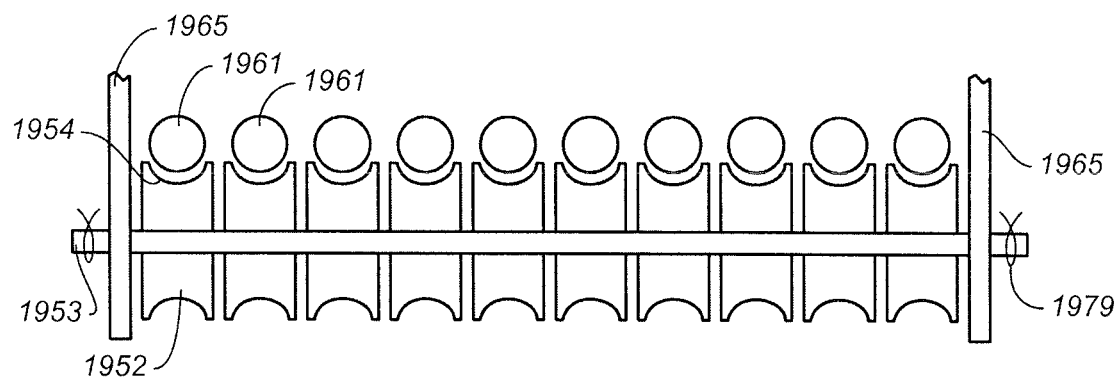

Variations of receivers may include one or more sets of coaxial, independently rotating rollers to support a group of absorber tubes. These designs may accommodate differential thermal expansion between absorber tubes to reduce friction between the tubes and the roller. An example of such a receiver is illustrated in FIGS. 19C-19D. There, receiver 1955 comprises an absorber 1960 that comprises a plurality of absorber tubes 1961. In this variation, the plurality of absorber tubes is supported by a coaxial set of rollers 1952. In this particular example, the coaxial roller set is designed so that each absorber tube 1961 is supported by an individual roller 1952 that rotates about axle 1953. However, as discussed below, an individual roller in a coaxial roller set may support more than one absorber tube, e.g., a pair or a group of absorber tubes. Each individual roller 1952 can rotate independently to accommodate relative expansion between individual absorber tubes 1961. The individual rollers 1952 may each have a profiled cross section 1954 to keep each absorber tube aligned with its corresponding roller, and to keep the tubes spaced apart. Rollers 1952 may be secured between side walls 1965 by pins 1979 (e.g., cotter pins). Optionally, a spacer (e.g., suspended from frame 1968, similar to side walls 1965) may be placed between adjacent ones of the individual rollers in coaxial roller sets. In some variations, individual rollers 1952 may be hollow, e.g., similar to those illustrated in FIGS. 19A-19B. Variations of coaxial individual roller designs may, for example, comprise individual rollers for pairs of adjacent tubes, or other groupings of adjacent absorber tubes. For example, in some variations, relatively cold inlet tubes may be placed on the outer edges of an absorber, while relatively hot tubes are placed in the central region of the absorber. In those variations, each of the outer relatively cold inlet tubes may have an individual roller, whereas a group of central relatively hot tubes may be supported by a common roller. Receivers may comprise a series of such sets of individual coaxial rollers, where the sets of coaxial rollers are distributed along the length of a receiver. Receivers incorporating roller designs or roller configurations that combine variations of rollers described here (e.g., in FIGS. 16A-16B and FIGS. 19A-19D) and/or other rollers known in the art or later developed may also be used.

Variations of absorbers for use in receivers of solar arrays are provided here that can accommodate longitudinal thermal expansion of absorber tubes and/or increase the efficiency of energy conversion between incident solar radiation and a heat exchange fluid. Examples of such absorbers are illustrated in FIGS. 20A-20D. There, solar array 2000 comprises an elevated receiver 2005 and reflectors (not shown) that may be arranged in reflector rows that are parallel to receiver 2005. The reflectors may be rotated via reflector supports 2003 to at least partially track diurnal motion of the sun. Although reflector supports 2003 are illustrated as having hoop-like frames in FIGS. 20-20D, any suitable reflector supports as described herein, known in the art, or later developed may be used. A solar radiation absorber 2010 in receiver 2005 may comprise a plurality of absorber tubes 2011 that can absorb solar radiation and transfer heat to a heat exchange fluid carried within the absorber tubes. An input/output header 2012 controls the flow of heat exchange fluid to and from the plurality of tubes 2011. A turnaround header (shown in FIGS. 20E and 20F) may be positioned at the opposite end of receiver 2005 and may, for example, comprise a turnaround section for each tube 2011.

Pipes may be arranged to reduce heat loss from pipes containing relatively hot fluid, and to accommodate the difference in temperature between incoming and outgoing heat exchange fluid. For example, in some instances an input/output header may be divided into an input section and an output section to accommodate the differential thermal expansion between these two classes of pipes. Referring now to the example illustrated in FIG. 20B, the input/output header 2012 comprises two sections, an inlet section 2014 and an outlet section 2016. The inlet section 2014 may be connected to a fluid source (e.g., water) via flange 2018, and the outlet section 2016 may be connected via flange 2019 to a reservoir (not shown) to store heated fluid. The inlet and outlet sections may comprise any suitable number of inlets and outlets, respectively. For the example shown in FIG. 20B, inlet section 2014 comprises two inlets 2015. Although the outlet section 2016 is illustrated as having 8 outlets 2017 in FIG. 20B, other variations may comprise 4 to 18 outlets. Furthermore, the inlet tubes 2011' that are fed via inlets 2015 may be located on or near the outer edges of the group of tubes 2011 that extend in and out of receiver 2005. Outlet tubes 2011" that are connected to outlets 2017 to recirculate or release relatively hot heat exchange fluid may be located in an inner region of the group of tubes 2011. Thus, colder incoming heat exchange fluid is confined to the outer periphery of absorber, and heated fluid remains near the inner core of the absorber, thereby reducing heat losses from the heated fluid.

Solar absorbers may comprise any combination of a variety of features to accommodate tube thermal expansion, and in particular, differential thermal expansion and contraction of the tubes along the length of the receiver. Some solar absorbers may comprise a moveable header (e.g., an input/output header and/or a turnaround header). These headers comprise at least a section or portion that can move to accommodate tube thermal expansion. Alternatively, or in addition, solar absorbers may comprise a header manifold that comprises first and second header sections, where the first header section is configured to move independently of the second header section. For example, in the variation illustrated in FIGS. 20A-20F, input/output manifold 2012 may float in at least one direction so that it is free to translate in that direction as tubes 2011 expand and contract. Further, the input/output manifold 2012 comprises an inlet section 2014 and an outlet section 2016, and the inlet and outlet sections can move independently of each other. Variations of solar absorbers may also comprise one or more flexible joints and/or flexible pipe interconnections to accommodate thermal expansion.

Figure 20A:
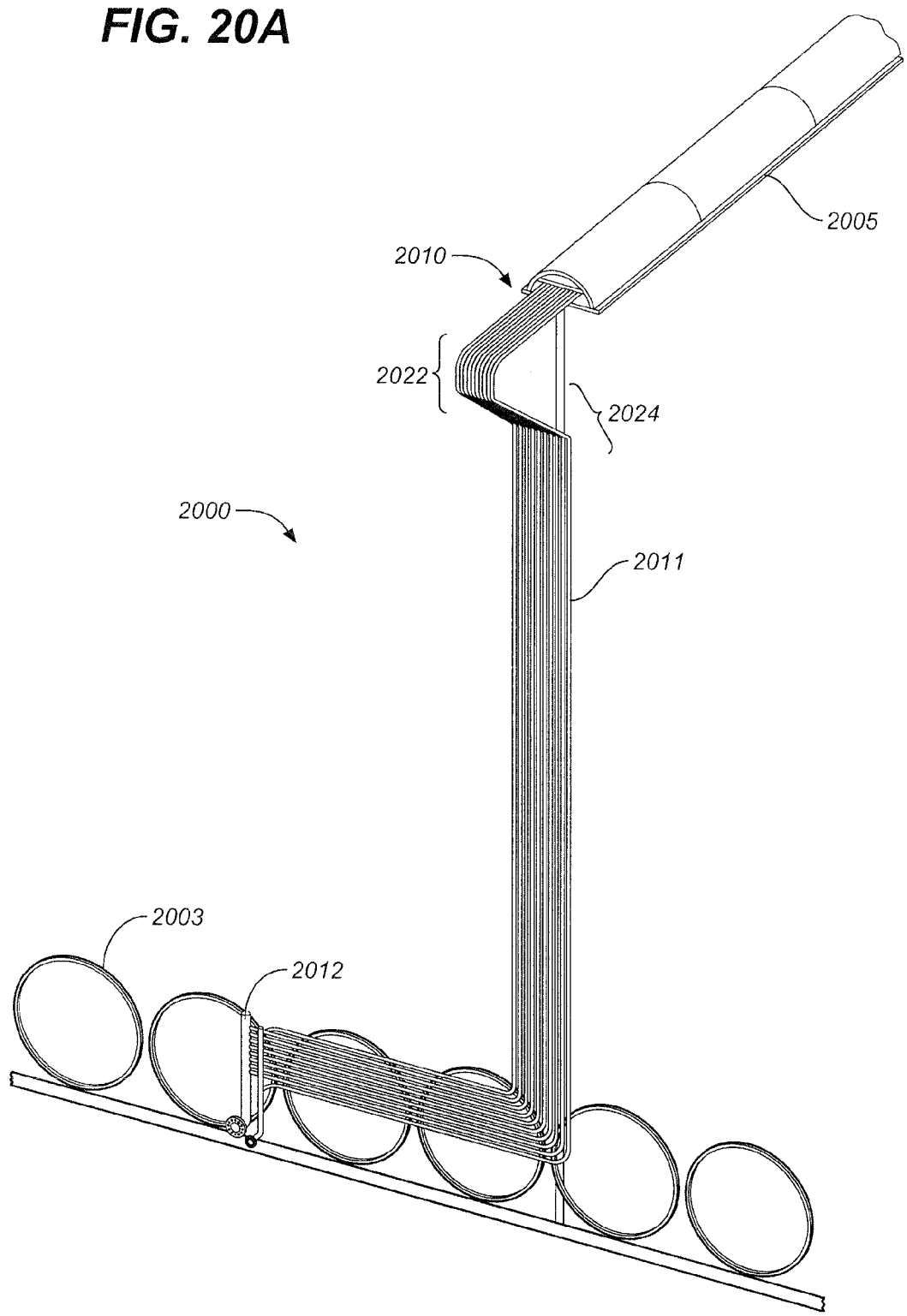
FIGS. 20A-20F show examples of an absorber for a receiver comprising a plurality of solar absorber tubes connected to a header manifold.
Figure 20B:
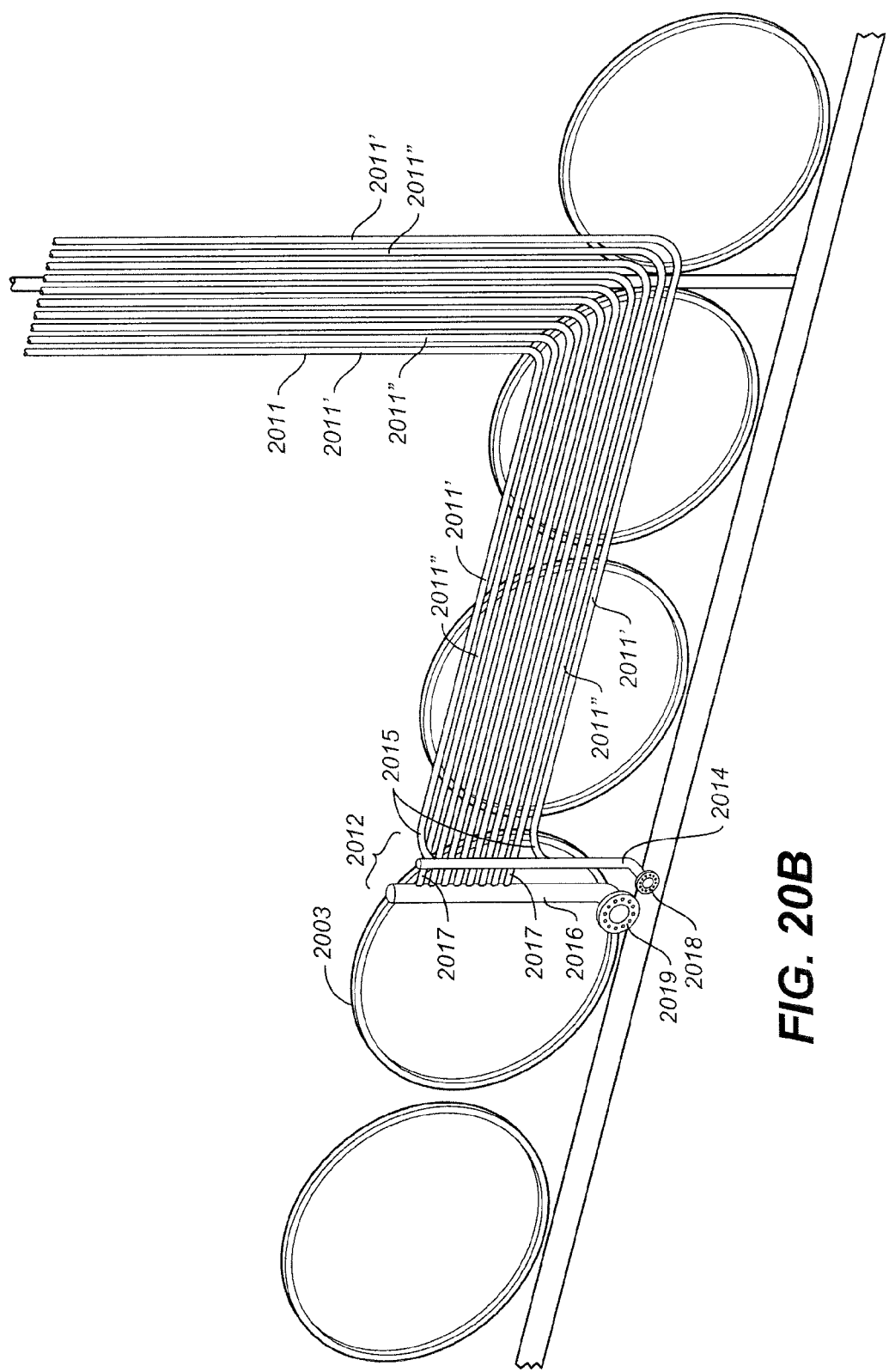
Figure 20C:
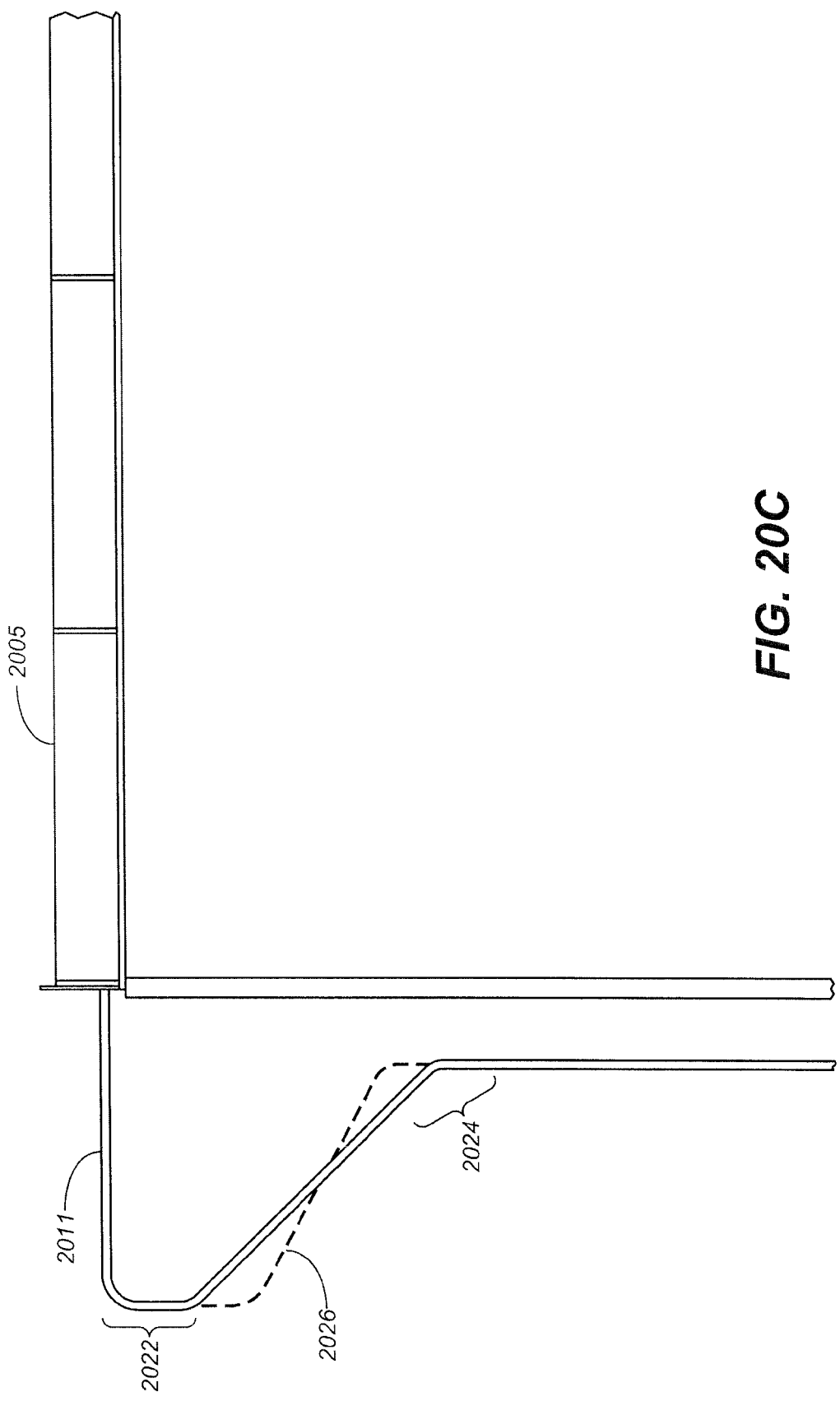
Figure 20D:
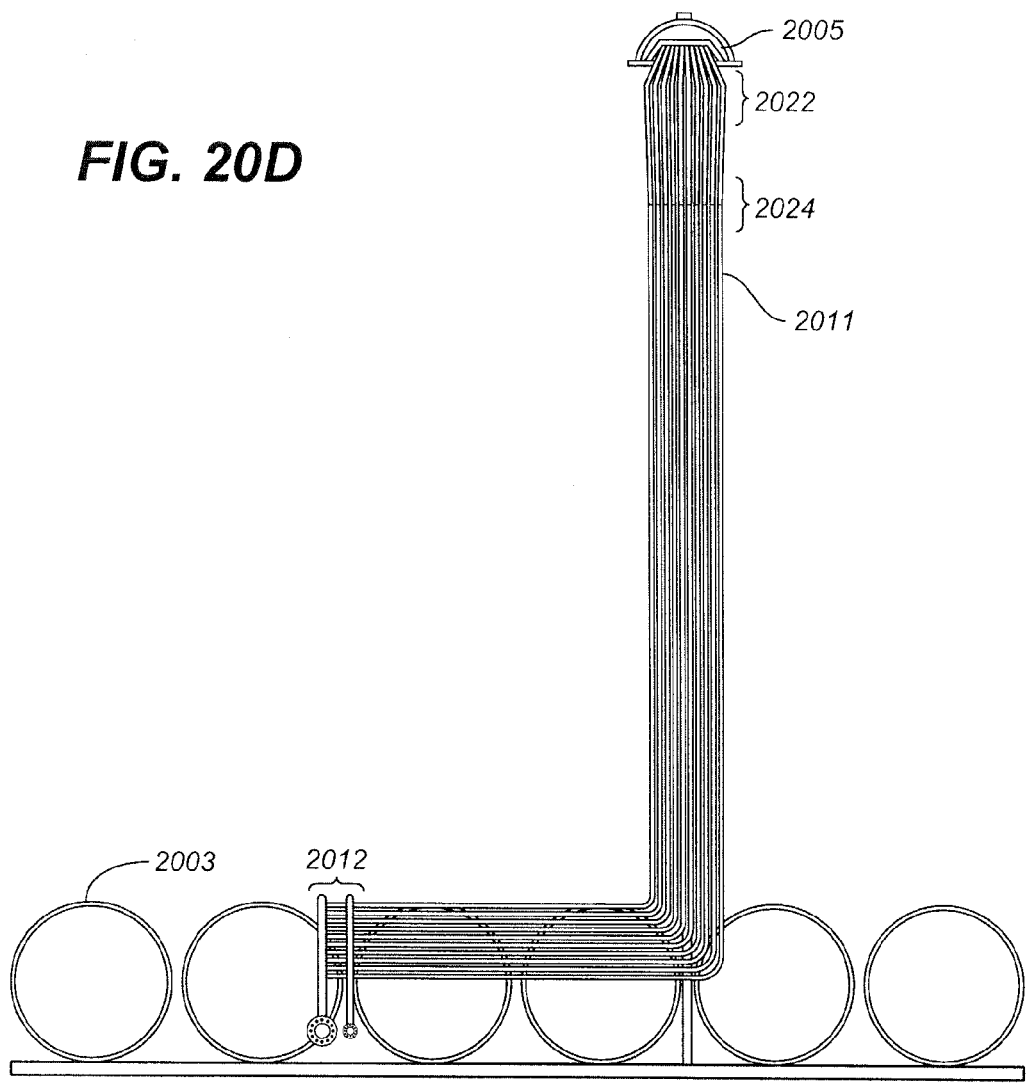

Some absorbers may comprise pipe configurations or tube structures extending beyond the receiver body that can accommodate differential thermal expansion and contraction. Such pipe configurations or tube structures may, for example, comprise one or more bends that may expand, contract, and/or twist to accommodate pipe length changes. One example of such a tube structure is one that comprises two or more bends between an input/out header manifold and the receiver, where at least two of the two or more bends are not in the same plane as each other. For example, two bends may be in planes that are approximately orthogonal to each other. In these variations, the expansion of the pipe may lead to torsional movement via expansion through the two bends that reduces stress on the pipe and/or pipe joints. Referring again to FIGS. 20A-20D, tubes 2011 each comprise a first bend 2022 and a second bend 2024 between the input/output header manifold 2012 and the receiver 2005. In this example, first bend 2022 is not coplanar with respect to second bend 2024. FIGS. 20C-20D show that bend 2022 is in a first plane that is approximately orthogonal to a second plane containing bend 2024. A dashed line 2026 indicates that as bends 2022 and 2024 thermally expand, an overall torsional movement of one or more tubes 2011 may result to accommodate extensive thermal expansion in the one or more tubes while reducing stress on tubes and tube joints.

Figure 20E:
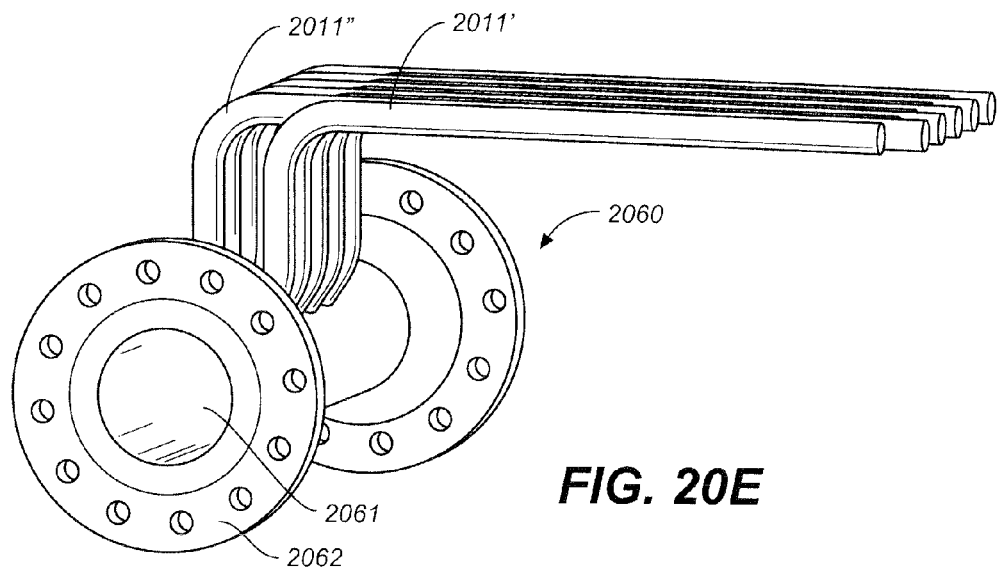
Figure 20F:
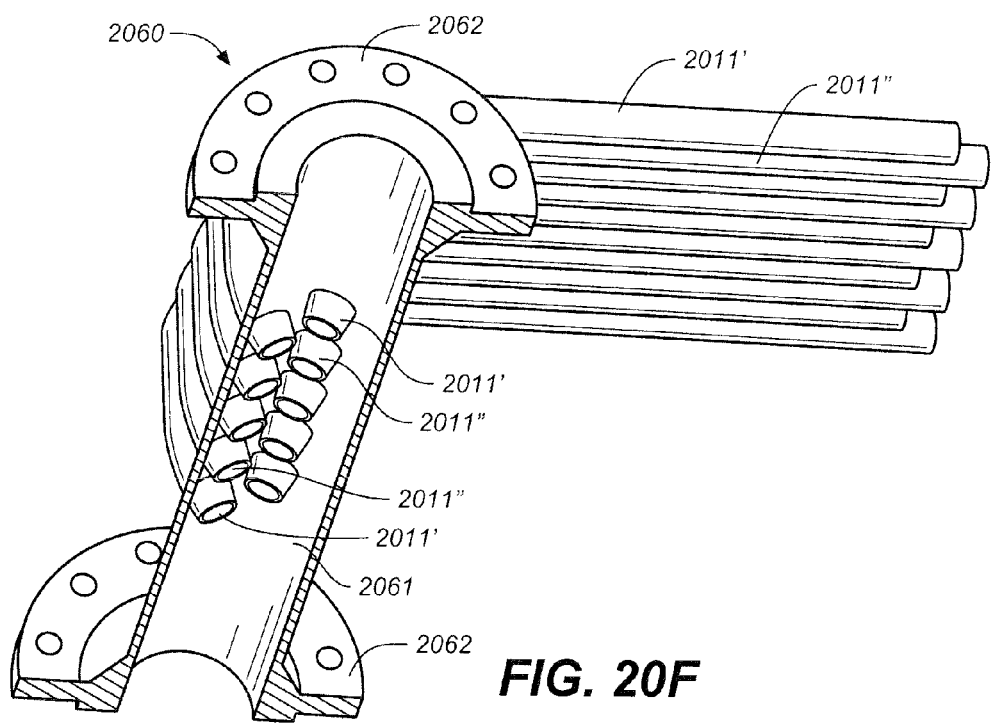

As stated above, absorbers may comprise one or more turnaround headers located at the opposite end of the receiver from the input/output header. Steam and water flowing from the input/output header to the opposite end of the receiver may enter a turnaround header and exit the turnaround header to flow back toward the input/output header. For example, the variation of the solar radiation absorber 2010 illustrated in FIGS. 20A-20D may comprise a turnaround header 2060 as illustrated in FIGS. 20E and 20F. There, turnaround header 2060 comprises a turnaround volume 2061. As illustrated in this example, turnaround volume 2061 may be a cylindrically shaped volume. Although the ends of volume 2061 are shown as uncapped for purposes of illustration, in operation both flanges 2062 are capped by end plates (not shown). Steam and water may enter the turnaround volume 2061 through peripherally-located inlet tubes 2011', and may exit the turnaround volume 2061 through centrally-located outlet tubes 2011". In some variations, one or more tube bends feeding into a turnaround header may comprise one or more flexible joints. The turnaround header may be supported in the receiver in such a way that the turnaround header may move (e.g., translate longitudinally) to accommodate thermal expansion and contraction of the tubes. In other variations, the turnaround header may be fixed in position. In the latter variations, thermal expansion and contraction of the tubes may be accommodated, for example, by other means as described herein.

In some variations of absorbers, all pipes are connected to an input/output header via tube structures as illustrated in FIGS. 20A-20D. In other variations, only some absorber tubes, or one absorber tube, may be coupled to an input/output header using such tube structures. Absorbers comprising any combination of the thermal expansion capabilities that are illustrated in FIGS. 20A-20F, e.g., moveable header manifolds, manifolds comprising multiple sections that are configured to move relative to each other, and pipe bend configurations to accommodate expansion, known in the art, or later developed, are contemplated. Further, absorbers comprising any combination of these thermal expansion capabilities may be used in combination with any receiver or array described herein, known in the art, or later developed.

Header manifolds and/or tubes may comprise additional features to control the flow between absorber tubes. If the level of a heat exchange fluid in an absorber tube becomes too low, a thermal runaway situation may result causing decreased performance and/or damage to a receiver. For example, if water is being used as a heat exchange fluid, and the level of water in a tube is too low, the steam-water ratio may be increased, which, in turn, may lead to an increased pressure drop in that tube. A localized increased pressure drop in an absorber tube will cause the steam-water ratio in that tube to increase even more, leading to a thermal runaway situation in which that absorber tube may eventually become dry. To avoid a thermal runaway situation and resulting dry absorber tubes, an arrangement of solar absorber tubes making up a solar absorber may be provided in which the pressure drops across all tubes are maintained to be relatively constant. If the pressure drops across all tubes are maintained to be relatively constant, then the water flow down each tube will be approximately the same.

If the pressure drop across each absorber tube is dominated by the pressure drop at a tube orifice (e.g., an end orifice), other smaller pressure drops along a tube (e.g., due to local turbulence and/or local heating) may not cause significant fluctuations in pressure drop in that tube. For example, one or more flow control elements may be inserted in one or more tube orifices to control the pressure drop therein. Some flow control elements may, for example, cause a pressure drop in a tube that is about 40%, about 50%, or about 60% of the total pressure drop across the pipe from its turnaround point to its outlet. Flow control elements may be inserted at any suitable position along the pipes. For example, in some cases, flow control elements may be inserted in a turnaround header, e.g., to control the flow of fluid exiting the turnaround header to return to an input/output header. Referring back to FIGS. 20E and 20F, flow control elements (not shown) may be attached to one or more tube ends of tubes 2011" that penetrate header 2060 to reach turnaround volume 2061.

Figure 20G:
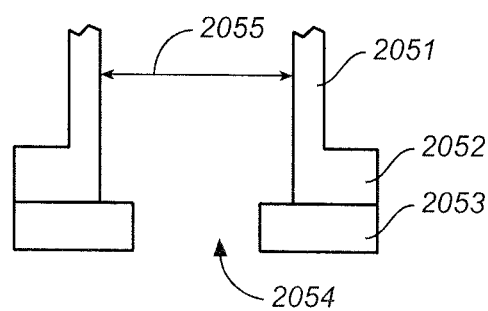
FIGS. 20G-20I show examples of flow control elements that may be used with solar absorber tubes.
Figure 20H:
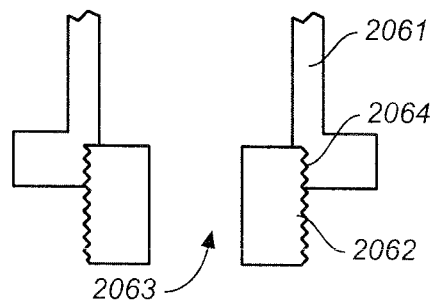
Figure 20I:
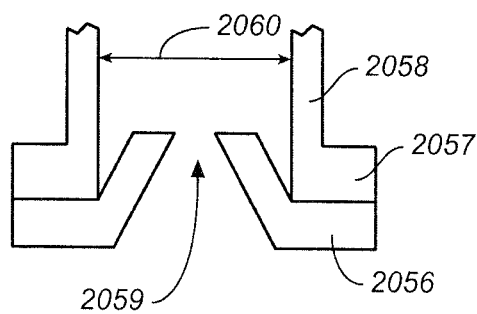

Flow control elements may have any suitable configuration. For example, as illustrated in FIG. 20G, flow through pipe or tube 2051 may be restricted by attaching a removable flange 2053 with a reduced size orifice 2054 (as compared to the inner diameter 2055 of pipe 2051) to end flange 2051. Reduced size orifice 2054 may represent a single orifice, or a group of smaller orifices, e.g., perforations. In other variations, flow control elements may comprise a permanently affixed flange comprising one or more reduced-size orifices. In still other variations, as illustrated in FIG. 20I, a flow control element 2056 coupled to an end flange 2057 of pipe 2058 may be conical and have one or more reduced-size orifices 2059 as compared to an inner diameter 2060 of pipe 2058. Some variations of flow control elements may be affixed to a pipe by threading onto a threaded end of the pipe. For example, pipe 2061 in FIG. 20H comprises a threaded end 2064. Insert 2062 may be threaded onto pipe 2061 to provide a reduced diameter orifice 2063 for pipe 2061.

In receivers comprising a plurality of solar radiation absorber tubes for carrying a heat exchange fluid, fluid flow through the tubes may be designed to reduce heat losses from the tubes. Thus, as described in International Patent Application Number PCT/AU2005/000208, which has already been incorporated by reference herein in its entirety, absorber tubes containing relatively high fluid temperatures may be positioned near the interior of an arrangement of parallel tubes making up a solar absorber, and correspondingly, tubes containing the coldest fluid may be positioned toward the periphery of the arrangement of parallel tubes. In some variations of receivers, fluid flow through absorber tubes may be in unidirectional streams. Other fluid flow arrangements may be used.

Figure 21A:
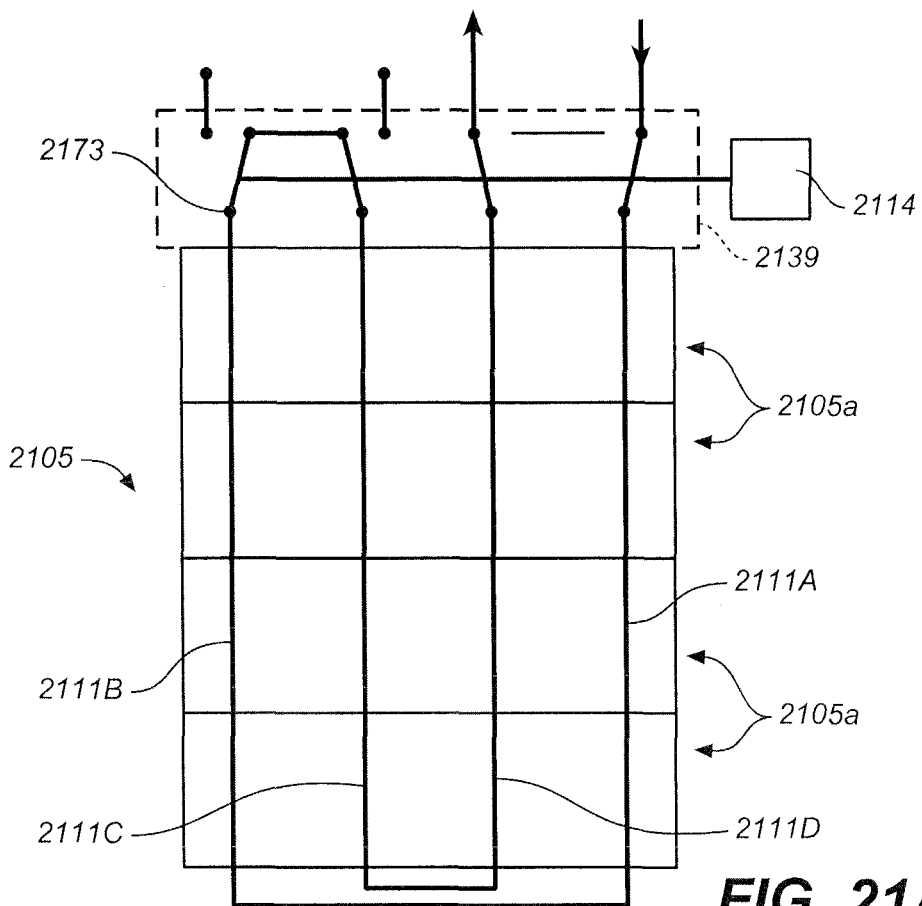
FIGS. 21A-21C illustrate various configurations of flow patterns of a heat exchange fluid through a plurality of solar absorber tubes.
Figure 21B:
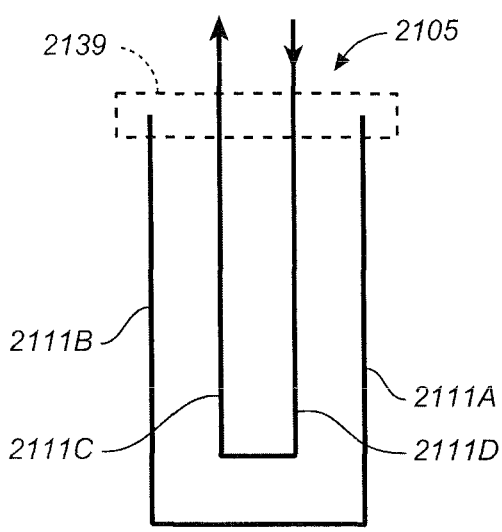
Figure 21C:
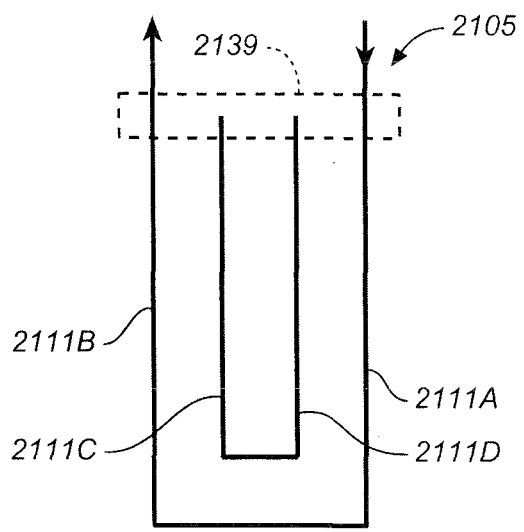

FIGS. 21A-21C illustrate various arrangements of flow patterns of heat exchange fluid through solar absorber tubes that may be used to reduce heat losses and increase the overall collection efficiency of a receiver. FIG. 21A illustrates diagrammatically one flow control arrangement for a plurality of solar absorber tubes. There, receiver 2105 comprises multiple interconnected receiver structures 2105a. Each of the fluid lines 2111A, 2111B, 2111C, and 2111D is representative of four absorber tubes in receiver 2105. Junction points 2173 indicate joints, interconnections, or valves between tubes or tube sections. In-flowing heat exchange fluid is first directed along forward input line 2111A, then along return line 2111B, then along forward line 2111C, and finally along and from return line 2111D. This fluid flow pattern between absorber tubes results in colder fluid being directed through tubes that are near or around the periphery of receiver 2105, whereas heated fluid travels through an inner core region of receiver 2105. In some variations, a flow control device 2139, e.g., a manifold, may be used for selective control over the flow of heat exchange fluid. For example, a valve manifold 2114 may be used to selectively open or close fluid paths 2111A-2111D.

Alternative fluid flow patterns may be used to meet fluctuating load demands and/or adjust for prevailing ambient conditions. For example, selected ones of absorber tubes in a receiver or receiver structure may be closed. In FIG. 21B, tubes corresponding to fluid paths 2111A and 2111B are closed, so that all fluid flows through tubes corresponding to fluid paths 2111C and 2111D. In FIG. 21C, tubes corresponding to fluid paths 2111C and 2111D are closed, so that all fluid flows through tubes corresponding to fluid paths 2111A and 2111B.

Any suitable method or scheme may be used to install an elevated receiver above one or more reflector fields. For example, a series of vertical support structures may be anchored to the ground similar to vertical support structures 218 shown in FIG. 2A, and an elongated receiver may be lifted with a crane and installed into the vertical support structures. As discussed above, an elongated receiver may comprise multiple receiver structures. The receiver structures may be elevated individually, and coupled together to form an elongated receiver after they have been installed onto vertical support structures. Alternatively, receiver structures may be at least partially coupled together before being elevated. Frames of the receiver structures may be coupled together with mating flanges, for example, and absorbers in receiver structures may be coupled together with pipe fittings, e.g., flexible pipe fittings. Roofs may be installed onto a receiver before or after coupling multiple receiver structures together to form an elongated receiver, and before or after elevating to an installed position. In some variations, it may be desirable to install a roof, e.g., a roof formed of curved sheet metal similar to that depicted in FIG. 15, after multiple receiver sections have been coupled together to form an elongated receiver. This may eliminate seams in the roof, or reduce the number of seams in the roof, and may impart greater longitudinal stability to the receiver, e.g., to prevent bending and/or torsion. Windows may be installed into receivers or receiver structures before or after elevating to an installed vertical receiver position.

In some situations, it may be desirable to reduce or eliminate the number of aerial welds or other aerial assembly steps that must be performed. In those instances, the receiver may be partially or entirely assembled on the ground and then elevated in its assembled (e.g., welded) form. To avoid or minimize crane use, one or more vertical support structures that may eventually be used support the elevated receiver during array operation may also be used to elevate a receiver. Referring now to FIG. 31A, solar array 3100 is illustrated during construction. Array 3100 comprises two longitudinally extending reflector arrays 3110. A series of vertical support structures 3101 are each anchored to the ground over elongated receiver 3105 and distributed along the length of the receiver. The receiver 3105 may be at least partially assembled (e.g., welded and/or bolted together) on or near the ground (e.g., on a stand). Manual, motorized, gravity-aided, or spring-aided hoists 3102 that are attached to vertical support structures 3101 may be used to elevate the receiver to its installed position. For example, a hoist that lifts from above may be attached at or near a peak or uppermost portion of a vertical support structure (e.g., peak 3103 in FIG. 31A). As used herein, "hoist" is meant to encompass any type of lifting structure, e.g., one or more cables and pulleys, a dumb-waiter arrangement, a spring or a spring-loaded lift, a counterweight, a ratchet, a winch, an expandable lift, and the like. Hoists may lift a receiver from above, or from below. The vertical support structures 3101 may then support the receiver in its installed position during operation of the array.

In some variations, these vertical support structures may comprise one or mounting members to support a receiver. Mounting members may have any suitable configuration, e.g., shelves, hooks, cross-bars, and the like. For example, vertical support structure 3101 in FIG. 31A comprises an open shelf 3106 that comprises comprising two longitudinally-extending ledges 3104. There, receiver 3105 may be supported by shelf 3106 with a reduced amount of blockage to an aperture located on the underside of receiver 3105. To avoid stressing the receiver during the elevation process, the operation of multiple hoists elevating the receiver may be coordinated or synchronized. Hoists may be removed from vertical support structures once receivers are installed.

Some arrays may comprise variations of vertical support structures that have graded leg thicknesses to reduce shading of reflectors by upper portions of the legs. Referring now to FIG. 31B, vertical support structure 3130 has legs 3131 that comprise a relatively thick base portion 3132 and a thinner upper post portion 3133. The base portion may have a diameter that is about 50% thicker than that of the post portion. For example, base portions may have diameters of about 6", and post portions may have diameters of about 4". In some variations, base portions may comprise about 30%, about 40%, about 50%, about 60%, or about 70% of a total leg length. Such leg configurations may provide adequate strength and rigidity to support elevated receivers, while reducing the amount of shading on the surrounding reflector arrays. A hoist may be mounted to vertical support structure 3130 to enable elevation of a receiver, as shown in FIG. 31A.

Although vertical support structures 3101 in FIGS. 31A-31B are illustrated as A-shaped supports each having a vertex or peak 3103, other variations of vertical support structures may be used to elevate an elongated receiver from ground level and then continue to support the elongated receiver during operation of a solar array. Referring now to FIG. 31C, a T-shaped vertical support structure 3120 is anchored to the ground. T-shaped vertical support structure 3120 comprises a post 3121, and a shelf 3122. The post and shelf may each have any suitable dimensions. For example, in some variations, the post may be round, with a 6" diameter, and the shelf may have a thickness 3123 of about 4". An auxiliary structure 3124 may be attached to the post 3121 and/or the shelf 3122. A hoist 3125 may be attached to auxiliary structure 3124, e.g., at or near the top of structure 3124 for a hoist that lifts from above. Hoist 3125 may be operated (e.g., with a motor, a spring, gravity aid and/or manually) to lift a receiver from ground level to an elevated position, where it may be supported on shelf 3122 during operation of the array. Hoists and auxiliary structures that are used to support hoists may be subsequently removed.

Methods are also described for installing an elevated receiver into a solar array using vertical support structures that may eventually be used to support the elevated receiver during operation of the array. These methods generally include anchoring a vertical support structure to the ground, elevating the receiver to an installed receiver position with the vertical support structure (e.g., with a hoist coupled to the vertical support structure), and then supporting the receiver with the same vertical support structure during operation of the array. For example, a hoist coupled to the vertical support structure may be used to lift a receiver or portion of a receiver (e.g., a receiver body or a receiver structure). Non-limiting examples of vertical support structures that may be used in these methods are provided in FIGS. 31A-31C. In some variations, these methods may be used as part of methods for installing a solar collector system, e.g., a LFR array, disclosed herein, known in the art, or later developed.

In these methods, an assembled or partially assembled elongated receiver may be positioned along a row of spaced-apart vertical support structures at or near ground level. For example, the receiver may be assembled or partially assembled on a stand along a row of vertical support structures. The receiver may then be elevated by one or more of the vertical support structures to an installed receiver position. For example, at least one of the vertical support structures in the row may comprise a hoist configured to lift the receiver. It should be pointed out that not all of the vertical support structures in the row need be capable of lifting the receiver. For example, in some instances, a vertical support structure that is centrally located within the row may comprise a hoist to elevate an elongated receiver, and then the elevated receiver may be coupled to the other vertical support structures in the row in an installed receiver position. The receiver may continue to operate in an array this installed position. In other variations, two of a row of vertical support structures may each be capable of elevating the receiver, e.g., each may comprise a hoist. Those two vertical support structures may be end ones of the row, for example. In still other variations, more than two of a row of vertical support structures in a row may be capable of elevating a receiver, e.g., by comprising hoists. Although the examples of vertical support structures shown in FIGS. 31A-31C illustrate the elevation of assembled (e.g., welded) or at least partially assembled receivers, the vertical support structures and methods described above may also be used to elevate receiver structures that have not yet been assembled into a receiver, or receiver bodies, or other receiver components.

Some variations of solar collector energy systems may incorporate jointed vertical support structures. These vertical support structures may be designed to support an elevated receiver above one or more reflector fields, e.g., a first reflector field and a second reflector field. The jointed vertical support structures may allow a receiver or receiver structure, or a portion of thereof, to be coupled to the support structure at or near ground level, and then the joint may operate so that the receiver or portion thereof can be elevated to an installed vertical receiver position.

Figure 22:
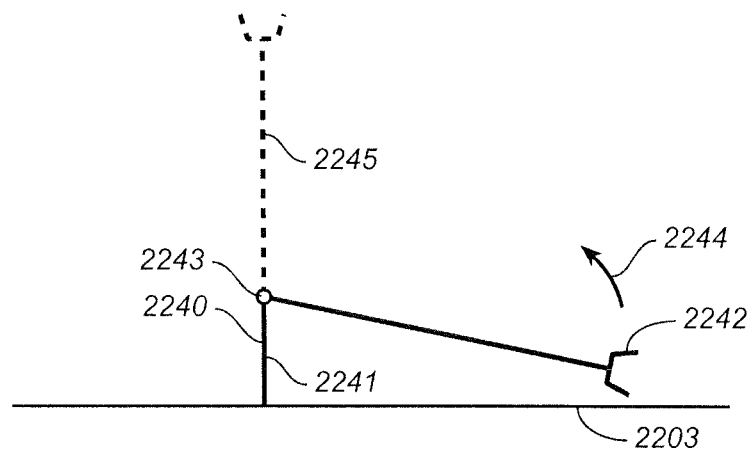
FIG. 22 illustrates a variation of a jointed vertical support structure, and one method for elevating a receiver or a portion of a receiver for a solar energy collector system using the jointed vertical support.

Referring now to FIG. 22, vertical support structure 2240 comprises a proximal end 2241 that is configured to be anchored to the ground, and a distal end 2242 configured to be coupled to an elevated receiver in a solar energy collector system. A first joint 2243 is configured to allow the distal end 2242 to be angled toward the ground 2203 while the proximal end 2241 is ground-anchored. When distal end 2242 is angled toward the ground, a receiver, or a portion of a receiver such as a receiver body or a receiver frame, may be coupled thereto at or near ground level. The first joint 2243 of the vertical support structure 2240 may be configured so that the application of lateral force (indicated by arrow 2244) to its distal end 2242 can cause the distal end to be elevated, so that a receiver or a portion of a receiver coupled thereto may be elevated to a vertical installed receiver position 2245.

Lateral tension may be applied to the distal end of a jointed vertical support structure in any suitable manner. For example, a tether may be coupled to the distal end of the vertical support structure, and lateral tension applied to the tether to elevate the distal end. Some vertical support structures include a tether as part of the vertical support structure. One or more pulleys may be used to guide and control the direction and amount of tension applied to the tether. The pulleys may be part of the vertical support structure, e.g., mounted to the side of a vertical support structure. Alternatively, or in addition, one or more pulleys may be used that are separate from the vertical support structure.

In some variations, joints in vertical support structures may be lockable. For example, joint 2243 in FIG. 22 may be configured to automatically lock when vertical support structure is extended to an installed vertical position 2245, e.g., through the use of spring-tensioned pins that may automatically insert when the vertical support structure reaches a particular position. In other variations, a locking mechanism may be manually activated when the vertical support structure is in a desired position. Alternatively, or in addition, a separate locking member (not shown) may be used, e.g., a sleeve that is configured to slide over a joint and secure a joint.

Figure 23A:
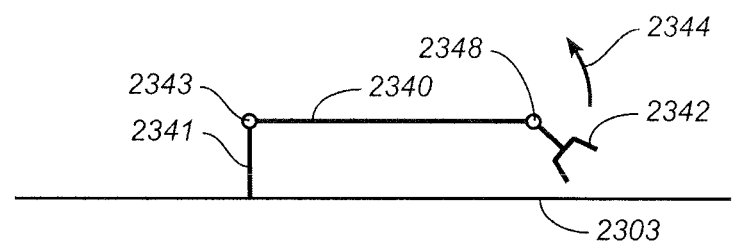
FIGS. 23A-23B illustrates another variation of a jointed vertical support structure.
Figure 23B:
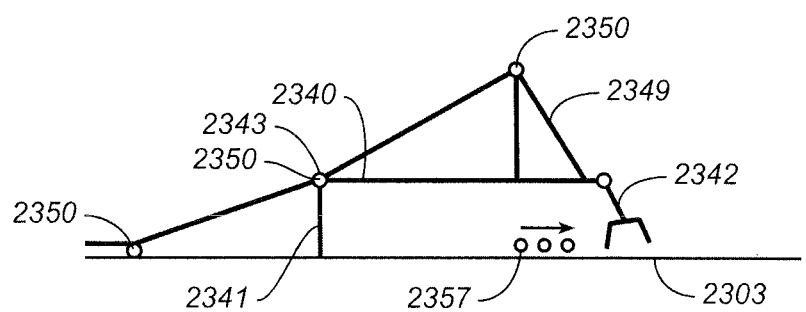

Some variations of jointed vertical support structures may comprise more than one joint. Referring now to FIGS. 23A-23B, vertical support structure 2340 has proximal end 2341 that is configured to be anchored to the ground 2303, and a distal end 2342. A first joint 2343 allows the distal end 2342 to be angled toward the ground to facilitate coupling a receiver or a portion of a receiver thereto at or near ground level. A second joint 2348 is positioned distally relative to the first joint 2343. The second joint 2348 may be movable independently of first joint 2343. Each of the first joint 2343 and the second joint 2348 may be configured to elevate the distal end 2342 of support structure 2340 with the application of lateral tension (indicated by arrow 2344) to distal end 2342. Second joint 2348 may angle distal end 2342 closer to the ground 2303 than first joint 2343. The first and second joints each may be automatically lockable, manually lockable, and/or lockable with a separate locking member, as described above in connection with FIG. 22. The first and second joints may be separately lockable, or may be jointly lockable. As with single-jointed vertical support structures, multiple-jointed vertical support structures may comprise one or more tethers 2349 configured to be coupled to the distal end 2341, and one or more pulleys 2350 configured to guide and control the application of lateral tension to the distal end with the one or more tethers so that the support structure can be elevated to its installed vertical position. The one or more tethers and/or pulleys may be part of, or separate from, the multiple-jointed vertical support structures.

Methods for installing LFR solar arrays using vertical support structures such as those illustrated in FIGS. 22 and 23A-23B are provided. These methods include arranging a plurality of reflectors into reflector rows. A receiver body may be provided that includes an elongated receiver channel that comprises first and second longitudinal sidewalls extending along a length of the receiver channel, and an aperture disposed between the first and second sidewalls. The aperture may extend along the entire length of the receiver channel, or along a portion of the length of the receiver channel. The receiver body may be oriented so that the length of the receiver channel is generally parallel to the reflector rows. The methods include elevating the receiver body above the plurality of reflectors. The plurality of reflectors maybe aligned so that each reflector directs incident solar radiation through the aperture of the receiver body.

In some methods, elevating the receiver may comprise anchoring a proximal end of a jointed vertical support structure to the ground and angling a distal end of the vertical support structure toward the ground. The receiver body may then be secured to the distal end of the jointed vertical support structure at or near ground level. Then lateral force may be applied to the distal end of the jointed vertical support structure to elevate the receiver body to its installed vertical position. Lateral force may be applied using a tether connected to the distal end of the jointed vertical support structure, e.g., as shown FIGS. 22 and 23A-23B. The tether may be threaded through one or more pulleys may be used to guide and/or control the application of lateral tension using the tether. In other methods, elevating the receiver to an installed receiver position may comprise elevating the receiver with a vertical support structure (e.g., with a hoist coupled to the vertical support structure) that may eventually support the receiver during operation of the solar array. Examples of such methods of elevating the receiver were discussed above in connection with FIGS. 31A-31C.

In some variations of the methods, a solar radiation absorber may be installed in the receiver channel of the receiver body before the receiver body is elevated. For example, as shown in FIG. 23B, a plurality of solar radiation absorbing tubes 2357 may be installed lengthwise into a receiver body (not shown). The tubes 2357 may be installed into the receiver body in any suitable manner. For example, the absorber tubes may be inserted in a transverse direction (e.g., by rolling) to the receiver body while it is at or near ground level, and then secured to receiver body. Methods may also include installing a window in the aperture of the receiver channel. The windows may be installed before or after the receiver body is elevated to its vertical installed position. In some variations, the window may be installed into the receiver body in a transverse direction. The windows may be secured over the apertures to the receiver channels, e.g., by forming one or more junctions with the receiver channels using window support members such as those described in connection with FIGS. 11A-11E. In some variations, in particular those in which the windows are installed prior to receiver elevation, tabs such as spring tabs may be used to secure the windows to the receiver channels.

Figure 24A:
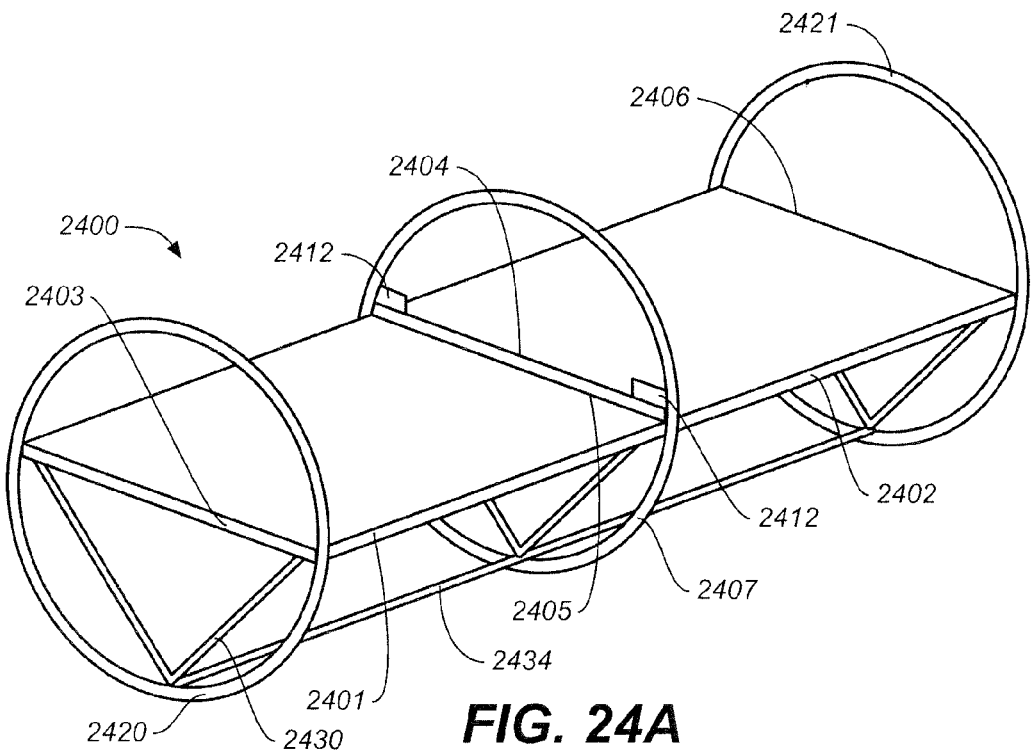
FIGS. 24A-24D show an example of a carrier frame that allows relative alignment of two or more platforms for supporting reflector elements in a solar energy collector system.
Figure 24B:
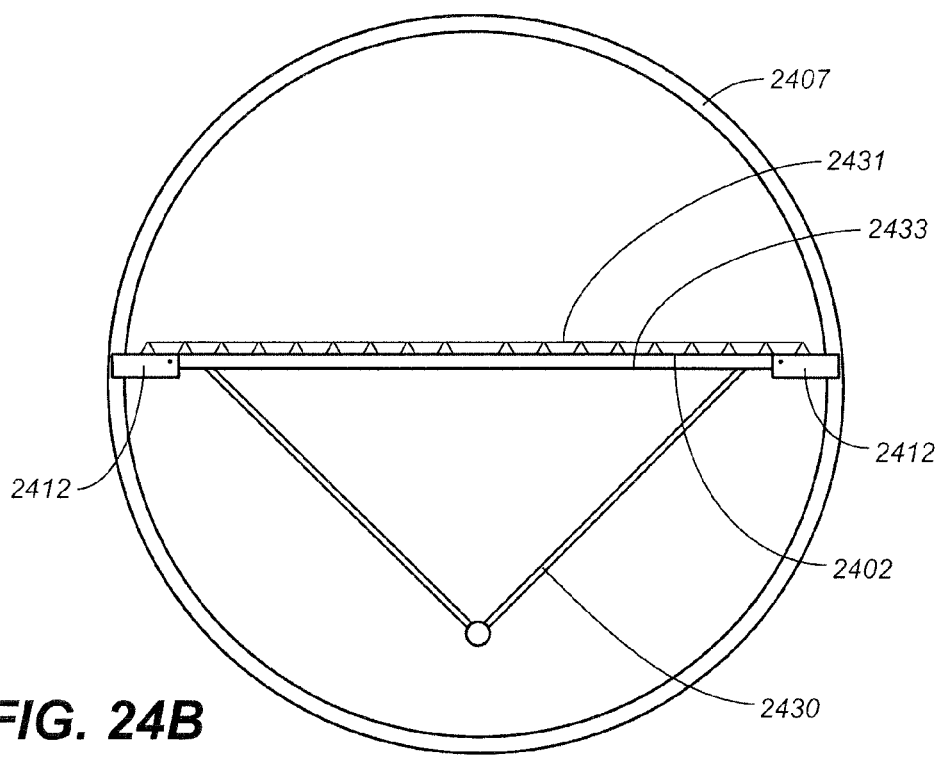

Carrier frames for supporting reflector elements in a solar energy collector system and methods for making such carrier frames are provided. These carrier frames may be used for supporting reflector elements in LFR solar arrays. Referring to FIGS. 24A-24B, carrier frame 2400 comprises a first platform 2401 and a second platform 2402. First platform 2401 has a first end 2403 and a second end 2405, and second platform 2402 has a first end 2404 and a second end 2406. The carrier frame 2400 also comprises a first reflector support 2407. At least one attachment tab 2412 may be affixed to the first reflector support 2407, e.g., by welding or bolting. The second end 2405 of the first platform 2401 may be fixed to the first reflector support 2407, e.g., by welding. The first end 2404 of the second platform 2402 may be temporarily or removably attached to the first reflector support 2407 using at least one attachment tab 2412 so that the first and second platforms 2401 and 2402 extend from opposite sides of first reflector support 2407.

Platforms may comprise a corrugated base layer. Such a construction may facilitate curving the platform surface so that a reflector element conforming thereto will have a desired radius of curvature, e.g., as discussed in connection with FIGS. 3 and 4. Prior to coupling platforms together to form an elongated reflector, one or more reflector elements may be affixed (e.g., using adhesive) to the platforms to follow the curvature of the platforms. The reflector elements may be metallic-backed glass mirrors having a thickness of about 3 mm or 4 mm to provide them with sufficient flexibility to follow the contour of the platforms of the reflector carrier frames. In some variations, a reflector element may be adhered to a platform using one or more lines of adhesive, where the one or more lines of adhesive run generally parallel to a longitudinal axis of the reflector element. A line of adhesive may be continuous or discontinuous. For example, a line of adhesive may contain a series of breaks in the line to allow any water that becomes trapped between the reflector element and the platform a path to drain out. Referring now to FIG. 24B, platform 2402 comprises a corrugated layer 2431 that may be attached to reflector support cross-member 2433. Transverse stabilizing members 2430 (e.g., ribs) and longitudinal stabilizing members 2434 (e.g., spines) may be provided as part of carrier frame 2400.

Figure 24C:
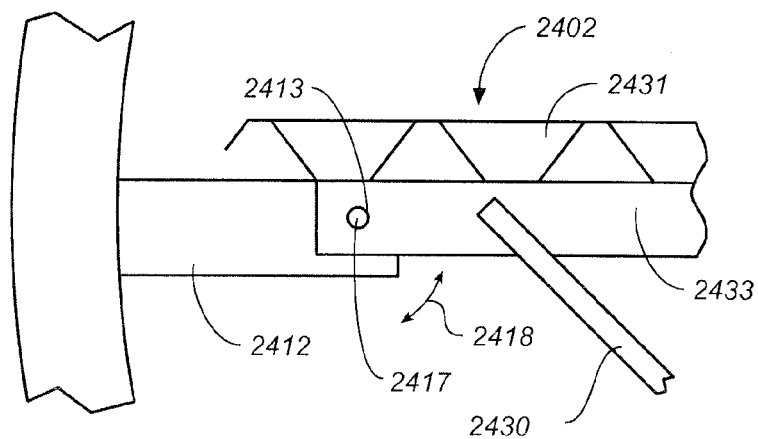
Figure 24D:
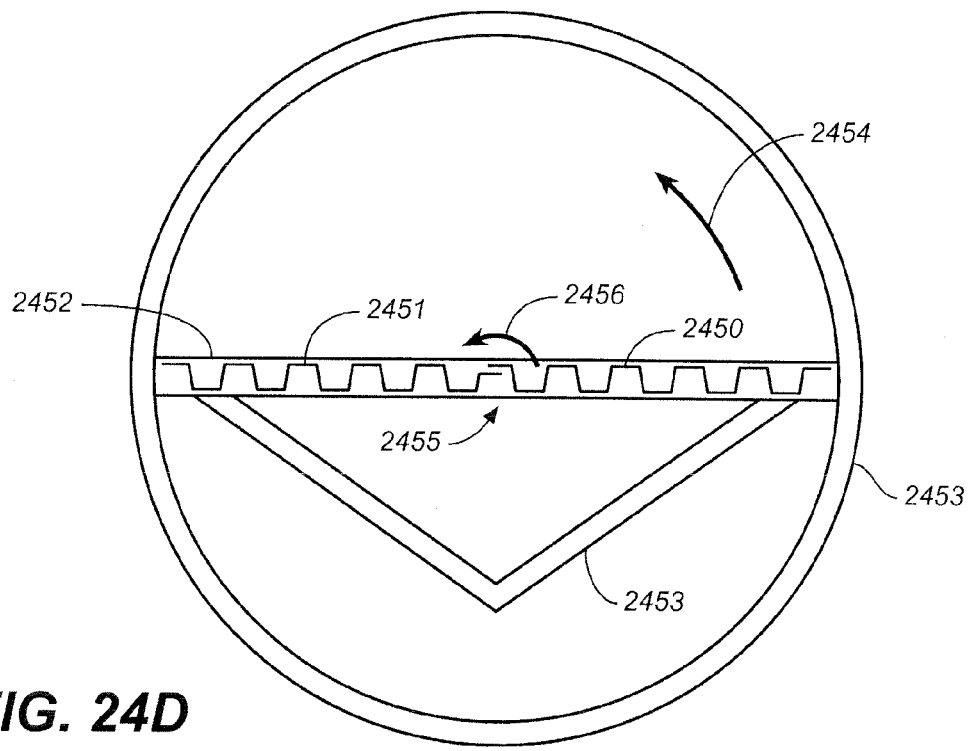

In many instances, it may be desired to reduce the amount of water and other contaminants retained or pooled by carrier frames and the like. For example, if multiple corrugated sections are used to form a carrier layer (e.g., similar to layer 2431 in FIGS. 24A-24C), the corrugated sections may be lapped to avoid pooling of water in corrugations. Referring now to FIG. 24D, two corrugated sections 2450 and 2451 are joined at junction 2455 to form corrugated layer 2452 in carrier 2453. If carrier 2453 is always rotated in a clockwise direction (indicated by arrow 2454) to or from a storage position, then corrugated sections 2450 and 2451 may be lapped in junction 2455 so that water flows around the junction (as indicated by arrow 2456), as opposed to flowing between corrugated sections 2451 and 2450.

The attachment tabs may be configured to permit alignment of the second platform relative to the first platform and to allow securing of the second platform to the first reflector support in an aligned position. For example, as illustrated in FIG. 24C, the attachment tab 2412 may comprise a joint 2413 that allows alignment of platform 2402 secured to the attachment tab 2412. The joint 2413 may allow the platform 2402 to be rotated and/or translated during alignment of the second platform to the first reflector support 2407. The attachment tab may include any suitable attachment scheme and type of joint. For example an attachment tab may comprise a threaded hole configured to accept a threaded bolt coupled to a platform. Alternatively, an attachment tab may comprise a clear hole or slot that a bolt coupled to a platform may be inserted through and secured with a nut. The example illustrated in FIGS. 24A-C includes a threaded hole designed to accept a threaded section of bolt 2417 on first end 2406 of second platform 2402. As indicated by arrow 2418, platform 2402 may be rotated about an axis defined by bolt 2417 for alignment. Thus, the first end 2406 of the second platform 2402 may be reversibly attached to the first reflector support and aligned with first platform 2401. In some variations, the second platform may be aligned relative to the first platform to within less than about 10 mm, e.g., about 8 mm, about 6 mm, about 5 mm, about 4 mm, about 3 mm, about 2 mm, or about 1 mm. In some carrier frames, the second platform may be permanently attached to the first reflector support after alignment, e.g., by welding.

Some carrier frames may comprise second and third reflector supports so that the first platform is coupled to and supported between the first and second reflector supports, and the second platform is coupled to and supported between the first and third reflector supports. Referring again to FIGS. 24A-24C, first platform 2401 is coupled to and supported between first reflector support 2407 and second reflector support 2420, and second platform 2402 is coupled to and supported between first reflector support 2407 and third reflector support 2421. The second and third reflector supports may be coupled to platforms in any suitable manner. For example, they may be permanently coupled, e.g., by welding, or temporarily coupled, e.g., with a bolt or the like. The process described here for aligning two platforms interconnected to a common reflector support may be repeated multiple time as a carrier frame comprising more than two platforms is assembled.

Although the reflector supports are shown as having hoop-like frames in FIGS. 24A-24D for ease of illustration, variations of carrier frames and methods of making such variations of carrier frames are contemplated that utilize other types of reflector supports, e.g., one or more reflector supports similar to those illustrated FIGS. 2C and 2D. For example, the methods described above may be used to make a carrier frame that comprises more than one type of reflector support, e.g., a first reflector support that comprises a hoop-like frame and a second reflector support similar to that illustrated in FIG. 2C or 2D.

Drives and drive systems for solar energy collector systems are provided. In general, the drives include a motor that is configured to move and position one or more reflector supports (e.g., one or more hoops supporting one or more reflector elements). The drives may position the reflector elements to at least partially track diurnal motion of the sun and to reflect incident solar radiation to an elevated receiver. In addition, the drives may be designed to move the reflector elements to a storage position during limited- or no-sunlight hours, and/or during high wind or other inclement weather situations. In general, the drive systems include a motor and one or more reflector supports (e.g., one or more hoops supporting one or more reflector elements). In the drive systems, the motor and the reflector supports are coupled together to allow the desired movement and positioning of the reflector elements.

Some drive systems for solar energy collector systems comprise a bidirectional motor that is configured to drive a gear and a reflector support that is, in turn, configured to support and rotate one or more reflector elements coupled thereto. The reflector support may be configured to rotate the reflector elements to at least partially track diurnal motion of the sun, and to move the reflector elements to a storage position during darkness and/or inclement weather. A chain may be engaged with the gear. The chain may be configured to wrap around an outer peripheral surface of the reflector support and to continuously engage with an engagement member that is affixed to the outer peripheral surface of the reflector support so that the motor can rotate the reflector support via the chain.

Figure 25A:
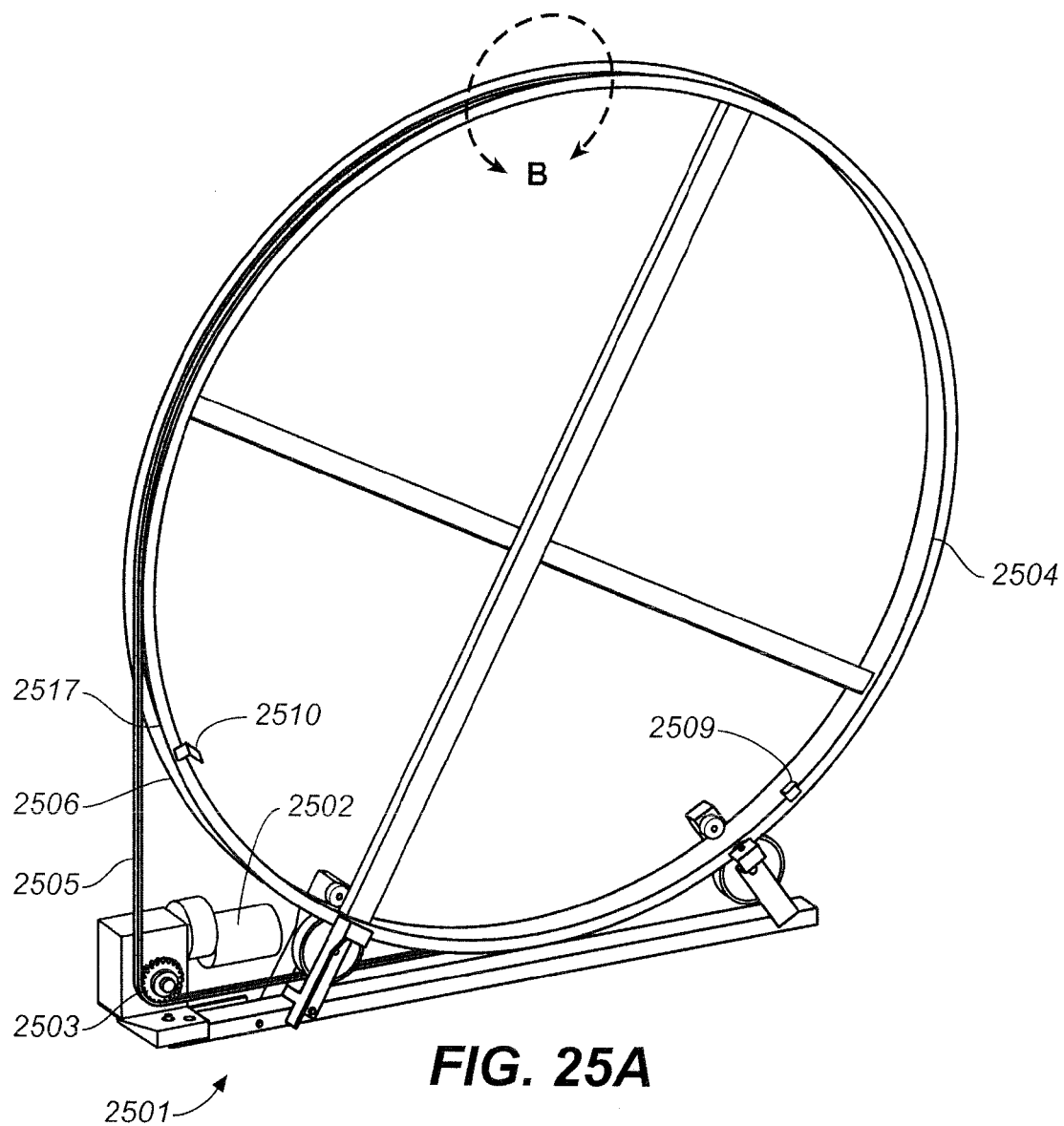
FIGS. 25A-25B illustrate an example of a drive system for a solar energy collector system, where the drive system comprises a chain that is continuously engaged with toothed gear-like engagement member on reflector support that supports and positions one or more reflector elements.
Figure 25B:
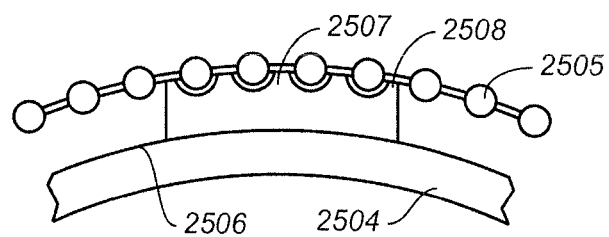

FIGS. 25A-25B illustrates one variation of such a drive system. There, drive system 2501 comprises a bidirectional motor 2502 configured to drive a gear 2503. The drive system also comprises a reflector support 2504, which may be coupled to and configured to rotate one or more reflector elements (not shown). A chain 2505 is wrapped around an outer peripheral surface 2506 of reflector support 2504. Reflector support 2504 may have a U-shaped periphery, so that outer peripheral surface 2506 is inset from peripheral sidewalls 2517. In this example, engagement member 2507 comprises a toothed, gear-like structure 2508. The chain 2505 forms a continuous loop, and continuously engages with gear 2503 and gear-like structure 2508 as the reflector support is rotated between limit stops 2509 and 2510. The limit stops may be positioned anywhere around the periphery of the reflector support, as long as the engagement member 2507 remains engaged with chain 2505. For example, limit stops may be placed about 270° apart, so that bidirectional motor 2502 may be configured to rotate reflector support 2504 approximately +/−135°.

Figure 26A:
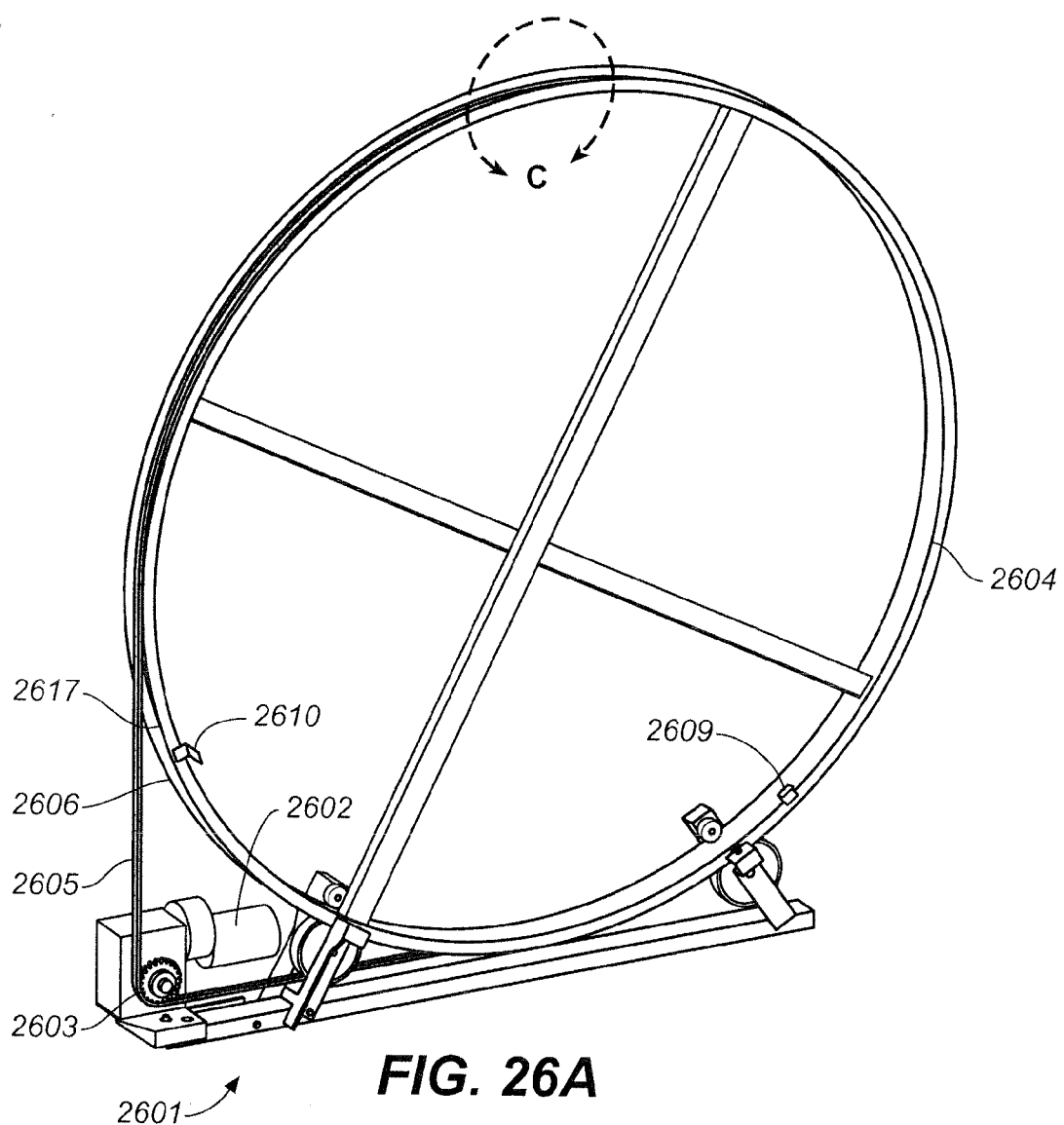
FIGS. 26A-26B illustrate another example of a drive system for a solar energy collector system.
Figure 26B:
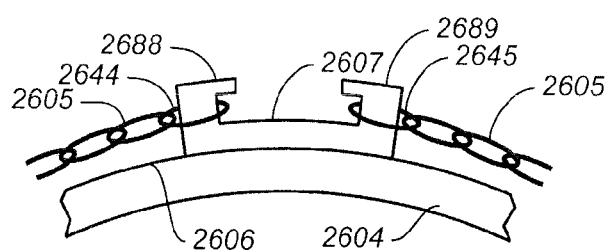

FIGS. 26A-26B illustrate another variation of a drive system that may be used with solar energy collector systems described herein, known in the art, or later developed. There, drive system 2601 comprises a bidirectional motor 2602 configured to drive a gear 2603. The drive system also includes a reflector support 2604 that is configured to rotate and position one or more reflector elements (not shown) coupled thereto. Affixed to outer peripheral surface 2606 of reflector support 2604 is engagement member 2607. Reflector support 2605 may have a U-shaped periphery, so that outer peripheral surface 2606 is inset from peripheral sidewalls 2617. In this embodiment, the chain 2605 does not form a continuous loop. Rather, chain 2605 comprises two ends, 2644 and 2645. Chain end 2644 is coupled to a first attachment point 2688 of engagement member 2607, and chain end 2645 is coupled to a second attachment point 2689 of engagement member 2607. The first and second attachment points are positioned along the periphery of the reflector support on opposite sides of the engagement member. The first and second attachment points may have any suitable configuration, e.g., they may be hooks, protrusions, clamps, or the like. When the reflector support is rotated between limit stops 2609 and 2610, the chain is continuously engaged with gear 2603, and rotation of the gear by the bidirectional motor 2602 in a first direction applies tension to the chain 2605 to rotate the reflector support in one of a clockwise and counterclockwise direction, and rotation of the gear by the motor 2602 in a second direction applies tension to the chain 2605 to rotate the reflector support in the other of a clockwise and counterclockwise direction. The limit stops 2609 and 2610 may be positioned anywhere around the periphery of the reflector support, as long as the engagement member 2607 remains engaged with chain ends 2604 and 2605. For example, limit stops may be placed about 2700 apart, so that bidirectional motor 2602 may be configured to rotate reflector support 2604 approximately +/−135°.

Figure 27:
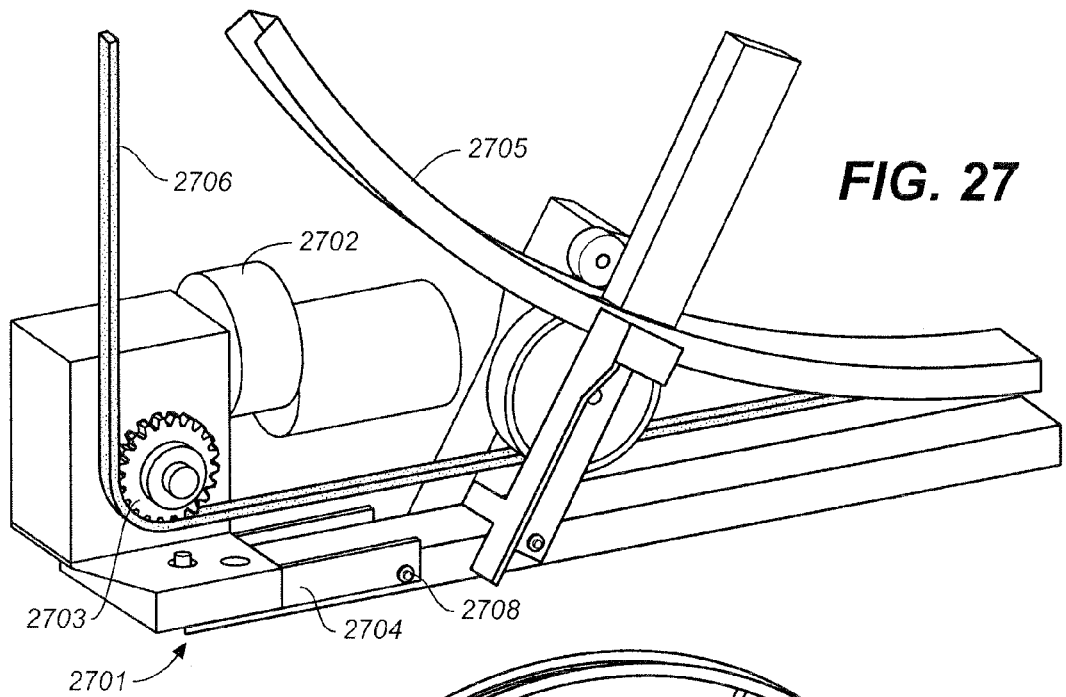
FIG. 27 shows a variation of a drive system for a solar energy collector system, where the drive system includes a pivot arm that can adjust tension in a chain that drives motion in a reflector support supporting one or more reflector elements.

In drive systems that include a motor and chain to drive a reflector support, it may be necessary to adjust the tension in the chain to reduce slack, and hence to reduce backlash and the like to improve the accuracy with which the reflector support may be positioned. Referring now to FIG. 27, drive system 2701 comprises a motor 2702 configured to drive a gear 2703. The motor 2702 is mounted to a movable pivot arm 2704. A chain 2706 is engaged with gear 2703, so that when gear 2703 is driven by motor 2702, tension is applied to the chain 2706 to rotate a reflector support 2705, for example, as described in connection with FIGS. 25-25B and 26A-26B. The reflector support may be configured to rotate one or more reflector elements to at least partially track diurnal motion of the sun, and to rotate the reflector elements to a storage position when desired. In these variations of drive systems, the chain 2706 may be threaded around a movable pivot arm 2704. The pivot arm may comprise an adjustment (e.g., a height adjustment) that allows tension in the chain to be varied. For the example shown in FIG. 27, pivot arm 2704 may be rotated about an axis determined by bolt 2708 to adjust the tension in chain 2706. In this example, the motor 2702 and gear 2703 are mounted to pivot arm 2704. However, in other variations, the motor and gear need not be connected to the pivot arm, as long as the chain is threaded around the pivot arm to allow tension to be adjusted. The pivot arm may be continuously adjustable, as shown in FIG. 27. In other variations, the pivot arm may have preset positions that may be selected, e.g., with a ratchet, or with a spring-loaded or movable pin that may be inserted into one of a series of holes to control the height of a pivot arm around which a chain is threaded to adjust tension in the chain.

Figure 28A:
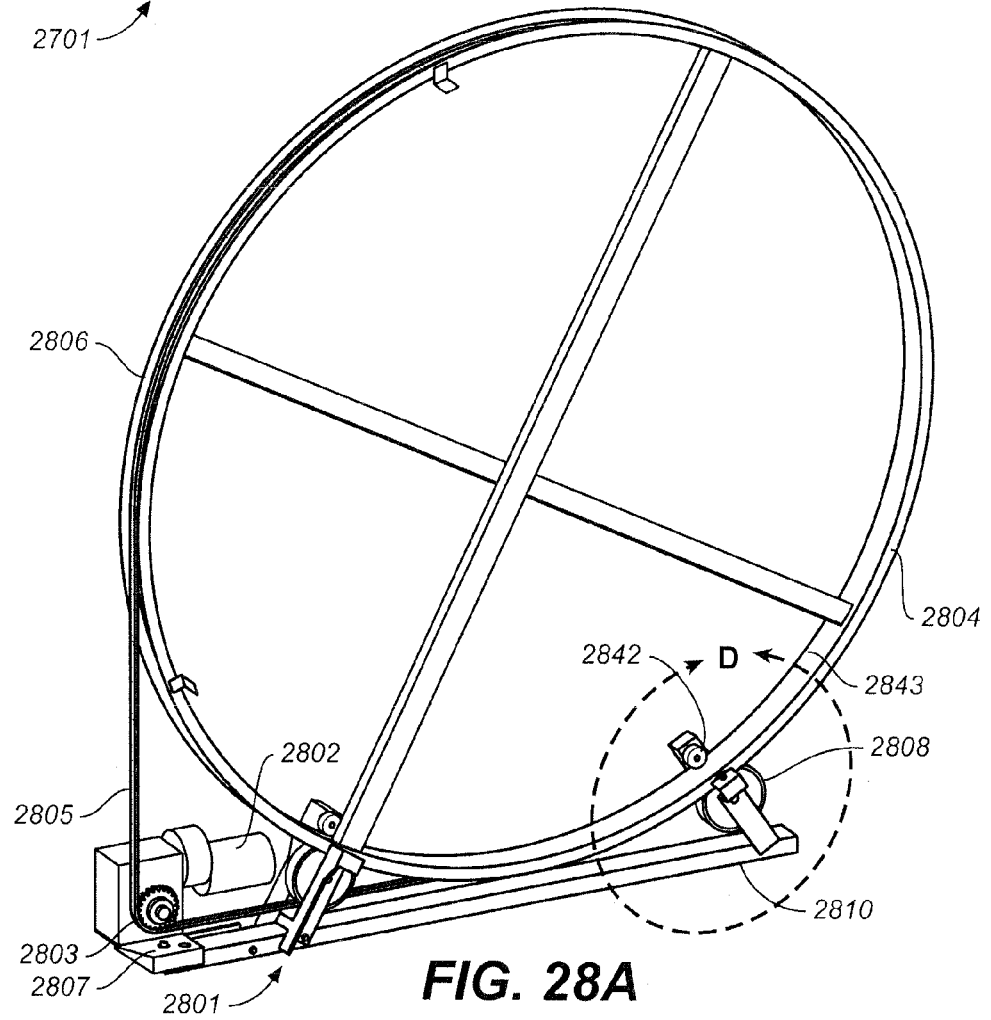
FIGS. 28A-28B illustrate an embodiment of a drive system for a solar energy collector system, where the drive system includes a lateral stabilization member to reduce lateral movement by a reflector support that rotates one or more reflector elements.
Figure 28B:
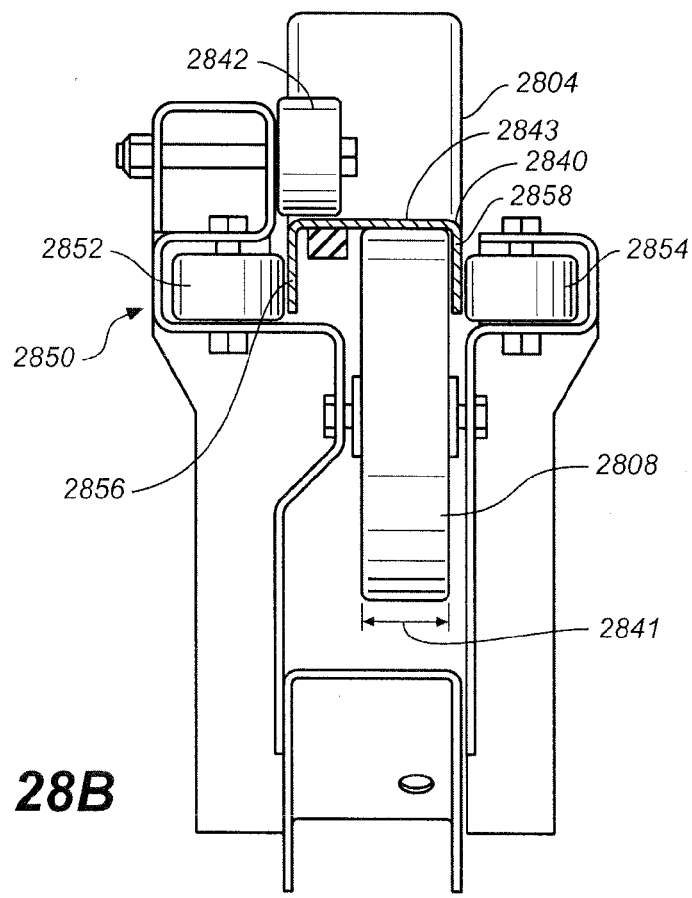

Other drive systems for use in solar energy collector systems are described. These drive systems include a motor configured to drive a reflector support that supports and rotates one or more reflective elements. These systems are designed to have reduced lateral movement of the reflector support in the drive system, which may improve accuracy of positioning of the reflective elements, and/or reduce extraneous motions to conserve energy. Referring now to FIGS. 28A-28B, drive system 2801 comprises motor 2802 that is configured to drive gear a 2803. Motor 2802 may be mounted to a pivot arm 2807, similar to that described in connection with FIG. 27. Drive system 2801 comprises a reflector support 2804 that comprises a hoop-like frame that supports and rotates one or more reflector elements (not shown), and a chain 2805 that is engaged with gear 2803 and wrapped around and coupled to an outer peripheral surface 2806 of reflector support 2804 so that when gear 2803 is driven by motor 2802, tension is applied to the chain 2805 to position reflector support 2804. One or more wheels 2808 may be mounted to a base 2810. The one or more wheels 2808 may be configured to contact the outer peripheral surface 2806 of the reflector support 2804 and to rotate freely as the reflector support rotates. The outer periphery of reflector support 2804 may have a U-shaped profile 2840, so that the width 2841 of the wheel 2808 fits freely within the U-shaped profile 2840. Optionally, one or more vertical stabilization wheels 2842 may be used to contact an inner surface 2843 of reflector support 2804 and to rotate freely as reflector support 2804 rotates, to oppose wheels 2808 and to prevent the reflector support from moving in an upward vertical direction.

Still referring to FIGS. 28A-28B, these drive systems may optionally include one or more lateral stabilization members that are configured to reduce an amount of lateral movement between the wheel and the outer peripheral surface of the reflector support. The lateral stabilization member may be any suitable member that provides lateral stability without unduly increasing the friction between the reflector support and the wheel. For example, as illustrated in FIGS. 28A-28B, the lateral stabilization member 2850 may comprise a first lateral stabilization wheel 2852 and a second opposing lateral stabilization wheel 2854. As reflector support 2804 rotates, first lateral stabilization wheel 2852 rolls against a side rail 2856 of U-shaped periphery 2840 of reflector support 2804, and second lateral stabilization wheel 2854 rolls against a side rail 2858 of U-shaped periphery 2840 that is opposite side rail 2856.

Drives for use in a solar energy collector system are described here, where the drives may comprise a motor and a positional sensor. The motor may be configured to rotate one or more reflector supports, where each reflector support is configured to support and rotate one or more reflector elements coupled thereto. The reflector elements may be aligned and configured to direct incident solar radiation to an elevated receiver. The drives also may each comprise a positional sensor that is configured to sense a rotational position of the reflector support to within at least about 0.2 degrees, at least about 0.1 degrees, at least about 0.05 degrees, at least about 0.02 degrees, or at least about 0.01 degrees. In some variations, the drives may further comprise a controller. In those instances, the controller may be configured to provide input to the positional sensor and/or to receive output from the positional sensor. A controller, if present, may be interfaced with the positional sensor and with a user in any suitable manner. The sensor and the controller may be each configured to receive analog input and/or output, and/or digital input and/or output. For example, the controller may be hard-wired to the positional sensor through a serial or parallel port. Alternatively, or in addition, the controller may have a wireless interface with the sensor. The controller may be hard-wired or wirelessly interfaced with a user interface (e.g., a user-controlled computer connected to the controller through a serial or parallel port), or the controller may be wirelessly interfaced with a user interface. In some variations, the controller may be remotely programmable so that instructions may be remotely sent and/or received from the controller. Some variations of these drives may comprise a closed-loop control configuration in which the controller is configured to receive input from the positional sensor to determine the rotational position of the reflector support, and to provide output instructions to the motor or to a controller interfaced with the motor to rotate the reflector support and the reflector elements coupled to the reflector support to a desired rotational position.

The positional sensor may be configured to sense a rotational position of the reflector support when the reflector support has stopped moving, or the positional sensor may be configured to sense a rotational position of the reflector support while the reflector support is moving. In the latter case, the time constant of the reading by the sensor may be selected according to the speed at which the reflector support is rotating. For example, the time constant of the positional sensor may be selected to be about 50 ms to about 5 seconds, e.g., about 100 ms to about 500 ms, or about 500 ms to about 1 second. Any suitable positional sensor may be used in the drives and systems described here. Analog and/or digital sensors may be used. In some variations, a sensor comprising at least two elements may be mounted to the reflector support. By analyzing the difference between measurements made by the at least two elements, the sensor may determine an absolute or relative tilt of the reflector support. The at least two elements may be any suitable type of elements, e.g., capacitive elements or accelerometers. Non-limiting examples of suitable absolute and/or relative tilt sensors and/or inclinometers that may be used as sensors are available from U.S. Digital (Vancouver, Wash.), Rieker, Inc. (Aston, Pa.), Kelag Künzli Elektronik AG (Switzerland), VTI Technologies (Finland), National Instruments (Austin, Tex.), and Analog Devices (Norwood, Mass.). If a sensor capable of detecting absolute tilt is used as a positional sensor, it may be positioned to within about 10 cm of a center of the reflector support to minimize gravitational effects on the sensor and associated errors. Other types of positional sensors may be used, e.g., inductive sensors or optical sensors.

Positional sensors, if present, may be located on any suitable portion of a reflector support or carrier. For example, a positional sensor may be located on reflector support frame or on a reflector support base. In some variations, a positional sensor may be located on a hoop-like portion of a reflector support frame, on a cross member or spoke of a reflector support frame, or near a center of rotation of a reflector support or reflector element. Referring back to the example illustrated in FIG. 28A, one or more positional sensors may be located on the hoop-like frame 2821 of reflector support 2804, on a cross member 2820 and/or near a center of rotation 2822 of reflector support 2804. Alternatively or in addition, a positional sensor may be located on base 2810 of reflector support 2804.

Some drives may include one or more limit sensors in addition to the positional sensor. In these drives, the limit sensor may be capable of detecting when the reflector support has rotated to a corresponding limit position. The limit sensors may be able to detect a position of a reflector support to within about 1 degree, about 0.5 degree, about 0.4 degree, about 0.3 degree, about 0.2 degree, about 0.1 degree, about 0.05 degree, or about 0.02 degree. Limit sensors may, for example, be positioned at about 270° relative to each other, e.g., as illustrated in FIGS. 25A-B and 26A-B. Any type of sensor may be used as a limit sensor, e.g., an inductive sensor, an optical sensor, or an inclinometer such as an inclinometer using capacitive sensing elements or accelerometers. In some cases, a limit sensor may be used to provide a reference position for a positional sensor, e.g., a more accurate positional sensor. In still other variations, the motor and/or the reflector support may include an encoder or other positional information. For example, a servo drive encoder may be provided on the motor. Such servo drive encoders may allow for correction of backlash in motor movement. Alternatively, or in addition, the reflector support may include a positional encoder such as a notch or a series of notches. Any combination of the positional sensors, limit sensors, and encoders described here, known in the art, or later developed may be used.

In some variations of drives, the motor may be configured to be coupled to a variable frequency drive to control the rotational position resolution. In these drives, an AC motor (e.g., a three phase, 480V AC induction motor) is configured to drive a reflector support that is configured to support and rotate one or more reflector elements coupled thereto. The motor may be interfaced with a variable frequency drive to step down the frequency of the AC input, thereby allowing the motor to move less with one AC cycle. For example, nominal 50 Hz or 60 Hz AC power may be stepped down to about 1 Hz to about 6 Hz, or to about 1 Hz to about 5 Hz, to improve the ability of the motor to make smaller incremental rotational movements of the reflector support. Any suitable variable frequency drive may be used. The variable frequency drives may comprise an analog or digital controller. For example, some variable frequency drives may be programmable (e.g., remotely programmable) through a serial or parallel port. Inputs and/or outputs from the variable frequency drives may be hard-wired and/or wireless.

In some variations of these drives, the motor may be configured to be switched between direct AC drive operation and operation through the variable frequency drive. Bypassing the variable frequency drive (VFD) may allow rapid rotation of the reflector elements, e.g., to a storage configuration for limited- or no-sunlight hours, and/or in preparation for inclement weather such as high winds. In some cases, the AC motors operating through a VFD may be driven at a harmonic of the nominal AC power frequency (e.g., 50 Hz or 60 Hz). For example, motors may be driven at 100 Hz, 120 Hz, 150 Hz, or 180 Hz for even faster and/or more efficient rotation of the reflector elements.

Some variations of drives may be capable of driving reflector supports at more than one rotational speed setting. For example, some drives may have a first slow rotational speed setting for relatively slow movement of the reflector support with a relatively high degree of rotational position accuracy and a second rotational speed setting corresponding to motor speeds that allow relatively faster rotation of the reflector support. Some variations may comprise a third rotational speed setting corresponding to very rapid rotation of a reflector support, e.g., the most rapid rotation of the reflector support desired. Different rotational speed settings may be achieved by supplying AC power having different frequency ranges to the motors in the drives. For example, the first rotational speed setting may be achieved by supplying AC power to a motor through a variable frequency drive operating at about 1 Hz to about 6 Hz, or about 1 Hz to about 5 Hz, e.g., at about 2 Hz or about 3 Hz. The second rotational speed setting may be achieved by operating a motor in direct drive at the nominal AC power frequency in the region where the drive is to be operated, e.g., about 50 Hz or about 60 Hz, e.g. The variable frequency drive connected to the motor may be bypassed to operate the motor in direct drive for the second rotational speed setting. The third rotational speed setting, if present, may be achieved by supplying AC power at a harmonic of the nominal AC power through the variable frequency drive to a motor, e.g., at about 100 Hz, or about 120 Hz.

Figure 29:
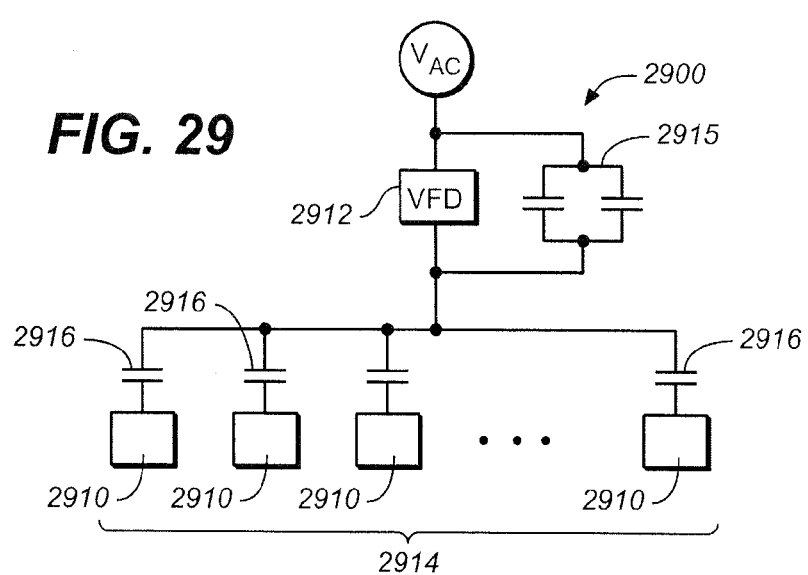
FIG. 29 illustrates an example of a drive system for a solar energy collector system that comprises a variable frequency drive.

Drive systems are provided in which one or more VFDs may be configured to be connected to a set of motors. In these drive systems, each motor in the set may be configured to drive one or more reflector supports, and each reflector support may be configured to support and rotate one or more reflector elements coupled thereto. For example, as illustrated in FIG. 29, a solar energy collector system may comprise a drive system 2900 that comprises a set 2914 of motors 2910 that are controlled by a single variable frequency drive 2912. Each motor 2910 may, for example, be a 480V three-phase AC induction motor connected to a row of reflector elements supported by a series of reflector supports. Although the example in FIG. 29 shows a set of 4 motors connected to a single VFD, any suitable number of motors may be connected to a VFD, e.g., 2 motors or more, or 3 motors or more, or 4 motors or more, or 5 motors or more, e.g., 8 motors, 10 motors, or 12 motors.

As indicated above, some variations drive systems may comprise one or more switches configured to bypass the variable frequency drive so that the at least one motor of the set of motors may operate in direct drive. Referring again to FIG. 29, drive system 2900 comprises a first bypass switch 2915 that is configured to bypass VFD 2912. Bypass switch 2915 may comprise any suitable type of switch, e.g., a reversing starter. In other variations, one or more additional switches may be connected to individual motors or to a subset of the set of motors. In some cases, a switch may be provided for every motor, so that each motor may be independently decoupled from the VFD. For the example shown in FIG. 29, switches 2916 are provided between the VFD 2912 and the individual motors 2910, or between the bypass 2915 and the individual motors 2910. The switches 2916 may be configured to be switchable as a bank of switches, or individually switchable. In some variations of drive systems, a first subset of the switches 2916 may be switchable as a bank, and a second subset of the switches 2916 may be independently switchable. Of course, some drive systems may comprise multiple VFDs. In those instances, one or more switches may be provided to bypass more than one VFD.

Drive systems may be configured such that the reflector rows in a solar array may be rotated in a serial manner (i.e., one reflector row at a time), or so that more than one reflector row may be rotated at the same time. For example, reflector rows may be rotated in a serial sequence through a VFD for positioning, or more than one reflector row may be rotated at the same time through a VFD for positioning. Similarly, when a VFD connected to motors driving a reflector rows is bypassed so that the motors are operating in direct drive, the reflector rows may be rotated in a serial manner, or more than one reflector row may be rotated at the same time. As indicated above, bypassing a VFD may enable rapid, simultaneous rotation of reflector elements to a storage position, with their reflective surfaces facing downward. In some arrays, two or more outer rows of a reflector field (or other reflector rows subject to high wind shear) may be configured to have their VFDs bypassed and rotated in direct drive operation at the same time to a storage position.

Solar energy collector systems including drives or drive systems such as those discussed above comprising one or more positional sensors, and those described in connection with. FIGS. 25-29 are also provided. Referring now to FIG. 30, solar energy collector system 3001 comprises a set of master reflector supports 3002. Each master reflector support 3002 may be driven by a drive 3003 comprising a motor that is configured to support and rotate a segment of a reflector row 3004. For example, a single motor may be configured to drive a row segment comprising 2, 4, 6, or 8 reflector elements 3005. Slave reflector supports 3006 may be provided on each side of reflector elements 3005 and rotate following master reflector support 3002. A closed-loop controlled rotational positional sensor may be provided on one or more of the master or slave reflector supports so that the rotational position of the reflector row may be determined, and so that the reflector row may be rotated to a desired position to at least partially track diurnal motion of the sun and direct incident solar radiation to elevated receiver 3015. Drives 3003 may be operated in sequence, or in parallel, so that row segments driven thereby may be rotated in a sequential or in a parallel operation. Multiple reflector row segments may be aligned in a collinear fashion so that each reflector row 3004 may be about 200 meters, about 300 meters, or about 400 meters long.

This disclosure is illustrative and not limiting. Further modifications will be apparent to one skilled in the art in light of this disclosure and such modifications are intended to fall within the scope of the appended claims. Each publication and patent application cited in the specification is incorporated herein by reference in its entirety as if each individual publication or patent application were specifically and individually put forth herein.

What is claimed is:

1. A solar energy collector system, the system comprising:
a linear Fresnel reflector array;
a reflector support configured to rotate about an axis aligned with a center of the reflector support, the reflector support configured to support and rotate one or more reflector elements coupled thereto in the array, the reflector support configured to rotate the one or more reflector elements to at least partially track diurnal motion of the sun and the one or more reflector elements configured to direct incident solar radiation to an elevated receiver having a horizontal aperture;
a motor configured to rotate the reflector support about the axis; and
a positional sensor configured to sense a tilt angle of the reflector support, wherein at least a portion of the positional sensor is attached to the reflector support such that the at least a portion of the positional sensor rotates about the axis as the reflector support rotates.

2. The solar energy collector system of claim 1, comprising a controller configured to receive input from the positional sensor and/or to provide output to the positional sensor.

3. The solar energy collector system of claim 1, further comprising a closed-loop control configuration in which the controller is configured to receive input from the positional sensor to determine the tilt angle of the reflector support, and to provide output instructions to the motor to rotate the reflector support to a desired tilt angle.

4. The solar energy collector system of claim 1, wherein the reflector support comprises a hoop-like portion configured to rotate the one or more reflector elements about the axis; and
wherein the motor is configured to rotate the hoop-like portion about the axis.

5. The solar energy collector system of claim 4, wherein the at least a portion of the positional sensor is attached to a spoke of the hoop-like portion.

6. The solar energy collector system of claim 4, wherein the at least a portion of the positional sensor is attached to an outer edge of the hoop-like portion.

7. A solar energy collector system comprising:
an elevated receiver comprising a solar radiation absorber;
first and second reflector fields positioned on opposite sides relative to a center of the receiver;
wherein:
each reflector field comprises reflectors arranged into one or more parallel reflector rows extending generally in a direction parallel to a length of the receiver;
the reflectors each comprise a reflective surface configured to direct incident solar radiation to the solar radiation absorber in the receiver;
the reflectors are mounted on a plurality of reflector supports configured to rotate the reflectors;
a reflector support of the plurality of reflector supports is configured to rotate about an axis aligned with a center of the reflector support;
at least a portion of a reflector row of the one or more parallel reflector rows is configured to be rotated by a motor;
the motor is configured to be connected to a variable frequency drive;
a rotational positional sensor is configured to sense a tilt angle of the reflector support; and
at least a portion of the rotational positional sensor is attached to the reflector support such that the at least a portion of the rotational positional sensor rotates about the axis as the reflector support rotates.

8. The solar energy collector system of claim 7, wherein a single variable frequency drive is connected to ten or more motors.

9. The solar energy collector system of claim 7, further comprising a switch that is configured to bypass the variable frequency drive connected to a motor.

10. The solar energy collector system of claim 7, wherein the variable frequency drive is configured to supply AC power to each motor at about 1 Hz to about 6 Hz.

11. The solar energy collector system of claim 7, wherein the reflector support comprises a hoop-like portion configured to rotate one or more reflectors about the axis; and wherein the motor is configured to rotate the hoop-like portion about the axis.

12. The solar energy collector system of claim 11, wherein the at least a portion of the rotational positional sensor is attached to a spoke of the hoop-like portion.

13. The solar energy collector system of claim 11, wherein the at least a portion of the rotational positional sensor is attached to an outer edge of the hoop-like portion.

* * * * *